(12) United States Patent
Carlson et al.

(10) Patent No.: US 10,290,750 B2
(45) Date of Patent: May 14, 2019

(54) SYSTEMS AND METHODS FOR FORMING FOIL CONTACT REAR EMITTER SOLAR CELL

(71) Applicants: David E. Carlson, Williamsburg, VA (US); David Howard Levy, Rochester, NY (US)

(72) Inventors: David E. Carlson, Williamsburg, VA (US); David Howard Levy, Rochester, NY (US)

(73) Assignee: Natcore Technology, Inc., Rochester, NY (US)

( * ) Notice: Subject to any disclaimer, the term of this patent is extended or adjusted under 35 U.S.C. 154(b) by 113 days.

(21) Appl. No.: 15/248,383

(22) Filed: Aug. 26, 2016

(65) Prior Publication Data
US 2017/0062633 A1    Mar. 2, 2017

Related U.S. Application Data

(60) Provisional application No. 62/210,230, filed on Aug. 26, 2015.

(51) Int. Cl.
*H01L 31/0224*  (2006.01)
*H01L 31/05*  (2014.01)
*H01L 31/0216*  (2014.01)

(52) U.S. Cl.
CPC ........... *H01L 31/022441* (2013.01); *H01L 31/02167* (2013.01); *H01L 31/0516* (2013.01); *Y02E 10/50* (2013.01)

(58) Field of Classification Search
CPC ....... H01L 31/022441; H01L 31/02167; H01L 31/0516

(Continued)

(56) References Cited

U.S. PATENT DOCUMENTS 9,570,638 B2  2/2017 Carlson
9,837,561 B2  12/2017 Levy et al.
(Continued)

FOREIGN PATENT DOCUMENTS

WO       2012135395      10/2012
WO    WO 2012/135395   * 10/2012

OTHER PUBLICATIONS

Nakamura et al., Development of Heterojunction Back Contact Si Solar Cells, Journal of Photvoltaics, vol. 4, No. 6, pp. 1491-1495 (Year: 2014).*

(Continued)

*Primary Examiner* — Jayne L Mershon
(74) *Attorney, Agent, or Firm* — Winstead PC

(57) ABSTRACT

A solar cell structure may provide a front surface that may include a front passivation layer and front anti-reflective layer. The solar cell structure may provide both contacts on a rear surface. In some cases, the rear surface may optionally provide passivation, doped, and/or transparent conductive oxide layers. The rear surface also provides a multilayer foil assembly (MFA). The MFA provides a first metal foil in electrical communication with doped regions of the rear surface of the substrate, such as base or emitter regions. The MFA may also provide a second metal foil that is spaced apart from the first metal foil by a dielectric layer. The first metal foil and/or the dielectric layer may include openings through the entirety of these layers, and these openings may be utilized to form laser fired contacts electrically coupled to the second metal foil, which is electrically isolated from the first metal foil. In some embodiments, it may be desirable for the second foil to provide openings as well, which can be utilized to form laser fired contacts for the first metal foil.

19 Claims, 37 Drawing Sheets

(58) Field of Classification Search
USPC .......................................................... 136/256
See application file for complete search history.

(56) References Cited

U.S. PATENT DOCUMENTS

| 2009/0027371 | A1  | 1/2009 | Lin et al. |              |
|--------------|-----|--------|------------|--------------|
| 2013/0171767 | A1* | 7/2013 | Moslehi    | H01L 21/26586 |
|              |     |        |            | 438/89       |
| 2014/0147944 | A1* | 5/2014 | Kommera    | H01L 22/14   |
|              |     |        |            | 438/17       |
| 2015/0129031 | A1* | 5/2015 | Moslehi    | H01L 31/022441 |
|              |     |        |            | 136/256      |

OTHER PUBLICATIONS

Nakamura et al.; Development of Heterojunction Back Contact Si Solar cells; IEEE Journal of Photovoltaics, vol. 4, No. 6. Nov. 2014.

* cited by examiner

SYSTEMS AND METHODS FOR FORMING FOIL CONTACT REAR EMITTER SOLAR CELL

RELATED APPLICATIONS

This application claims the benefit of U.S. Provisional Patent Application No. 62/210,230 filed on Aug. 26, 2015, which is incorporated herein by reference.

FIELD OF THE INVENTION

This invention relates to all back contact solar cells. More particularly, to systems and methods for fabricating back contact solar cells with multilayer metallization.

BACKGROUND OF INVENTION

A desirable solar cell geometry referred to as an interdigitated back contact (IBC) cell comprises a semiconductor wafer and alternating lines (interdigitated stripes) respectively coinciding with regions with p-type and n-type doping. This cell geometry has the advantage of eliminating shading losses altogether by putting both contacts on the rear side of the wafer that is not illuminated. Further, contacts are easier to interconnect with both contacts on the rear surface.

Another desirable solar cell architecture involves the use of silicon heterojunction or tunnel junction contacts. An example of such architectures is the HIT (heterojunction with intrinsic thin layer) cell structure. In a front emitter form of this structure, a silicon wafer is contacted on both sides by a thin intrinsic hydrogenated amorphous silicon (a-Si:H) layer, which serves as a surface passivating layer as well as a charge carrier transport layer. On the front of the cell, a semiconductor layer doped to the opposite doping polarity of the base substrate is applied, forming a heterojunction emitter. On the rear of the cell, a semiconductor layer doped to the same doping polarity as the base substrate is applied, forming a base contact. These layers can then be contacted with transparent or metallic conducting layers to extract current from the solar cell. In the tunnel junction cell, the intrinsic a-Si:H layer is replaced with a thin high bandgap material. In the case of the heterojunction cell, charge carrier transport occurs via both hopping conduction in traps and band conduction in the intrinsic a-Si:H layer, while in the case of the tunnel junction cell, charge carrier transport occurs via quantum mechanical tunneling. Despite this difference, the cell structures are somewhat similar and importantly can be manufactured in low temperature processes because they do not require dopant diffusion.

Heterojunction or tunnel junction solar cells cannot achieve outstanding efficiencies because they still require front side contacts. First, the presence of a contact on the front side reduces efficiency due to blocking or shading of the incoming light by the necessary metal grids which extract the generated current. Additionally, the presence of a front electrical contact requires that the front of the cell be simultaneously optimized for electrical, light absorption, and passivation properties, often producing a compromise that affects cell performance.

Presently, silicon solar cells with the highest efficiency are those based on combining an interdigitated all back contact structure with silicon heterojunction contacts. Silicon solar cells have been reported with efficiencies as high as 25.6%. While the processing of these high efficiency IBC solar cells were not discussed in any detail, the manufacturing costs are likely to be relatively high since the known processing techniques that could be applied in each case appear to be somewhat complicated with various masking and vacuum processing steps required.

Many solar cell structures, including the IBC structure, rely upon thin fingers of metal to collect current. In the case of the IBC cell, these thin fingers are interdigitated on the back of the cell, and often resulting from a single metal deposition that has been patterned to reveal the finger structure. Since the fingers exist on the same layer, the area of each finger can only be about ½ of the full area of the cell, but actually less than ½ because there is need for an insulation region (isolation gap) between the fingers. Combining this with the fact that current must travel along the narrow fingers, very high conductivity layers are required for the fingers. The solar industry resorts almost exclusively to silver, an expensive metal, to address the need for high conductivity, thus low resistance. Additionally, larger cell sizes exacerbate issues associated with resistance in the metal contacts of the solar cell.

There have been attempts to provide improved metallization for solar cells. A multilayer metallization applies each contact metal (base, emitter) as a contiguous sheet of metal over the entire cell with vias in the bottom contact metal sheet allowing the top sheet to make localized base contacts, such vias made with a photolithographic process. However the photolithographic process is expensive and not suited to solar cell manufacturing. Another method applies relatively thick metals in cost effective ways, but does not address approaches needed for make useful back contact cells.

Therefore, there is a need to provide multilevel metallization systems and methods for back contact solar cells that can be low cost. In U.S. patent application Ser. No. 15/068,900 filed on Mar. 14, 2016, laser processed back contacts were discussed. Further improvements to systems and methods for forming rear emitters for solar cells are discussed herein.

SUMMARY OF THE INVENTION

In one embodiment, roll-to-roll processing comprises multiple lamination or merging steps to form the layers of a multilayer foil assembly (MFA). These lamination steps may merge a dielectric insulating layer to one or more metal foil layers. In some cases, the lamination steps may include other layers, such as bonding layers or the like. The roll-to-roll processing may also include steps performed at various stages to form desired openings in one or more layers of the multilayer foil assembly, such as by laser drilling of via arrays, that are aligned with doped regions of a substrate. It may also be desirable to perform opening formation steps to provide fiducial holes that may be utilized to aid aligning layer(s). In some embodiments, the roll-to-roll processing may also involve high-speed dopant printing (e.g. inkjet, aerosol jet, laser transfer printing, etc.) to deposit one or more dopant materials at desired locations. Once the multilayer foil assembly foil assembly is completed, the multilayer foil assembly can be bonded to a silicon wafer for a laser firing/doping process to form laser fired contacts for base regions, emitter regions, or both. With the patterning provides for the one or more layers of the MFA, each the metal foil layers can be respectively coupled to base regions or emitter regions while being electrically isolated from each other.

In another embodiment, a solar cell structure may provide a front surface that may include a front passivation layer and front anti-reflective layer. The solar cell structure may provide both contacts on a rear surface. In some cases, the rear surface may optionally provide passivation, doped, and/or transparent conductive oxide layers. The rear surface also provides a multilayer foil assembly. The multilayer foil assembly provides a first metal foil in electrical communication with regions of the rear surface. The multilayer foil assembly may also provide a second metal foil that is spaced apart from the first metal foil by a dielectric layer. The first metal foil and/or the dielectric layer may include openings through the entirety of these layers, and these openings may be utilized to form electrical contacts such as laser-fired contacts. In some embodiments, it may be desirable for the second foil to provide openings as well, which can be utilized to form laser-fired contacts.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1A:
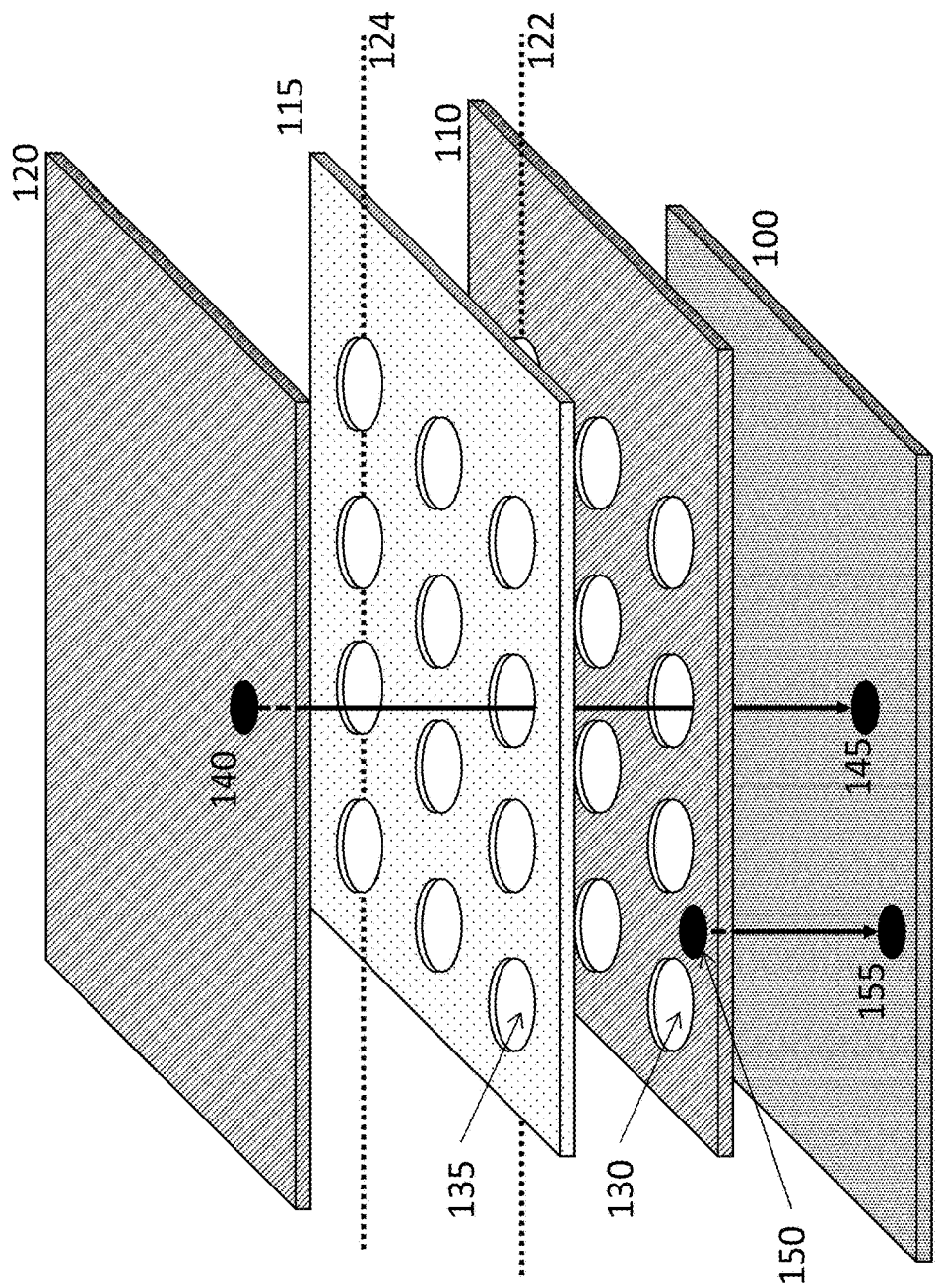
FIG. 1A shows an exploded view of an illustrative embodiment of a multilayer metallization scheme.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise. The following general description sections are applicable to the various embodiments discussed further herein.

General Description Multilayer Metallization:

A nonlimiting example of an exemplary solar cell with multilayer metallization is described herein and is generally applicable to the various embodiments discussed further herein. FIG. 1 shows an exploded view of a multilayer metallization scheme applicable to the various embodiments discussed further herein. A substrate (100) has on its surface a first metal layer or metal foil layer (110) representing a first electrical contact, a dielectric layer (115) and a second metal layer or metal foil layer (120) representing a second electrical contact. The dielectric layer is sandwiched between the first and second metal foils. Electrical current generated from the cell can be extracted from first and second electrical contacts. The dielectric layer (115) serves to insulate the first and second conductive layers, which are respectively coupled to different doping regions. While the exploded view shows the layers separated, it shall be understood that the layers may be in contact in the order shown.

A semiconductor substrate (100) useful in a solar cell can have regions of different doping or polarity, typically referred to n-type or p-type regions, and a general doping type of the base substrate, referred to as the base doping. For ease, regions of doping that are the same as the base doping type can be referred to as the base, and regions that are of the opposite doping type can be referred to as the emitter. These doping regions may be arranged in a pattern suitable for forming interdigitated back contacts (IBCs). A built-in potential exists between the emitter and base regions making it desirable to form IBCs coupled to the emitter and base regions, such as from the first and second metal layers 110, 120. The operation of the solar cell is achieved by illuminating the semiconductor and collecting the current driven by the built-in potential by connecting one of the metal contacts to one doping region, and the other metal contact to the other doping region. As a nonlimiting example, region (155) of a first doping type (e.g. n-type or p-type) is connected to a region (150) on the first metal contact. Region (145) of second doping type, which is the opposite of region (155), is connected to region (140) of the second metal contact. The doping regions (145) and (155) may be formed on the substrate prior, during, or after the application of the metal contact layers, or as a result of the metal contact application process. The substrate (100) may also contain other functional layers such as conductors, semiconductor, and passivation layers.

In order for the second metal layer (120) to properly operate and make contact with the substrate (100) without making contact to the first metal layer (110), the first metal layer may have openings (130) aligned with the location of the second metal contact (140,145). The dielectric layer may also have similarly aligned openings 135. The openings may be of any suitable shape, including circular, square, oval, rectangular, or the like. The latter can be useful in the case of laser processing using an elongated laser beam shape.

Many of the figures discussed herein are shown in cross sectional views for illustrative purposes. For example, the cross sectional views may be from positions (122) or (124). It should be understood that the cross section is for illustrative purposes and in all cases the individual layers may be contiguous layers as shown in FIG. 1.

The first metal layer (100) and second metal layer (120) may be metal foils that comprise thin continuous sheet sections of flexible metal, which, at some point in the process, may have been freestanding thin layers of metal. As utilized herein a multilayer foil assembly or metal foil assembly (MFA) may be utilized interchangeably. A multilayer foil assembly or metal foil assembly refer to one or more layers of metal foil(s), dielectric layer(s), or a combination thereof, which may be utilized in the various processing methods discussed herein for forming solar cells. As a nonlimiting example, one or more of the metal foils may be a component of a metal foil assembly, which may include one or more material layers, such as the metal foil and a dielectric layer. In some embodiments, the materials layers of the MFA, such as metal foil(s) or dielectric/insulator layer(s), are freestanding layer(s) rather than layers formed by depositing materials on a substrate. The MFA may be formed as an assembly prior to bonding to a substrate, or the metal foil assembly may be formed and result upon the substrate by the successive placement and bonding of several layers. These layers formed upon the substrate may themselves be metal foil assemblie(s), and the metal foil assemblie(s) may be bonded to other metal foil assemblie(s) or other layers that are joined to create a new metal foil assembly.

Figure 2:
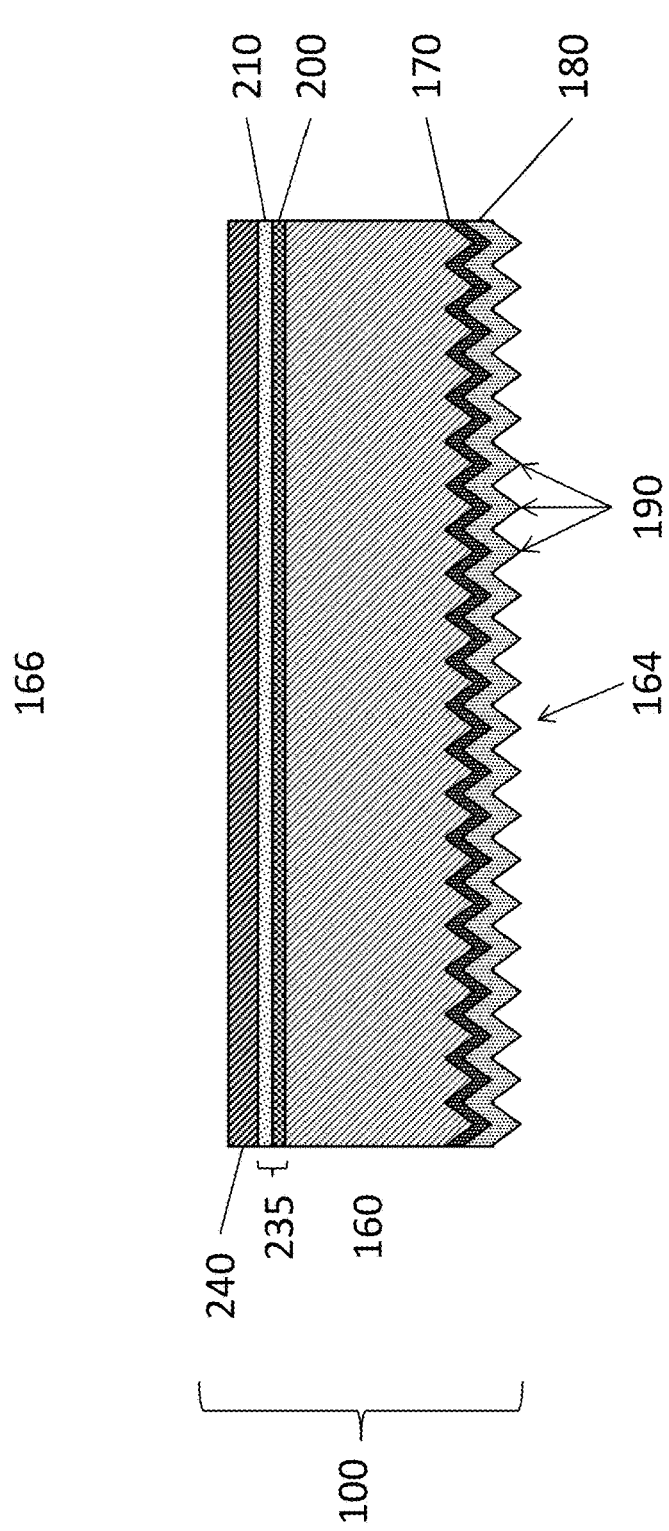
FIG. 2 shows a cross-section view of an illustrative embodiment of a partially assembled solar cell.

General Description of Substrate:

A general description of a substrate for the various embodiments discussed further herein is provided below. A more detailed view of a nonlimiting example of a substrate (100) composed of a base semiconductor (160) is shown in FIG. 2. The substrate may have a front surface (164) for receiving light and a rear surface (166) containing active layers. The front surface (164) may be textured (190) to improve light absorption, and may have various passivation (170) and antireflection (180) layers, as is described in more detail below. On the back surface or back side, the substrate (100) may have various doping or junction inducing layers (235) represented by exemplary individual layers (200,210). The back side may also have conductive layer(s) (240), as described in more detail below. It is understood that the various layers can be applied by any suitable fabrication process and at any suitable point in the fabrication process.

The suitable substrate (100) may be a semiconductor wafer of any convenient size or shape. Nonlimiting examples of suitable semiconductors include group IV semiconductors, such as silicon or germanium; group III-V semiconductors, such as gallium arsenide or indium phosphide; and group II-VI semiconductors, such as cadmium telluride. In some embodiments, the substrate (100) thickness is equal to or below about 1 mm. The surface of the semiconductor wafer may be polished. In some embodiments for solar cell applications, the starting wafer may have a surface that is textured (190) to promote light absorption. The surface texture (190) may be applied by mechanical means, laser processes, chemical etching processes, or the like. In some embodiments for silicon wafers, the surface texture (190) may contain exposure of predominantly <111> and <110> facets, such as is obtained by treatment with solutions containing KOH or NaOH in conjunction with surfactants such as alcohols. In some embodiments, the front surface (164) may be chemically smoothed by treatment with various etchants. A starting wafer that has a rough texture resulting from the wafer sawing process can be chemically smoothed with hydroxide containing etchants, such as NaOH, KOH, TMAH (tetramethylammonium hydroxide), combinations thereof, or the like. The concentrations of these etchants can be equal to or greater than 10%, and etching may be performed at temperatures equal to or greater than 50° C. The resulting surface (164) may be substantially smoothed relative to the starting rough surface, but may still contain pits, depressions, or surface undulations.

As a nonlimiting example, the surface (164) of the wafer may be textured with very fine features to produce a gradient refractive index, also referred to as a nanoscale texture or black silicon. In some embodiments, the anti-reflective etching process may be a single stage process that includes a catalytic metal and etching chemistries. In some embodiments, the anti-reflective etching process may be a multi-stage process that includes: a catalytic metal deposition stage to deposit a metal on the substrate, and an etching stage that texturizes surface(s) of the substrate to reduce reflectivity. In some embodiments, the catalytic metal deposition stage may occur utilizing a thin layer fluid process that includes steps similar to the etching stage as discussed further herein. In some embodiments, the catalytic metal may exist in a deposition fluid as a precursor that is reduced or plated on the substrate surface. As a nonlimiting example, catalytic metal solutions contain a catalytic metal and a fluorine containing compound, such as hydrofluoric acid, that is dispensed and/or dispersed into a thin fluid layer on the substrate to deposit the catalytic metal on the substrate. In some embodiments, the deposition fluid is dispersed or spread out into the thin layer with a thickness of 5 mm or less. In other embodiments, the deposition fluid is dispersed or spread out into the thin layer with a thickness of 1.5 mm or less. A thickness of the thin layer of deposition fluid may be controlled by controlling a separation distance between the first surface of the substrate and an opposing surface of a dispersion mechanism opposite the first surface. The deposition fluid may remain in contact with the substrate for about 5 seconds to 5 minutes for the catalytic metal deposition stage. After the catalytic metal deposition stage, the metal catalyst has been deposited on portions of the substrate (100), and the anti-reflective etching process may proceed to the etching stage to texturize (190) the surface of the substrate where the metal catalyst was deposited on the substrate.

In some embodiments, the substrate (100) may have different surface textures on the front and rear surfaces. The front surface may be textured (100) to promote light absorption, while the rear surface may be textured or smoothed to promote compatibility with the contacting and laser firing processes. The front surface may have textures (100) as discussed above while the back surface may be a nominally smooth surface obtained by mechanical polishing, chemical mechanical polishing (CMP), or chemical etching. Differential textures on front and back may be achieved by any suitable means. The different surfaces may be subjected to different treatments by protecting one of the surfaces with a protective coating while immersing the substrate in a treatment bath or processing in a chamber. The substrate may be subjected to a single side process by maintaining the substrate partially immersed in a fluid, where one face is immersed and the other face is not. Alternatively, the substrate may be processed in a chamber where only one side of the substrate is treated.

The starting substrate (100) may be highly pure, and thus nearly intrinsic in doping character, or may have a particular bulk doping leading it to be n-type or p-type. This presence of doping modifies the bulk resistivity of the substrate. In some embodiments, substrates may have a bulk resistivity equal to or between about 0.1 to 50 ohm-cm. In some embodiments, substrates may have a bulk resistivity equal to or between about 1 to 25 ohm-cm. In some embodiments, the substrate may be n-type doped silicon grown by the Czochralski method. The examples discussed above and herein are provided for illustrative purposes only, and it will be recognized that substrates are in no way limited to the particular examples discussed.

General Description of Front Passivation:

Front passivation layers (170) may be applied by any suitable means. As a nonlimiting example, the front passivation may include a process such as atomic layer deposition (ALD). The material deposited by ALD may include aluminum oxide ($Al_2O_3$) or silicon dioxide ($SiO_2$). As a nonlimiting example, the passivation process may include ALD deposition of aluminum oxide using trimethylaluminum (TMA) as a precursor. The substrate (100) may be annealed after deposition of the ALD deposited layer to improve or alter the passivation quality. As another nonlimiting example, the front passivation (170) may be achieved by exposing the substrate to oxygen at elevated temperature to produce a thermal oxide.

In some embodiments, the front passivation (170) may be a semiconductor layer. A nonlimiting example of a semiconductor passivation layer is hydrogenated amorphous silicon (a-Si:H). The a-Si:H may be deposited by any suitable means, including plasma enhanced chemical vapor deposition (PECVD) or hot wire chemical vapor deposition (HWCVD). In some embodiments, the deposition may take place at temperatures ranging from equal to or between approximately 150° C. to 450° C., or from equal to or between approximately 200° C. to 400° C. The a-Si:H passivation may be undoped, indicating that no intentional doping compounds are included. Alternatively, the a-Si:H passivation layer may be lightly doped by a doping compound. In some embodiments, the a-Si:H layer is relatively thin (e.g. equal to or between about 2 to 20 nm) to minimize light absorption at the front surface. The front passivation may include several layers of a-Si:H or other semiconductor materials with various doping levels. In some embodiments, a passivation (170) structure may contain a first layer of intrinsic a-Si:H in contact with the silicon substrate and a second layer of doped semiconductor such as doped a-Si:H. These and other structures may produce a front surface field to prevent charge carrier recombination at the front surface.

General Description of Doping Regions:

A solar cell may have doping regions (e.g. 145, 155 in FIG. 1A) exhibiting a particular doping characteristic. The doping characteristic may be defined by parameters including, but not limited to, the doping polarity (n-type or p-type), the level or concentration of dopant atoms, and the Fermi level. The doping regions may be created by methods including incorporation of dopant atoms in the substrate, application of layers on the substrate that modify charge carrier concentrations or movement in the substrate, and may be created during any point in the cell fabrication process. In some embodiments, a doping region may be created before (e.g. FIG. 9), during, or after (e.g. FIG. 13) the application of the multilayer foil, and different doping regions may be created at different points in the process Like interdigitated back contact (IBC) solar cells, it is desirable to have a contact in electrical connection with a first doping region, and another contact in electrical contact with a second doping region that is electrically isolated from the first contact.

Figure 1B:
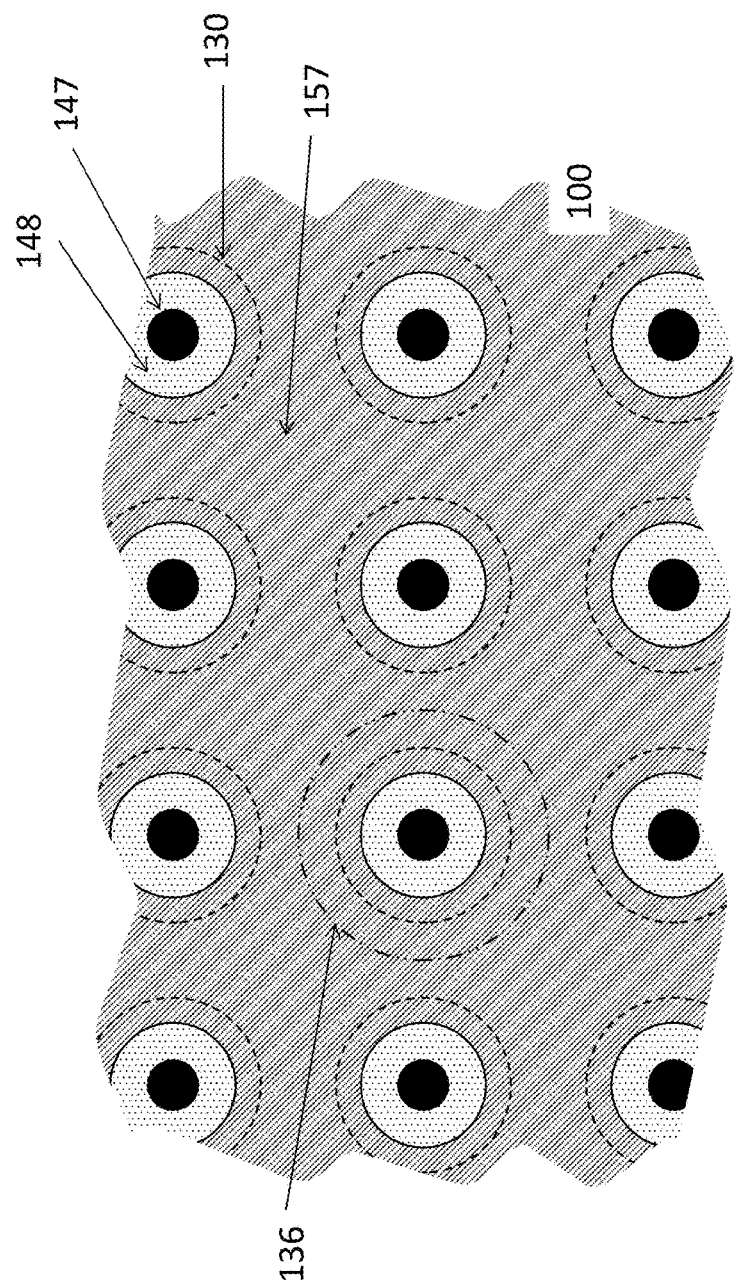
FIGS. 1B-1C show illustrative embodiments of different doping patterns.
Figure 1C:
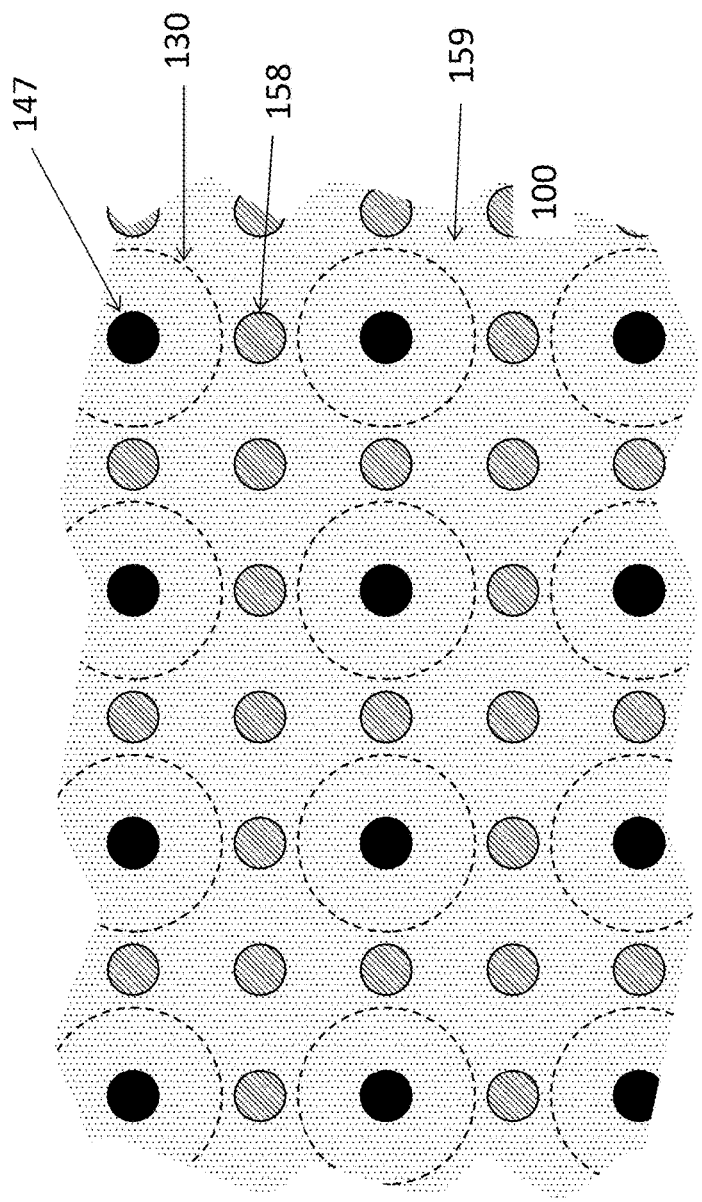

A doping region may occupy part or all of the surface of the substrate (e.g. 235 in FIG. 2). A doping region may be created by processing part or all of an existing doping region, thus modifying its doping characteristics. In some embodiments, a substrate may have a first doping region (e.g. 155 in FIG. 1A) covering a portion of the substrate, and a second doping region (e.g. 145) of opposite polarity may be created within the first doping region by locally modifying the region with a laser or other process. In one embodiment, a substrate may have a first doping region that contains a given concentration of dopant producing a first polarity. Second doping regions comprising localized areas may be produced by a laser doping process that locally incorporates sufficient dopant capable of reversing the polarity such that second doping regions are created despite the presence of the original dopant. Doping in the first and second regions may be understood to include doping by local incorporation of dopant or doping in heterojunction or adjacent layers. In further discussion below, it will be apparent that the various processing options may produce a variety of doping patterns on the substrate. FIGS. 1B-1C show illustrative embodiments of different doping patterns that may be produced.

FIG. 1B is a top view of a substrate (100) that contains a first doping region (157) of a first doping characteristic. The patterning of FIG. 1B may result when the wafer selected for processing is already doped (e.g. polarity corresponding to first doping region (157)). The substrate further contains a second doping region (147) of a second doping characteristic patterned or aligned with metal layer openings (130) and dielectric layer openings. Doping regions (147) can be referred to as localized contacts. In some embodiments, each doping region (147) may comprise one or more laser fires. The first doping region (157) can be continuous or contiguous, such that each second doping region (147) is encircled or surrounded by the first doping region in the plane of the substrate. It shall be understood that encircled or surrounded by indicates the perimeter of the second doping regions (147) are substantially surrounded by the first doping region (157). In some embodiments, encircled or surround by may mean that a radius from the second doping region exists such that greater than 80%, or preferably greater than 90% of the resulting circumference (e.g. exemplified by 136), is occupied by the first doping region. In contrast, conventional interdigitated back contact designs provide doping regions where the fingers interface into gaps of opposing finger, but none of the doping regions surround the other doping region. The projection of the openings in the metal foil assembly, for example the first metal foil opening (130), show that the openings should be sized properly to avoid electrical contact between the metal foil layers (110, 120) and/or doping regions (147,157). As a nonlimiting, the first doping region can extend to within the position of the openings, although that is not required. It is contemplated also that a region of intermediate doping or light doping (148) can exist between the first and second doping regions. In some embodiments, a first doping region (157) is in electrical contact with a first metal foil and a second doping region (147) is in electrical contact with a second metal foil. In this embodiment, the first metal layer can be continuous or contiguous in a similar manner as the first doping region (157), such that each second doping region (147) is encircled by the first metal layer, but not in electrical contact with the first metal layer. In some embodiments, encircled may mean that a radius from the second doping region exists such that greater than 80%, preferably greater than 90% of the resulting circumference (exemplified by 136) is occupied by the first metal layer.

FIG. 1C is a top view of a substrate (100) that contains localized first doping regions (158) of a first doping characteristic in addition to second doping regions (147) as described above. The patterning of FIG. 1C may result when the wafer selected for processing is undoped or lightly doped. Doping regions (158) can be referred to as localized contacts. In some embodiments, each doping region (158) may comprise one or more laser fires. In some embodiments, doping regions (158) may be created by laser firing through a first metal layer, using the metal of that layer as a dopant, or using a material coated on that layer as a dopant. In some embodiments, a first doping region (158) is in electrical contact with a first metal foil. Second doping regions (147) are similar to those described in the prior embodiment. Second doping regions (147) are arranged to be in electrical contact with a second metal foil in the same manner as discussed previously above. However, because the first doping regions (158) do not encircle or surround the second doping regions (147) in the manner described above, a large undoped region or lightly doped (159) is present.

Regarding the novelty of the patterning in FIGS. 1B-1C, in a conventional interdigitated finger design of an all back contact cell, one series of metal fingers would need to contact to the first doping regions, while another set of metal fingers patterned on the same plane and isolated from first set by a gap or insulating material would need to contact the second doping regions. It can be seen from study of the example multi-layer arrangement and patterns in FIGS. 1A-1C that rather than isolating sets of fingers via a gap or insulating material in the same plane as the fingers, the present design isolates using the metal foil opening design discussed.

In some embodiments, the first doping region and the second doping may have additional electrical isolation features to avoid significant shunt current. Electrical isolation can be achieved by physical separation of the doping regions with portions of the substrate that have a low doping level. Electrical isolation can also be achieved by relying upon the doping characteristics of the first and second doping regions to produce a rectifying junction that does not allow substantial photogenerated current to pass. Isolation can be achieved by a process steps including, but not limited to, laser processing, laser etching, wet etching, or dry etching.

General Description of Rear Emitter:

The rear emitter may be composed of one or more layers (235) that modify the charge carrier concentrations in a portion of the rear of the cell. For example, a rear emitter may be composed of a heterojunction (an interface that occurs between two layers or regions of dissimilar semiconductors) or tunnel junction (a barrier, such as a thin insulating layer or electric potential, between two electrically conducting materials). These structures may be applied by any suitable means. A heterojunction layer may comprise any suitable semiconductor or semiconductor layers with an appropriate band structure, mechanical and/or adhesion properties. In some embodiments, the heterojunction layer is formed by the application of a passivation layer (200) and a doped layer (210). As a nonlimiting example, the passivation layer may be intrinsic or very lightly doped a-Si:H. The doped layer may be doped a-Si:H with any dopant or dopant concentration that is suitable for modifying charge carrier concentrations in the solar cell. The intrinsic or lightly doped a-Si:H layer can be any suitable thickness that promotes good charge carrier transport while maintaining integrity. In some embodiments, the thickness can be in the range equal to or between approximately 2 to 20 nm, or equal to or between approximately 4 to 10 nm.

A rear doped semiconductor layer (210) may be applied by any suitable means. A rear doped semiconductor layer (210) may comprise any suitable semiconductor with the appropriate band structure, mechanical, and/or adhesion properties. As a nonlimiting example, the rear doped semiconductor layer (210) may be doped silicon. The silicon may be amorphous, microcrystalline, or polycrystalline depending upon growth conditions. The silicon layer may be deposited by any suitable means, including plasma enhanced chemical vapor deposition (PECVD) or hot wire chemical vapor deposition (HWCVD). In some embodiments, the deposition takes place at temperatures ranging equal to or between approximately 150° C. to 450° C., or equal to or between approximately 200° C. to 400° C. Doping may be accomplished by including a chemical dopant in the deposition feed stream. Nonlimiting examples of dopant chemicals include borane, diborane, phosphine, and/or arsine. The dopant may be present in the feed stream at concentrations from equal to or between approximately 0.5% to 20% on a molar basis relative to the silicon precursor. In some embodiments, dopant concentrations are from equal to or between approximately 2% to 10%.

The passivation layer (200) may also be any suitable insulator or large band-gap material with the appropriate band structure, mechanical, and/or adhesion properties. With certain types of insulators or high bandgap semiconductors utilized as the passivation layer (210), the approach shown in FIG. 2 may be termed a tunnel junction. Nonlimiting examples of tunnel junction materials are $SiO_2$, $SiN_x$, or $Al_2O_3$. A tunnel junction may be applied by ALD, PECVD, thermal oxidation (where applicable), or chemical oxidation (where applicable).

In some embodiments, the rear emitter may be formed by modifying the properties of the silicon layer (160) at its rear surface or within. For example, a rear emitter may be formed by doping the rear surface region of the silicon layer (160) with the appropriate atom. Nonlimiting examples of suitable dopants are aluminum, gallium, boron, phosphorous, antimony, and arsenic. The doping may be accomplished with a diffusion process, in which the substrate (160) is heated to a predetermined temperature in the presence of the dopant or a precursor to the dopant. In some embodiments, the diffusion may occur at temperatures ranging from 600° C. to 1100° C., and times ranging from 10 minutes to 2 hours. In some embodiments, doping may also be accomplished with ion implantation followed by high temperature annealing. As a nonlimiting example, an emitter may be formed by doping a portion of the substrate to form the desired doped region, as opposed to depositing exemplary layers (200) and (210).

It is understood that abovementioned examples are merely illustrative, and the rear emitter forming layers (235) can be accomplished with any suitable selection of materials or processes that accomplish emitter behavior.

General Description of Rear Passivation:

In some embodiments, the rear surface (166) of solar cell is passivated to provide a low surface recombination velocity (SRV) surface, and a doping process can be performed later in the process to produce an emitter function. In that case, layer combination (235) may be composed of one or more layers and can serve as a passivation structure and can have similar properties as described for the front passivation (170). The rear passivation may include layers which also modify the charge carrier concentrations in that portion of the cell. Such layers may contain a fixed charge that interacts with charge carriers in the substrates, possibly producing inversion or accumulation layers. The rear passivation layers may have similar properties and compositions to those described above for front side passivation.

General Description of Rear Conductive Layers:

A rear conductive structure (240) may be applied to the back of the cell. In some embodiments, the conductive structure may comprise any suitable conductive material, including metals, highly doped semiconductors, and transparent conducting oxides (TCO). Further, some embodiments may utilize combinations of these materials may be used. As a non-limiting example, a layer of a TCO followed by a layer of metal may be used. The TCO/metal combination may impart improved back reflection to the solar cell; thus, improving light capture and performance. In some embodiments, the rear conductive structure (240) may include additional conductive layers that are applied in subsequent processing.

Nonlimiting examples of TCOs include indium tin oxide, doped zinc oxide, and/or doped tin oxide. Nonlimiting examples of dopants include aluminum, gallium, and/or fluorine. Nonlimiting examples of metal conductive layers include aluminum, copper, nickel, silver, gold, and/or antimony. TCOs and metals may be deposited by any suitable deposition technique. Nonlimiting examples of deposition methods for TCOs may include sputtering, plasma enhanced chemical vapor deposition, and/or atomic layer deposition and for metals may include thermal evaporation, electron beam evaporation and sputtering.

The thickness of a TCO, that may comprise one element of rear conductive structure (240), may be in the range of equal to or between 10 to 1000 nm, or equal to or between 30 to 200 nm. The thickness of a metal layer, that may comprise one element of rear conductive structure (240), may be in the range of equal to or between 10 to 4000 nm, or equal to or between 20 to 2000 nm. It one embodiment the rear conductive structure (240) comprises a TCO layer followed by a thin layer of metal, in which the thin metal layer aids in providing good electrical contact to subsequently applied metal foil assemblies discussed herein.

Etched Metal:

In some embodiments discussed further herein, a solar cell with multilayer metallization is fabricated by patterning one of the metal layers with an insulating dielectric that is used in the fabrication of the MFA, such as the dielectric that insulates the first and second metal layers from each other.

Figure 3:
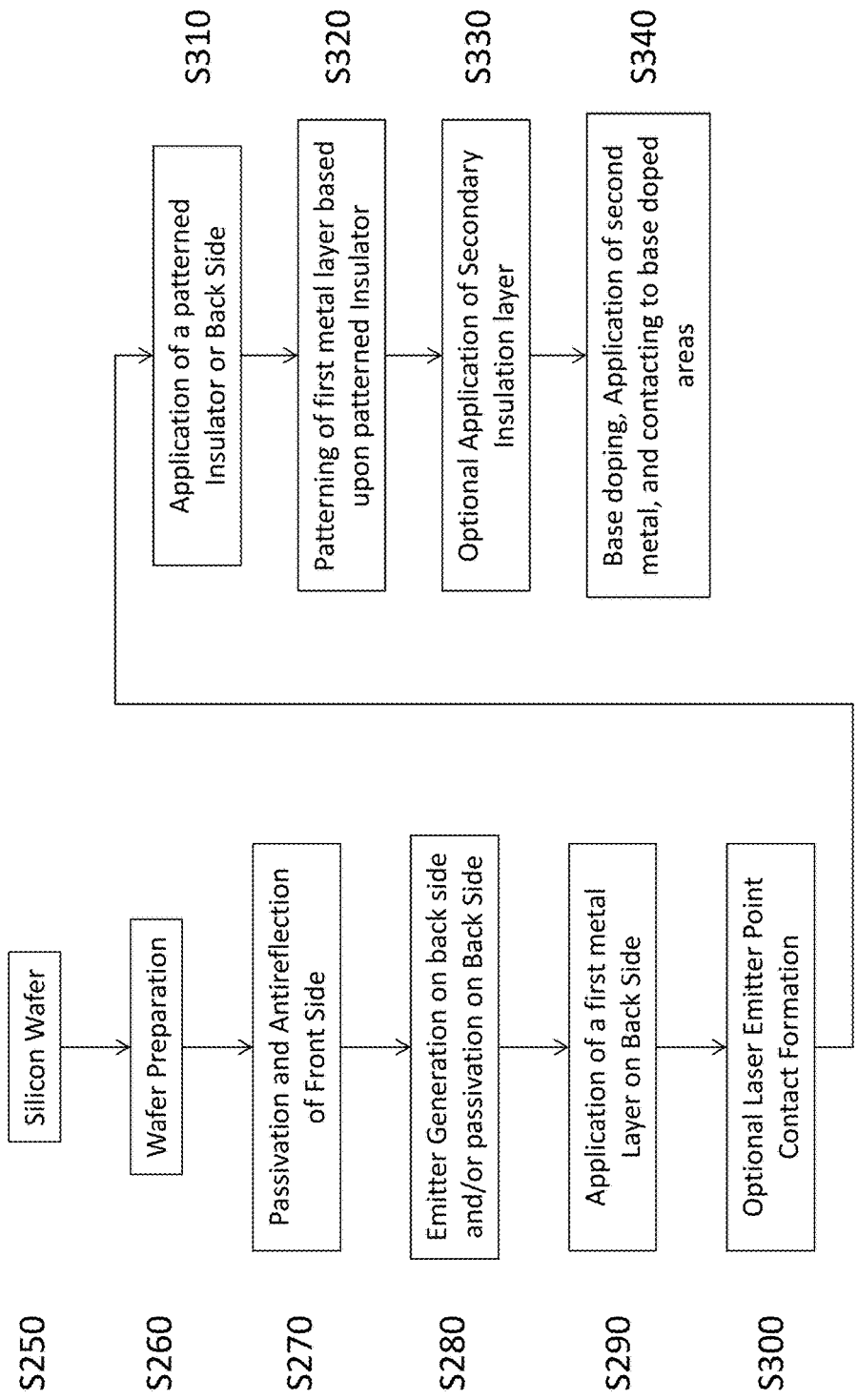
FIG. 3 is an illustrative embodiment of a process flow forming a solar cell.

Referring to the process flow in FIG. 3, a silicon wafer is selected (S250) and is prepared by etching, cleaning, and texturing steps (S260) as described above. In steps (S270) and (S280) emitter or passivation layers are applied as discussed above.

Figure 4:
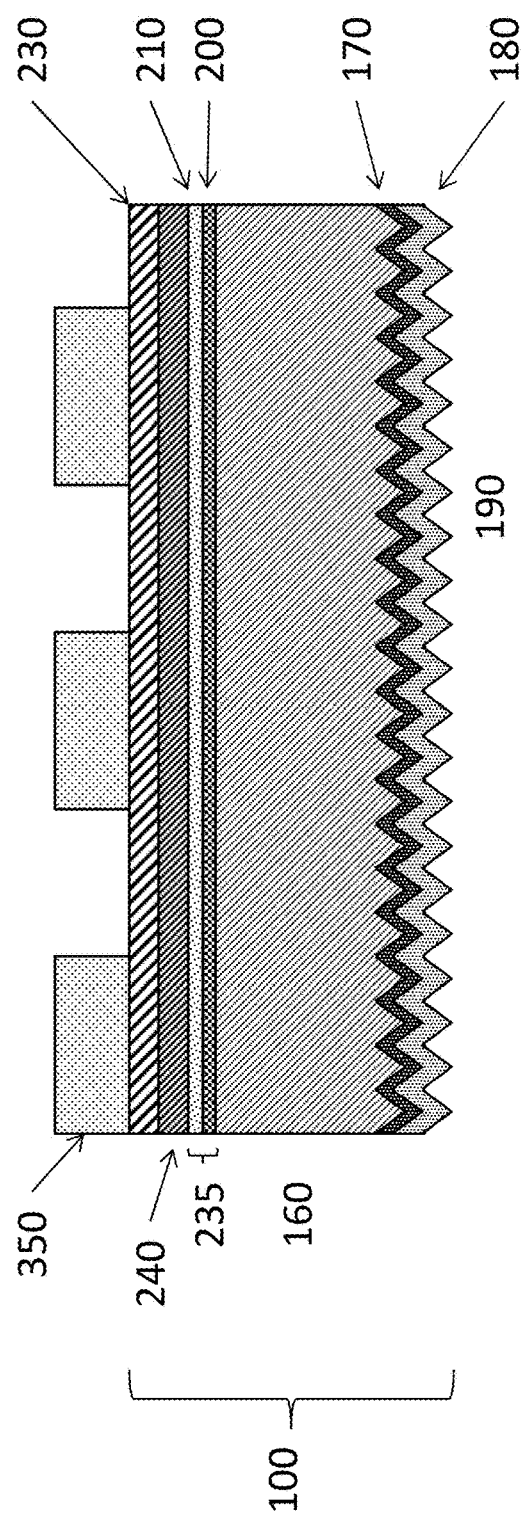
FIG. 4 is a cross-section view of an illustrative embodiment of a partially assembled solar cell.

Referring to process flow in FIG. 3 and device structure in FIG. 4, a first metal layer (230) is applied to the rear of the solar cell (S290). The metal may be applied by any suitable deposition technique, including vacuum deposition or atmospheric deposition. Nonlimiting examples of vacuum deposition steps include sputtering, thermal evaporation, and chemical vapor deposition. Nonlimiting examples of atmospheric deposition steps include atmospheric chemical vapor deposition, aerosol deposition techniques, arc spraying and solution deposition or liquid coating techniques.

The deposited metal may be any metal with suitable conductivity, or a mixture of metals. In some cases, it may be useful to deposit metal in a sequence of layers for improved conductivity and/or adhesion.

The metal may be applied as metal foil or metal foil assembly, and conductively bonded to the substrate by any of the techniques discussed below. The foil may be of any thickness that provides suitable electrical conductivity and mechanical properties. In some embodiments, the foil thickness can be in the range equal to or between 2 to 100 microns, or in the range equal to or between 10 to 40 microns.

Any metal with suitable electrical and/or mechanical properties may be used as the foil. Nonlimiting examples of these metals include aluminum, copper, silver, gold, or antimony. Further, metal alloys may be used to impart the desired properties. The metal foil may comprise multiple layers of metal and/or other materials (e.g. bonding or dielectric layers).

In some cases, the process of conductive bonding of the foil to the rear of cell may provide sufficient electrical connection, such as for a substrate that contains an emitter on the rear side. In some embodiments, laser firing through the $1^{st}$ foil and passivation layer may optionally be used to create point doping contacts when desired (S300), such as in cases where the substrate include surface passivation on the rear of the cell. In such cases, the doping material may come from the foil or a doping substance coated on the foil. Even if a suitable emitter or sufficient electrical connection exists on the rear side of the wafer from prior processing, laser point firing may optionally be used as well to improve contact to the emitter. Further details of such laser firing is discussed below in the laser processing section.

A dielectric layer (350) may be applied over the metal (S310). The dielectric insulator can be any suitable material which has low electrical conductivity and can be patterned. In some embodiments, the patterning of the dielectric layer may occur during deposition. Nonlimiting examples of deposition processes may include screen printing, inkjet printing, and gravure coating. In some embodiments, patterning may be done after deposition. For example, post deposition patterning may include light based exposure and developing, also referred to photoresist processing, and laser ablation techniques. Dyes and other compounds may be added to the dielectric layer to promote improved removal in the above processes.

In some embodiments, the dielectric layer may include epoxies, acrylics, polyesters, polyvinyl butyrals, and polyvinyl alcohols. It may be coated with any suitable solvent, including water, cyclohexanone, propylene glycol monomethyl ether, acetone, methyl isobutyl ketone, and/or methyl ethyl ketone.

The dielectric layer may be of any thickness suitable to ensure a high electrical resistance. In some embodiments, the dielectric thickness may range from equal to or between 0.1 microns to 100 microns, or equal to or between 5 microns to 50 microns.

Figure 5:
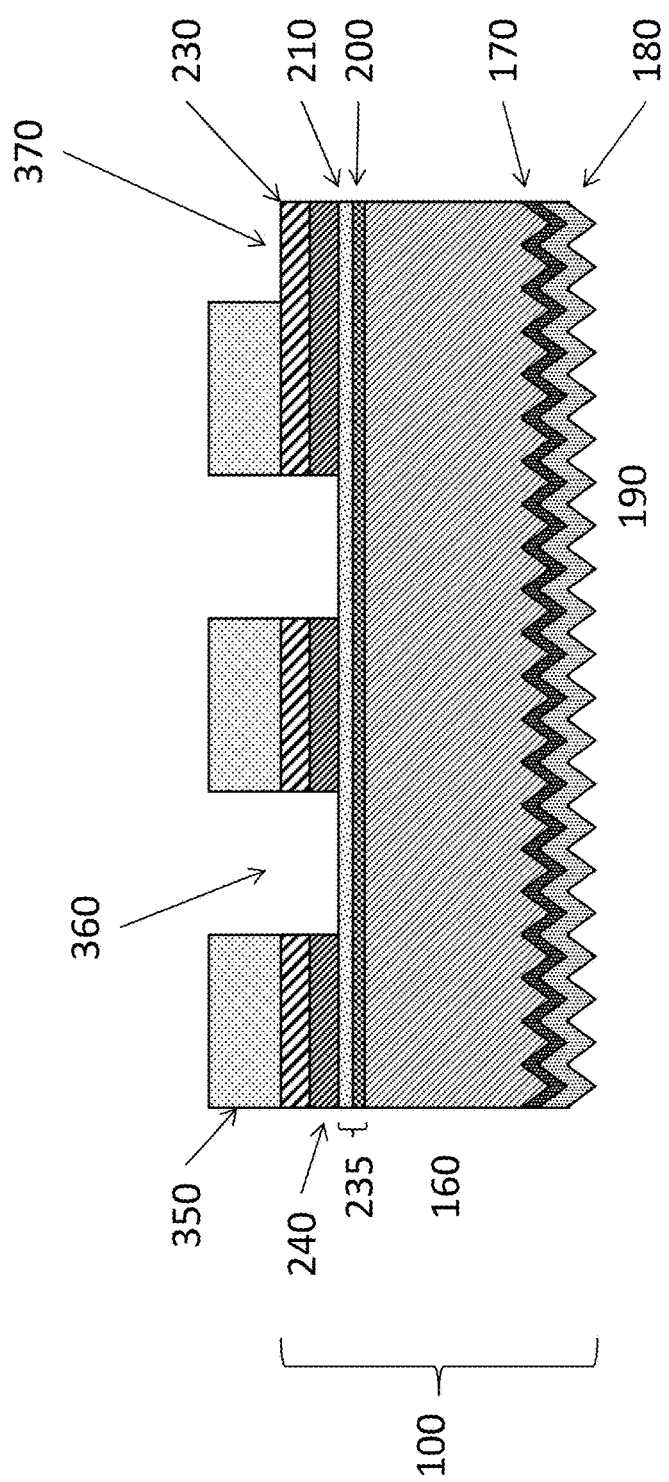
FIG. 5 is a cross-section view of an illustrative embodiment of a partially assembled solar cell.

Referring to process flow in FIG. 3 and device structure in FIG. 5, the patterning of metal layer (230) can be accomplished by etching, where the patterned dielectric layer (350) acts as a mask (step S320). In embodiments other than FIG. 5, patterning of the metal layer can be performed by perforating, drilling, or any other suitable patterning method. This etching process only removes metal layer (230) in locations (360) where the dielectric layer (350) is not present. This "self alignment" has the benefit that, regardless of distortions and errors in the pattern of the dielectric (350), the metal (230) will be etched in the same pattern. The metal (230) may be in contact with first doping regions, whereas the patterning of the openings in dielectric (350) and metal (230) correspond to second doping regions, similar to the arrangement in FIG. 1A.

The etching process may be designed to remove additional layers such as part or all of the previously applied rear conductive structure (240). Additionally, it is contemplated that the etch process may remove or alter some or all of the emitter forming layers (235) in the region of the dielectric openings. In some embodiments, the etching process may remove some or all of the rear doped semiconductor layer (210) to allow the substrate under the opening (360) to remain passivated with passivation layer (200) with similar properties to the silicon base (i.e., not function as an emitter area).

During the etching process (S320) additional regions (370) of the metal layer (230) may be protected with an additional masking layer (not shown) or may not be exposed to the etch system so as to yield exposed metal not covered by dielectric for subsequent contacting purposes.

The etching of the metal may be accomplished via solution means using any standard etchant compositions for the desired metal. The etchant solution may be water based and may contain any combination of acids, oxidizers, and bases required to perform etching at a suitable rate.

Figure 6:
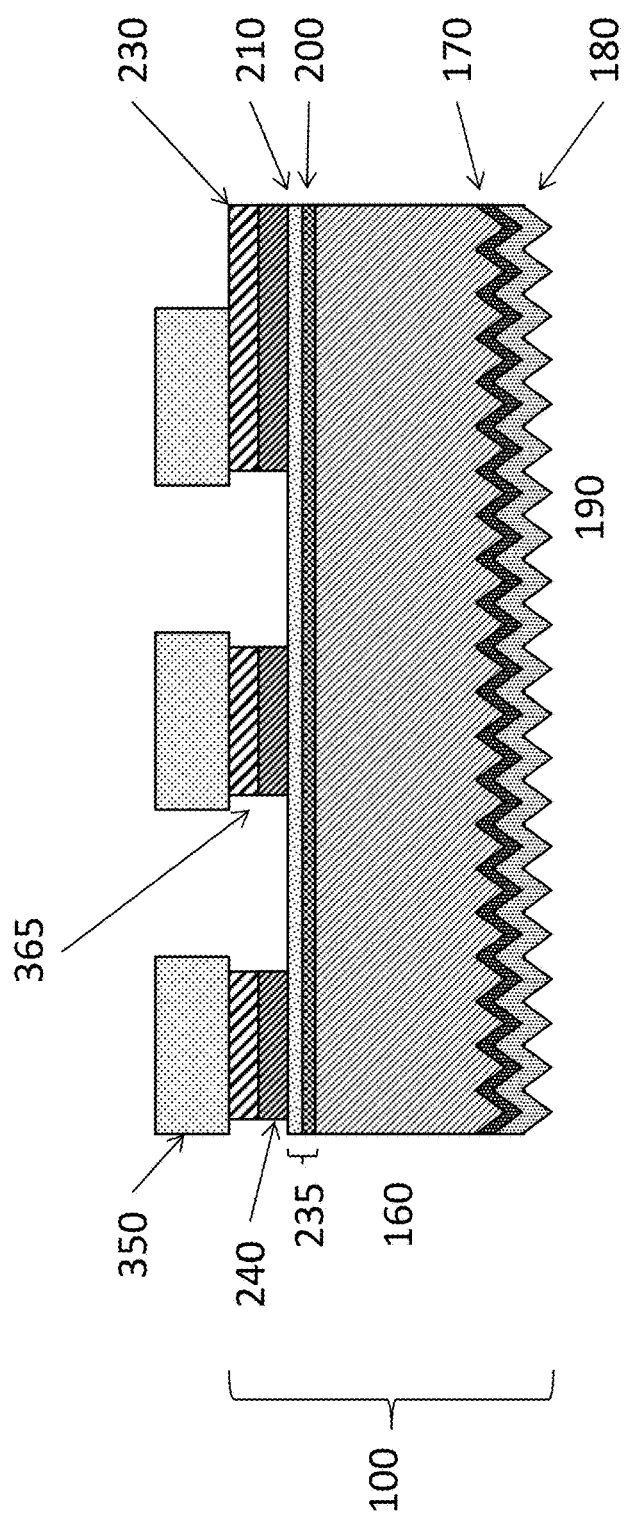
FIG. 6 is a cross-section view of an illustrative embodiment of a partially assembled solar cell.

Referring now to process flow in FIG. 3 and device structure in FIG. 6, the etching process (S320) may be optimized to produce an overhang or undercut (365) of the conductive and other functional layers so that subsequent layers are prevented with more efficacy from making undesirable contact to the metal layer (230). This overhang or undercut (365) may be described as etching that results in the dielectric layer (350) extending over one or more layers (e.g. layers 230, 240) below it.

Figure 7:
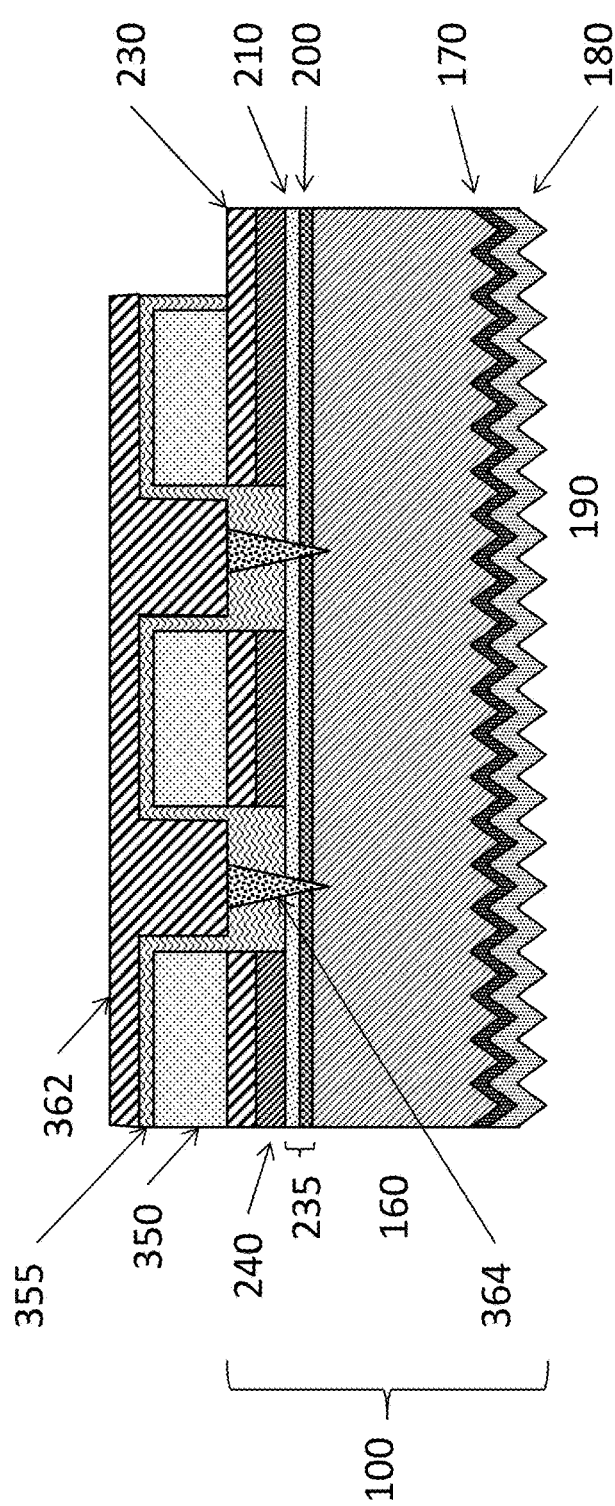
FIG. 7 is a cross-section view of an illustrative embodiment of a solar cell.

Referring now to process flow in FIG. 3 and device structure in FIG. 7, a supplementary insulating layer (355) as described below can optionally be applied (S330) to aid in preventing undesirable contact to the first metal layer (230). In the next step, laser base doping (S340) can be performed in order to produce base doping contact points or laser fired contacts (364) which can be used to allow a second metal layer (362) to make contact to the base (160). Laser doping can be performed as described further below in the laser processing section.

The second metal (362) can be applied by vacuum or atmospheric processes as described above. In some embodiments, the second metal may be applied as a metal foil with contacting methods as described below.

Patterned Foils:

Embodiments involving the use of two overlapping metal foils, for example, but not limited to, two aluminum foils, separated by an insulating layer to form a back-contact solar cell are discussed herein.

In some embodiments, the layer(s) of a MFA may be applied individually to the rear surface of the substrate. In some embodiments, the first metal foil may be perforated to provide patterned openings or an array of holes at desired regions, such as openings corresponding to first doping regions or second doping regions. As a nonlimiting example, the first metal foil may be perforated by drilling an array of small holes in the foil before placement on rear surface of a passivated wafer. These holes would provide vias for laser firing contacts using the second metal foil as a dopant source or a dopant layer coated on the second metal foil. A dielectric isolation layer between the two foils could be provided by coating one of the foils with an insulating layer or by anodizing one surface of one of the foils. While an Al foil can act as a p+ dopant source in some embodiments, an n+ dopant source could be coated on one surface of one of the foils in other embodiments. The starting Si wafer may have a passivated, low-reflection front surface, and a rear surface may be well-passivated and may contain either an a-Si:H heterojunction, a tunnel oxide junction or another layer that creates a strong inversion layer in the Si wafer.

In one embodiment, a solar cell with multilayer metallization is fabricated by applying a first patterned metal foil with a foil dielectric insulation layer to a substrate, and then applying a second metal foil to the substrate. Referring to the process flow in FIG. 8, a silicon wafer is selected (S400) and is prepared by etching, cleaning, and texturing steps (S410) as described above. Antireflection and passivation (S420) of the front side may be performed as described above. In the next step (S430), emitter or passivation layers may be applied as discussed above.

Figure 8:
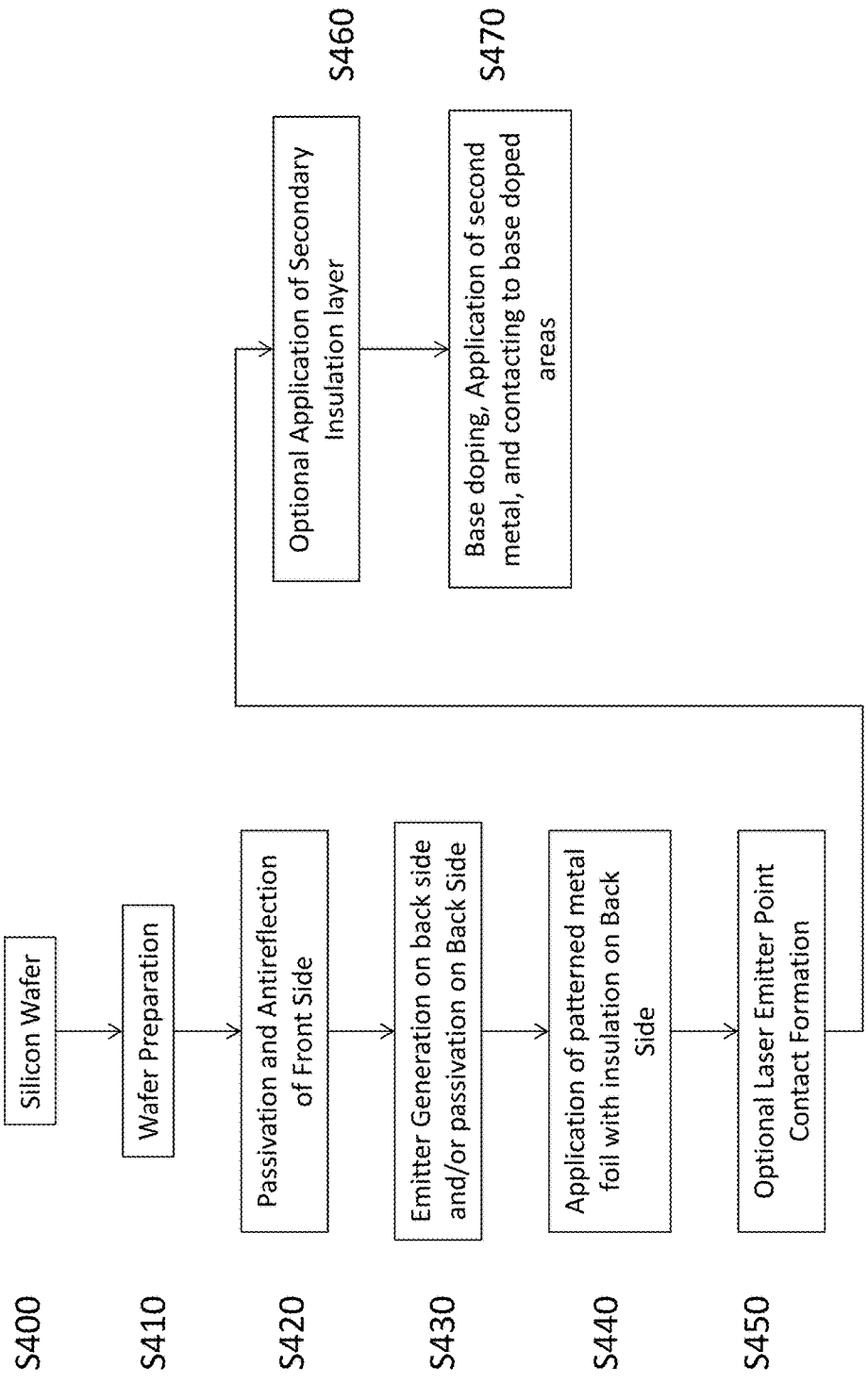
FIG. 8 is an illustrative embodiment of a process flow forming a solar cell with multilayer metallization.
Figure 9:
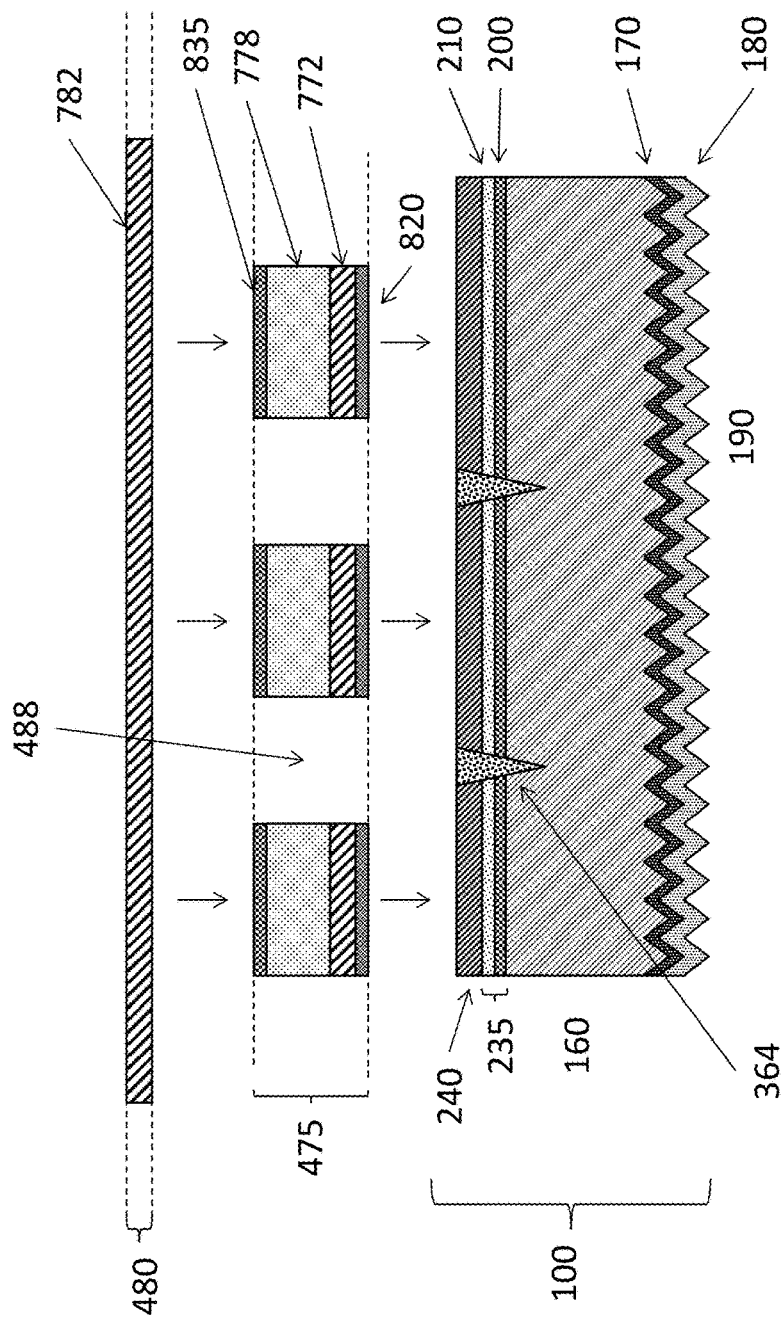
FIG. 9 is a cross-section view of an illustrative embodiment of a solar cell with a foil assembly prior to assembly.

Referring to process flow in FIG. 8 and device structure in FIG. 9, in step S440 a first metal foil assembly (475) may be applied by conductive bonding to the substrate (100). The first metal foil assembly (475) may have a metal foil layer (772), dielectric insulator (778), and/or bonding layers (835, 820). A foil assembly (475) may refer to a single foil or an assembly of a single foil with other components.

Figure 10:
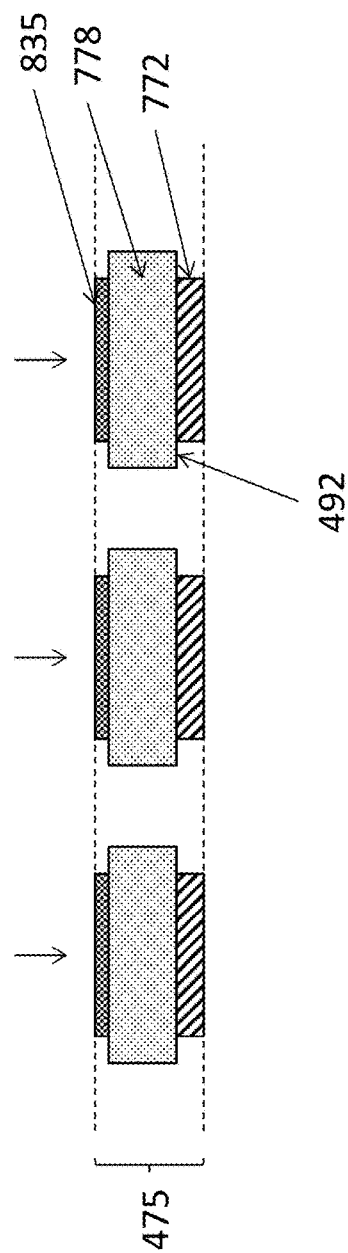
FIG. 10 is a cross-section view of an illustrative embodiment of a foil assembly with an overhang.

The first foil assembly (475) may be patterned and have patterned features that produce openings (488) in the foil. The openings (488) in the dielectric (778) may be aligned with high precision to the openings in the metal (772). In some embodiments, the position of the edge of an opening in the metal (772) and edge of an opening in the dielectric insulator (778) may be within 40 microns or less in a lateral direction, or within 10 microns or less in a lateral direction. Referring to FIG. 10, in some embodiments, the dielectric insulator (778) may extend past the edge of the metal layer (772) opening, thereby producing an overhang (492). This may be desirable for avoiding possible contact or shorting between the first metal layer (772) and any subsequent layers.

The process of conductive bonding of foil to the rear of cell may provide sufficient electrical connection, such as where a substrate contains an emitter on the rear side. In some embodiments, laser firing through the foil assembly (475) may optionally be used to create point doping contacts or laser fired contacts (S450), such as for a substrate that has surface passivation on the rear of the cell. In some cases, the doping material may come from the foil or a doping substance coated on the foil. In some embodiments, even when an emitter exists on the rear side of the wafer, laser point firing can optionally be used to improve contact to the emitter. A supplementary insulator layer may be applied in step S460, with properties and function as described below.

Referring back to process flow in FIG. 8 and device structure in FIG. 9, laser base doping can be performed (S470) in order to produce base doping contact points (364), which can be used to allow a second metal foil assembly (480) that forms the second metal layer (782) to make contact to the base (160). Laser doping can be performed as described below.

In another embodiment, a solar cell with multilayer metallization is fabricated by applying a first patterned metal foil and then a second metal foil assembly with a foil and dielectric insulation layer. Referring to the process flow in FIG. 11, a silicon wafer is selected (S500) and is prepared by etching, cleaning, and texturing steps (S510) as described above. Antireflection and passivation (S520) are performed as described above. In step (S530) emitter or passivation layers are applied as discussed above.

Figure 11:
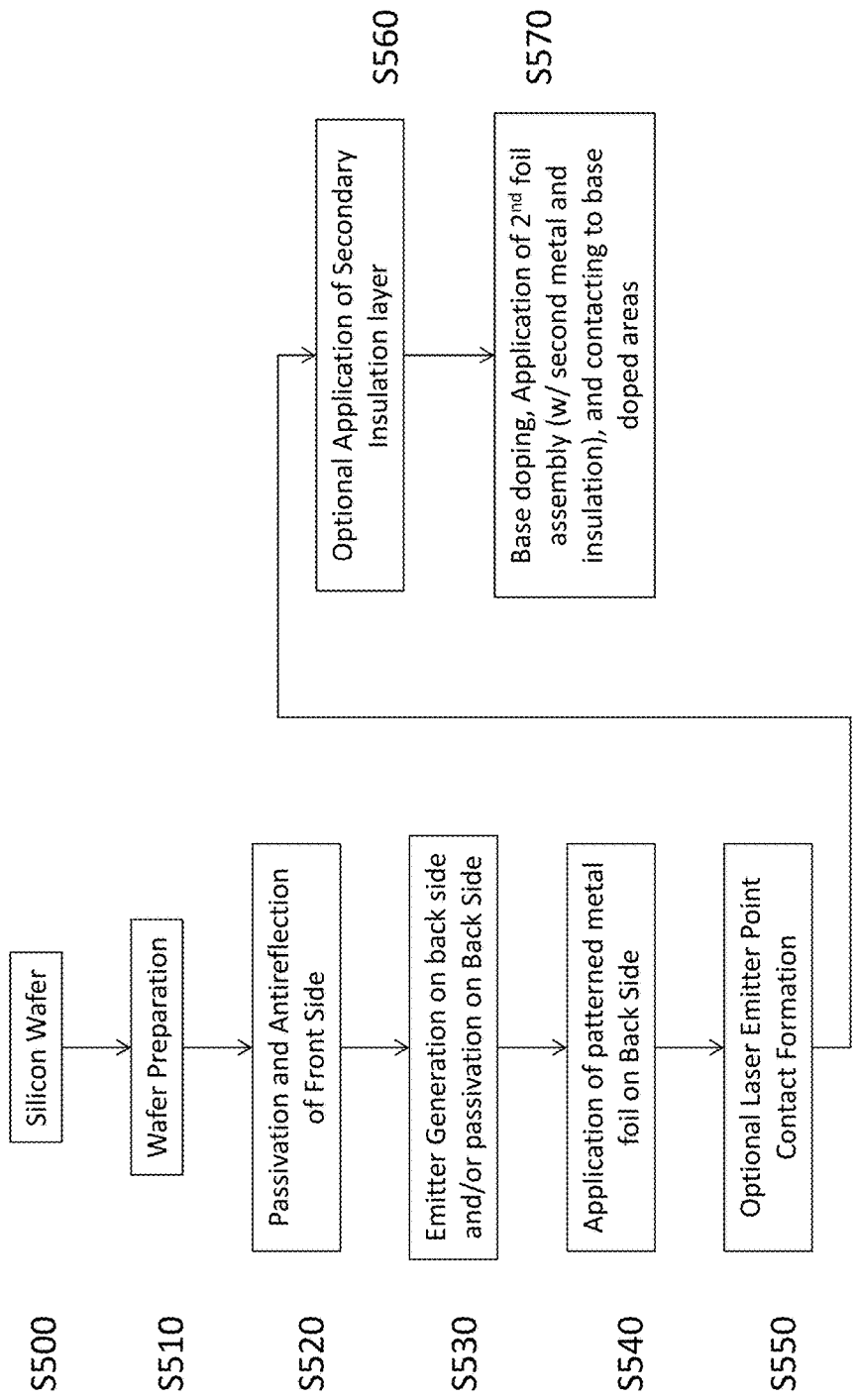
FIG. 11 is an illustrative embodiment of a process flow forming a solar cell with multilayer metallization.
Figure 12:
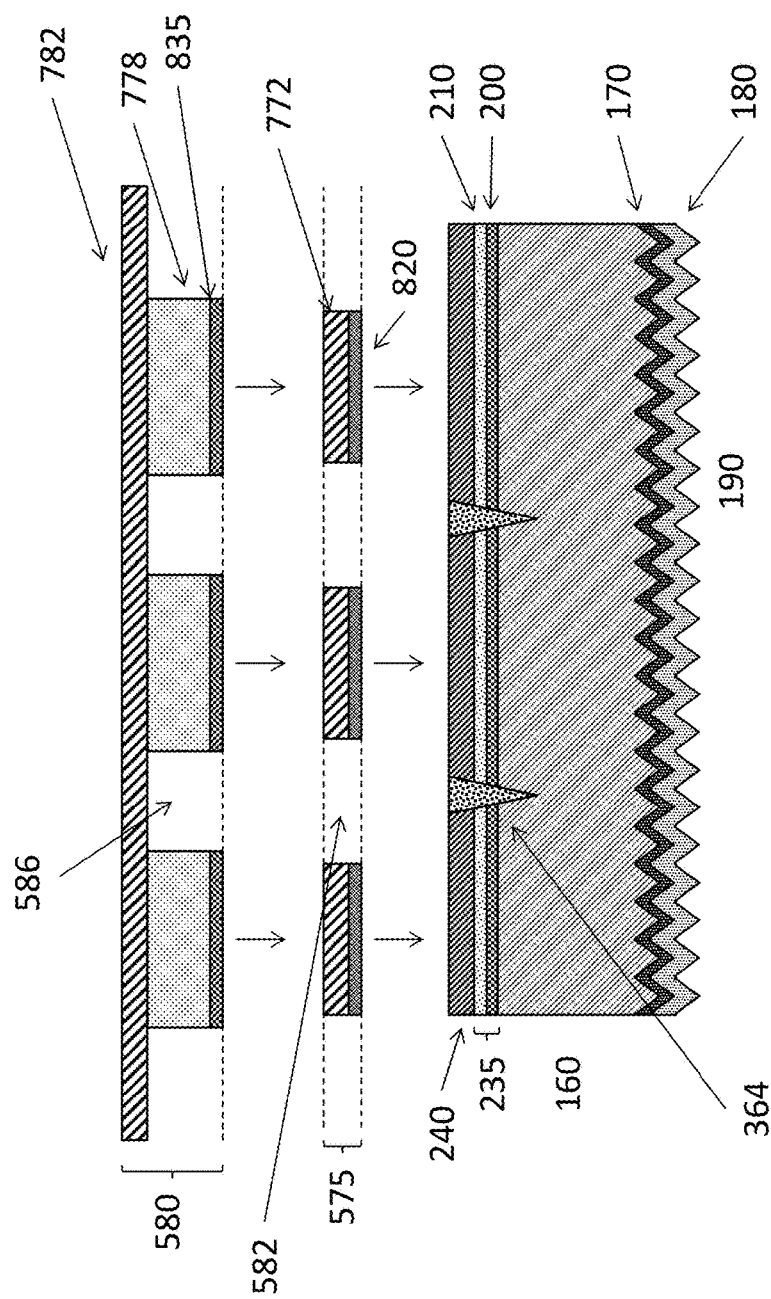
FIG. 12 is a cross-section view of an illustrative embodiment of a solar cell with a foil assembly prior to assembly.

Referring to process flow in FIG. 11 and device structure in FIG. 12, in step S540 a first metal foil assembly (575) including a metal foil (772) and conductive bonding layer (820) is applied by conductive bonding to the substrate. The foil assembly (575) may be patterned and have pattered features that produce openings (582) in the foil. As discussed previously, the metal foil assembly (575) may include other components, such as a bonding layer (820).

In some embodiments, the process of conductive bonding of foil assembly (575) to the rear of cell may provide sufficient electrical connection, such as for a substrate that contains an emitter on the rear side. In some embodiments, laser firing through the foil may be used to create point doping contacts (S550), such as for a substrate that has surface passivation on the rear of the cell. In such cases, the doping material may come from the foil or a substance coated on the foil. It shall be understood that even when an emitter exists on the rear side of the wafer, laser point firing can be used to improve the contact to the emitter. A supplementary insulator layer may be applied in step S560, with properties and function as described further below.

A second metal foil assembly (580), including a dielectric (778) and a metal foil (782), can be bonded to the first metal foil assembly (575) in the next step (S570). The openings (586) in the dielectric insulator (778) may be aligned with high precision to the openings (582) in the metal foil assembly (575). In some embodiments, the position of the edge of an opening (582) in the first metal foil assembly (575) and edge of an opening (586) in the foil dielectric insulator (778) may be within 40 microns or less in a lateral direction, or within 10 microns or less in a lateral direction. The centers of the dielectric openings (586) may align with the centers of the first metal foil openings (582). In some embodiments, the dielectric openings (586) may have smaller dimensions (e.g. diameter) than openings (582) to result in a slight overhang from dielectric layer (778). This may be desirable for avoiding possible contact or shorting between the first metal foil and any subsequent layers. Bonding layers (835) and conductive bonding layers (820) in the above embodiments may be present on one or both of the surfaces to be bound.

In some embodiments, laser base doping can be performed (S570) in order to produce base doping contact points (364) which can be used to allow a second metal layer (782) to make contact to the base. Laser doping can be performed as described below.

Figure 13:
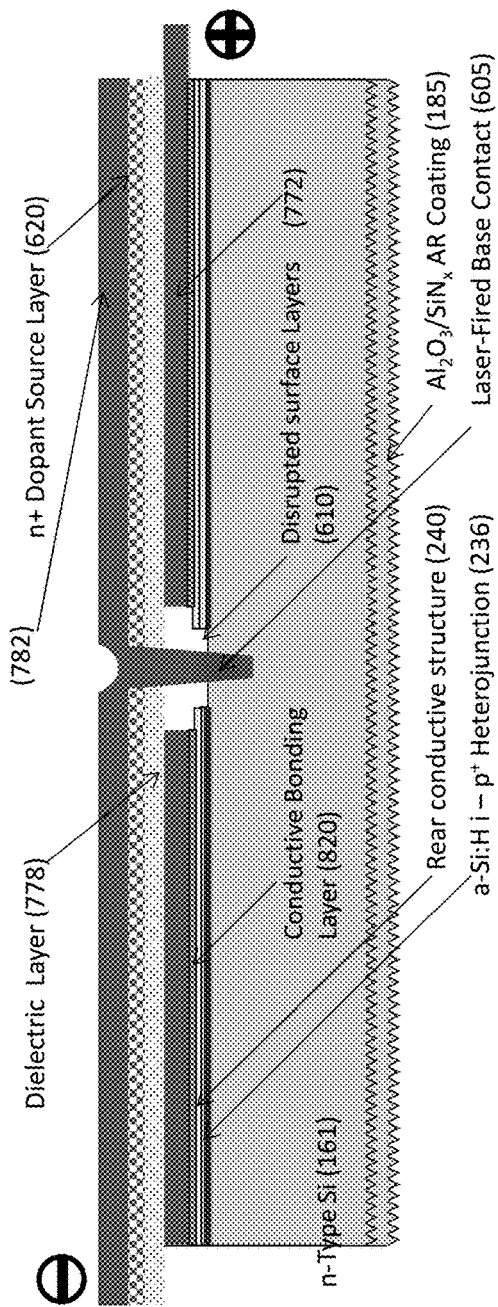
FIG. 13 is a cross-section view of an illustrative embodiment of a solar cell with a heterojunction.

An exemplary embodiment is shown in FIG. 13. While the exemplary examples discussed herein may identify specific materials, doping types, processing steps and/or structural arrangements, it shall be understood that other materials, doping types, processing steps and/or structural arrangements discussed in throughout specification may be substituted. A nonlimiting back-contact Al-foil heterojunction solar cell is shown for illustrative purposes only. The cell has a thin conductive bonding layer (820), such as indium or a tin-zinc solder, in contact with the $1^{st}$ Al or metal foil (772) to bond it to the rear conductive structure (240) on an a-Si:H i-p+ heterojunction (236) on the Si wafer (161). The $2^{nd}$ Al or metal foil (782) is coated with a layer of an n+ dopant (620) (such as a NiP alloy) and a dielectric layer (778). The laser firing through the $2^{nd}$ foil creates an n+ region (605) in the Si that allows good ohmic contact to the laser-transferred Al.

Figure 14:
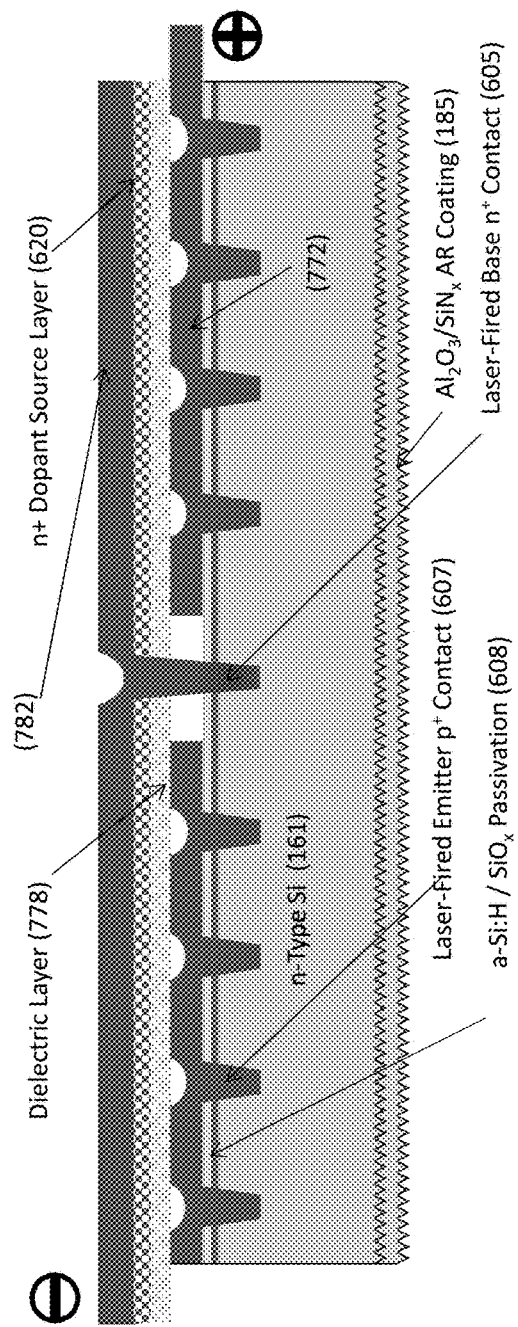
FIG. 14 is a cross-section view of an illustrative embodiment of a solar cell with $p^+$ and $n^+$ laser fired contacts.

Another exemplary embodiment is shown in FIG. 14. This embodiment involves laser firing an array of p+ emitters (607) through a first Al or metal foil (772). Then a $2^{nd}$ Al or metal foil (782) coated with an n+ dopant source (620) and dielectric layer (778) may be applied, and n+ regions (605) can be formed by laser doping through vias in the $1^{st}$ Al or metal foil (772). The rear surface may be passivated by a-Si:H/SiO$_x$ (608), or other layers with a low density of fixed charges so there is no significant band bending in the Si (or no inversion or accumulation layers).

A metal foil assembly bonded to a substrate may serve as a mask for processes on the substrate. As a non-limiting example, after step S440 or step S540, the substrate will have regions covered and regions not covered by a metal foil assembly. For example, in FIG. 9 when the metal foil assembly (475) is bonded to substrate (100), regions under openings (488) will be not covered. Similarly, in FIG. 12, when metal foil assembly (575) is bonded to substrate (100), regions under openings (582) will be not covered. These substrates can be subjected to processes in which the uncovered regions can receive treatment(s), while the covered regions will be substantially unaffected because they are not exposed. As a nonlimiting example, the uncovered regions may undergo processing such as wet treatments, wet etching, chemical vapor deposition, plasma enhanced chemical vapor deposition, physical vapor deposition, plasma etching, and reactive ion etching.

In one embodiment, the substrate (100) contains a rear conductive structure (240, e.g. FIG. 9). After bonding of metal foil assembly (475), which simultaneously bonds the dielectric layer (778) and first metal foil (772) to the substrate, the resulting structure is processed in an etch process capable of attacking some or all of the conductive layers that comprise layer (240). Similarly, in embodiments where the first metal foil (772) is bonded to the substrate prior to the dielectric layer (778) (e.g. FIG. 12), the first metal foil alone may act as a mask for the etching process. Due to the masking effect of the metal foil assembly (475 or 575), only uncovered regions of the rear conductive structure (240) under the openings (488) will be partially or completely removed.

Patterned Foils Applied as a Multilayer Foil Assembly (MFA):

While the embodiments discussed above utilize processes where the layers are applied or exist prior to assembly on the cell as freestanding foils, it shall be apparent that such embodiments may be modified for processing where the layers are applied as a MFA. Similarly, the MFA embodiments discussed below can also be modified for processing where individual layers are applied.

Embodiments using roll-to-roll processing with machine vision and laser processing are discussed herein. Supply rolls of metal foils and dielectric materials may supply materials for the roll-to-roll processing. In some embodiments, roll-to-roll processing comprises multiple lamination steps where layers are applied or joined together to form the layers of a multilayer foil assembly (MFA). In some embodiments, the lamination steps may merge a dielectric insulating layer to one or more of the metal foil layers to form the MFA. In some embodiments, the lamination steps may include other layers, such as, but not limited to, bonding layers, dopant source layers or layers for promoting the formation of metal silicides (such as NiSi) for low-resistance contacts. In some embodiments, the roll-to-roll processing may include steps to form patterned openings or an array of holes at desired regions in the foil assembly, such as by drilling of via arrays. It shall be understood that these opening formation steps may be performed on the layers-of-interest at any time prior to lamination to a layer that does not require the openings. Further, the opening formation steps may also be performed after layers-of-interest requiring the same openings are laminated together. In some embodiments, it may be desirable to perform opening formation steps to provide fiducial holes that may be utilized to aid aligning layer(s). Thus, opening formation step(s) may be performed on a metal foil layer prior to lamination to another layer of material; after lamination of a metal foil layer to an insulator dielectric layer and/or a bonding layer, but before lamination to a second metal foil layer; and/or after lamination of a second metal foil layer to an insulator dielectric layer and first metal foil layer. It shall be apparent from the following discussion that the desired combination of above noted opening formation step(s) is dependent on the rear contact structure desired. In some embodiments, the roll-to-roll processing may involve high-speed dopant printing (e.g. inkjet, aerosol jet, laser transfer printing, etc.), such as in vias created by an opening formation step. In some embodiments, the high-speed dopant printing may include depositing an array of print heads or nozzles and multiple dopant materials. Once the multilayer foil assembly is formed by the roll-to-roll process, it can be bonded to a silicon wafer during the laser firing/doping of a back-contact solar cell through the vias formed in the opening formation step(s) to form laser fired contacts for a first metal foil, laser fired contacts for a second metal foil, or both.

In some embodiments, the solar cell fabrication involves three separate processes where wafer cleaning, texturing and passivation (including heterojunction formation or tunnel oxide formation) are performed in one process, while the roll-to-roll processing of the multilayer foil assembly can be performed simultaneously in a separate operation. The foil assembly may then be laser doped and bonded to the passivated wafer in a final solar cell processing step.

Figure 15:
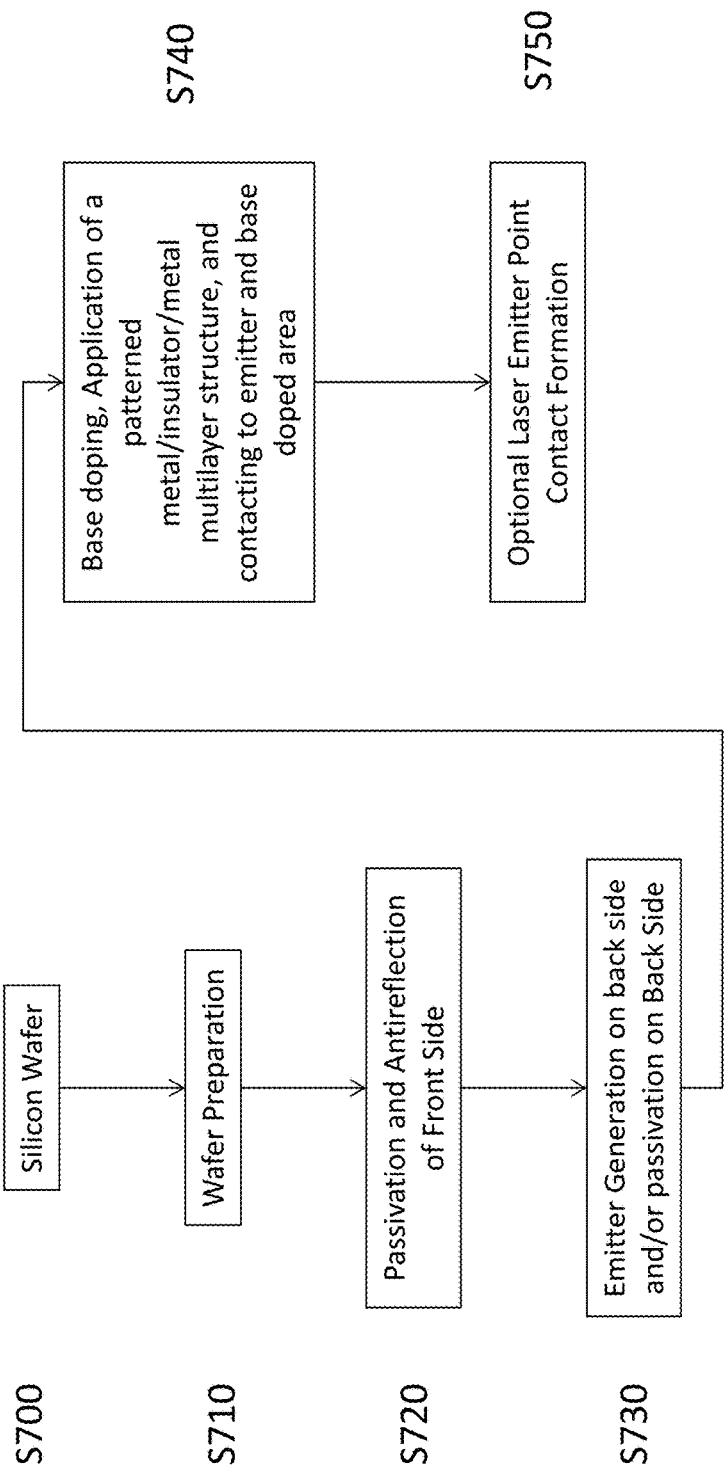
FIG. 15 is an illustrative embodiment of a process flow forming a solar cell with high volume multilayer foil assembly.
Figure 16:
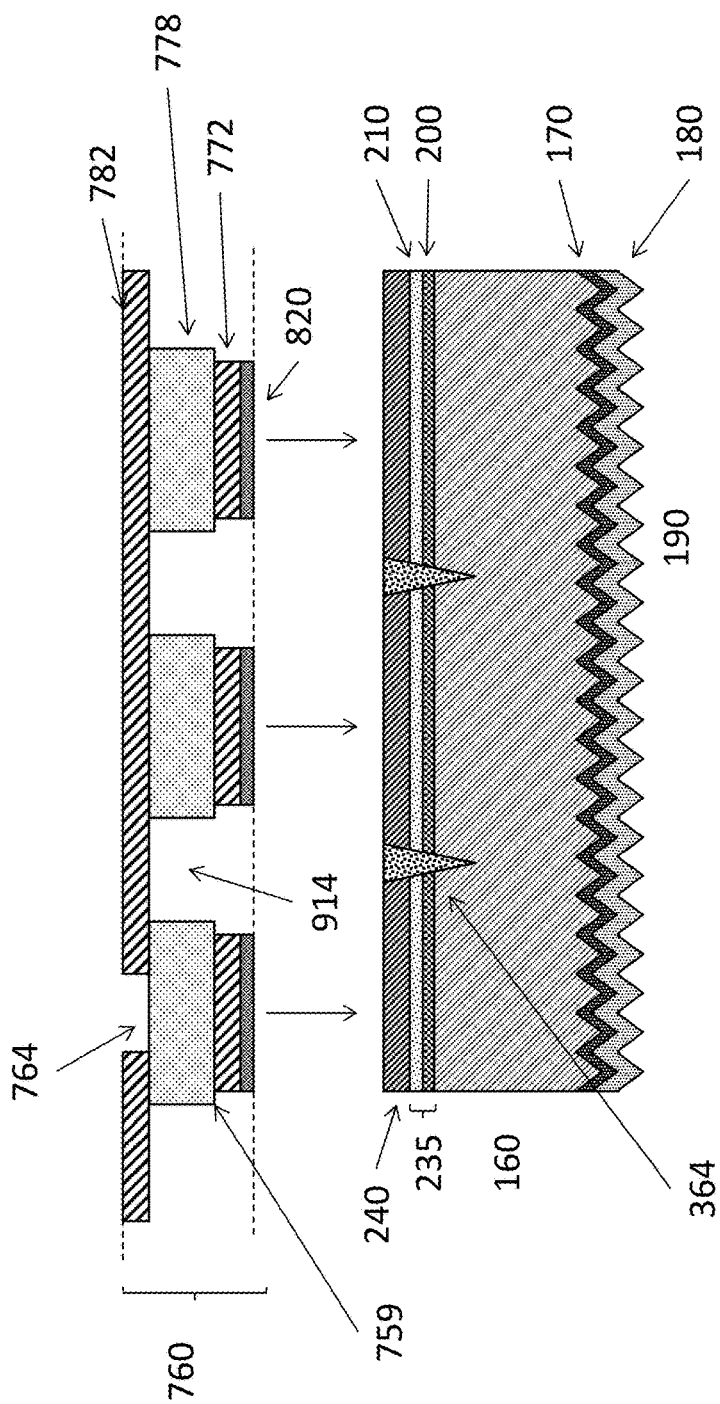
FIG. 16 is a cross-section view of an illustrative embodiment of a solar cell prior to high volume multilayer foil assembly.

Referring to process flow in FIG. 15 and device in FIG. 16, a silicon wafer (S700) may be selected and prepared by etching, cleaning, and texturing steps (S710) as described above. Antireflection and passivation (S720) are performed as described above. In the next step (S730), emitter or passivation layers are applied as discussed above.

In some embodiments, a multilayer foil assembly (760) may be prepared in a high volume process external to the solar cell fabrication line or separately from the substrate prior to application on the substrate. The multilayer foil assembly may contain a first metal foil (772), a second metal foil (782), and a dielectric film (778) disposed between the two in order to prevent electrical contact between the first and second metal foils. One or more layers of the multilayer foil assembly may be patterned as described below to produce openings, such as to produce openings (914) in the metal foil (772) and dielectric (778) corresponding to doped regions for the base, which allow the upper foil (782) to make contact with substrate. The openings in the dielectric insulator (778) may be aligned with high precision to the openings in the first metal foil (772). In some embodiments, the position of the edge of an opening in the metal foil (772) and edge of an opening in the dielectric insulator (778) may be within 40 microns or less in a lateral direction, or within 10 microns or less in a lateral direction. In some embodiments, processes may be employed to allow dielectric insulator (778) to extend past the edges of the first metal foil (772), thereby producing an overhang (759). This overhang (759) may be desirable for avoiding possible contact or shorting between the first metal foil (772) and any subsequent layers. As in other embodiments, laser processing may be performed (S740) to form laser fired contacts that are electrically coupled to the upper foil (782).

In some embodiments, there may be openings (764) in the second foil (782) corresponding to doped regions for an emitter to allow a laser beam or other process to address the first foil (772) for the purpose of laser doping the substrate with the first foil (S750).

The multilayer foil assembly (760) may be conductively bonded to the substrate, establishing a connection of the lower metal foil (772) to regions of the substrate. In some embodiments, conductive bonding may include a conductive bonding layer (820) and process as described below.

Figure 17:
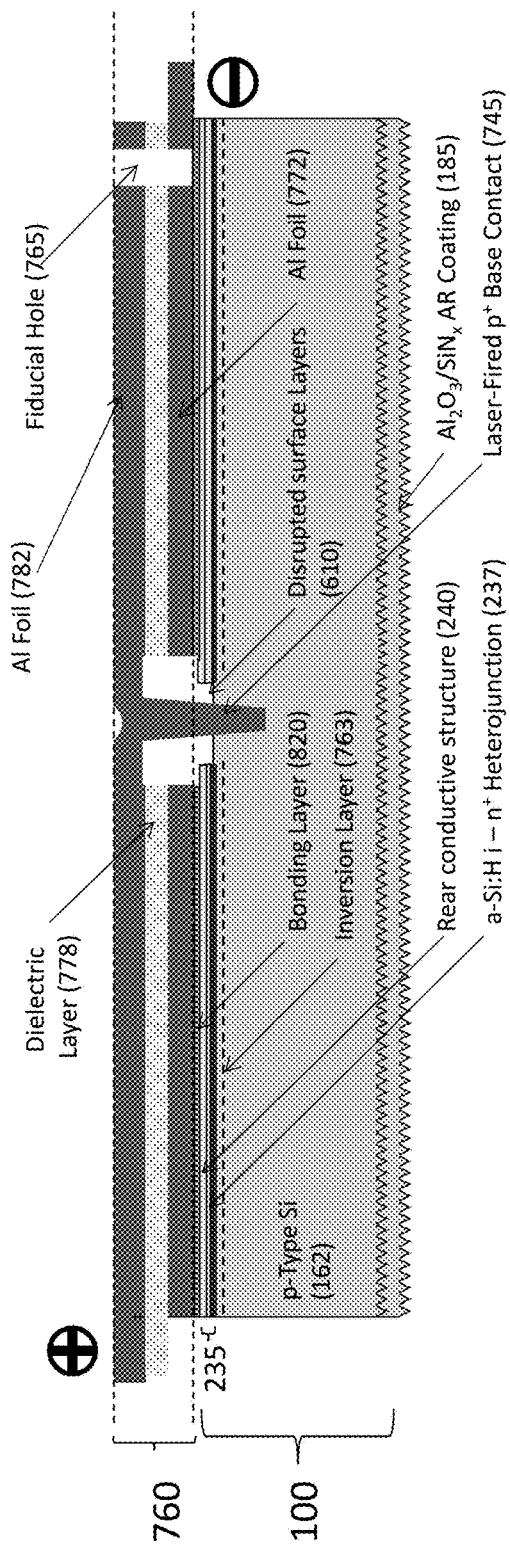
FIG. 17 is a cross-section view of an illustrative embodiment of a solar cell with a roll-to-roll prepared multilayer foil assembly.
Figure 18:
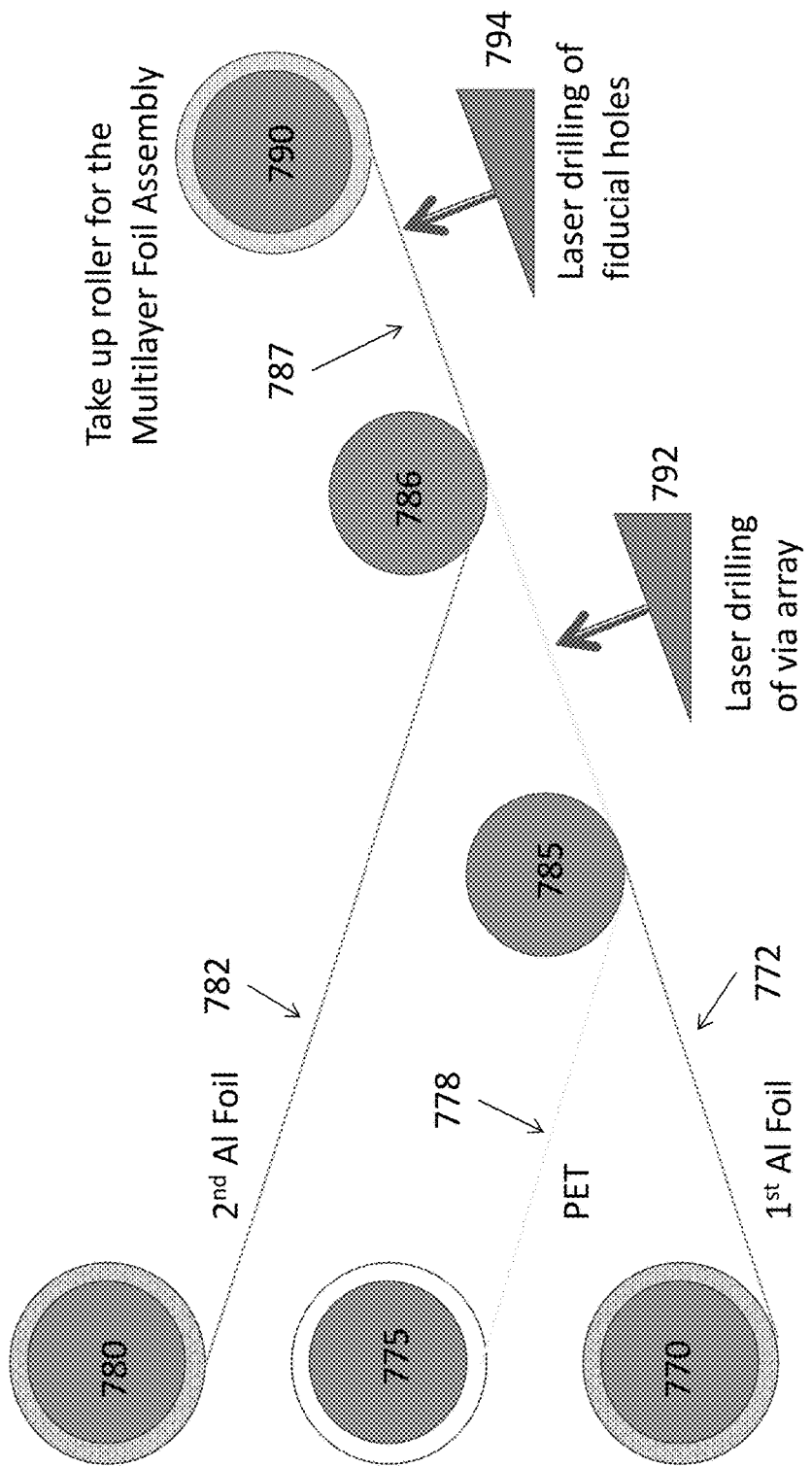
FIG. 18 is an illustrative embodiment of a roll-to-roll process for forming a multilayer foil assembly.

One nonlimiting embodiment of a solar cell with multilayer metallization yielding a back-contact, p-type Si heterojunction solar cell is shown in FIG. 17 including a multilayer foil assembly (760), with a process for producing the multilayer foil assembly shown in FIG. 18. As a nonlimiting example, a back-contact Al-foil heterojunction (HJ) solar cell on a p-type Si wafer is discussed, but it shall be understood that other embodiments may vary the materials involved and/or steps performed according to the multilayer foil assembly desired. Similarly, it shall be understood that further examples discussed herein may also vary the materials involved and/or steps performed. For an Al-foil HJ solar cell, a first metal foil (772), supplied from source (770), may be laminated to a dielectric layer (778), supplied from source (775), by a joining process (785) and then both layers perforated, for example, by drilling (792) an array of small holes or vias at desired locations. The vias could be formed using an array of lasers or by mechanical perforation. The perforated, laminated metal/dielectric layers are then laminated to a second metal foil (782), supplied from source (780), by a joining process (786). In some embodiments, machine vision may be used in conjunction with laser drilling to assist proper alignment. As a nonlimiting example, machine vision may be used to direct another laser to drill fiducial holes (794) through the laminated sheet to assist in the subsequent alignment of a p+ doping laser with the array of vias in the $1^{st}$ metal foil. The resulting roll form multilayer foil assembly (787) is optionally taken up on roller (790) for shipping and storage.

Subsequently, multilayer foil assembly sections may be cut and placed in contact with a Si HJ layer on a Si wafer (100, FIG. 17), and a laser forms p+ base contacts while locally disrupting the Si HJ contact so as to inhibit shunting.

In one particular nonlimiting embodiment employing the process of FIG. 18, a first Al foil is laminated to a thin layer of PET, and a laser then drills vias through the laminated Al/PET layers. A second Al foil is laminated to the perforated Al/PET layers, and another laser drills fiducial holes through the foil assembly to align the p+ contacts with the vias. A thin In or Sn—Zn solder bonding layer (820) could be either sputtered onto the surface of the rear conductive structure (240) or onto the surface of the bottom multilayer foil assembly (760) (as part of the multilayer foil assembly formation process). Another option is to spray a conductive adhesive, such as an Ag, Cu or Ni-based adhesive, to bond the rear conductive structure (240) to the $1^{st}$ Al foil (772) with a low contact resistance.

Figure 19:
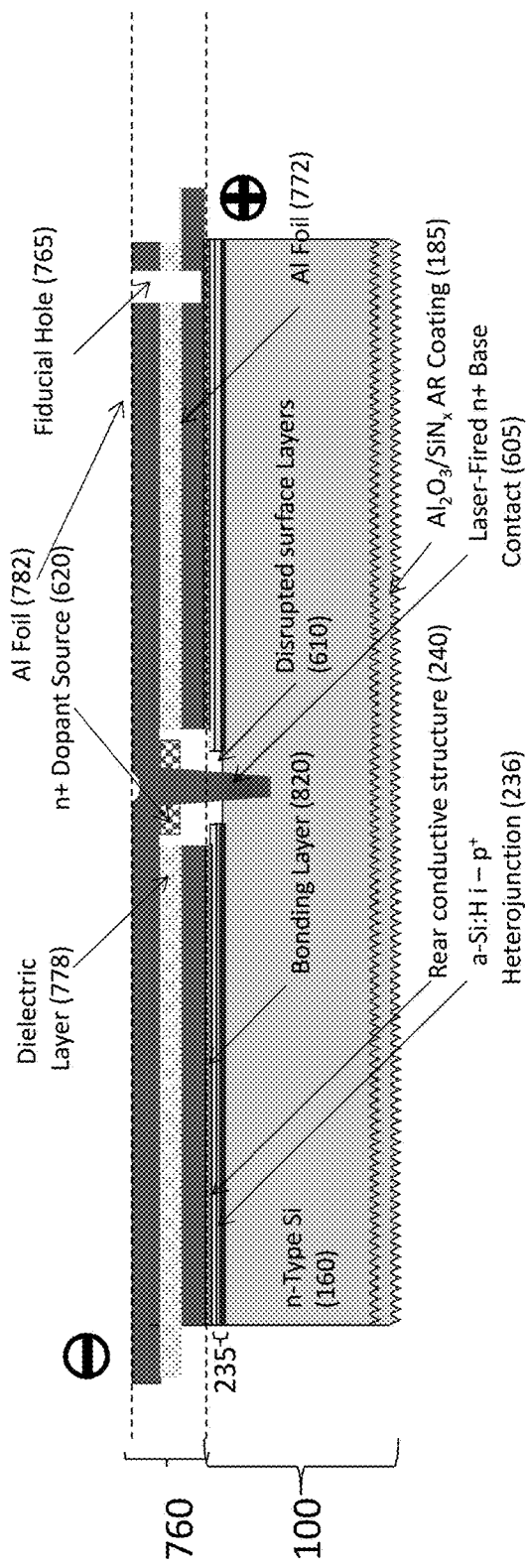
FIG. 19 is a cross-section view of an illustrative embodiment of a solar cell formed utilizing a roll-to-roll prepared multilayer foil assembly.
Figure 20:
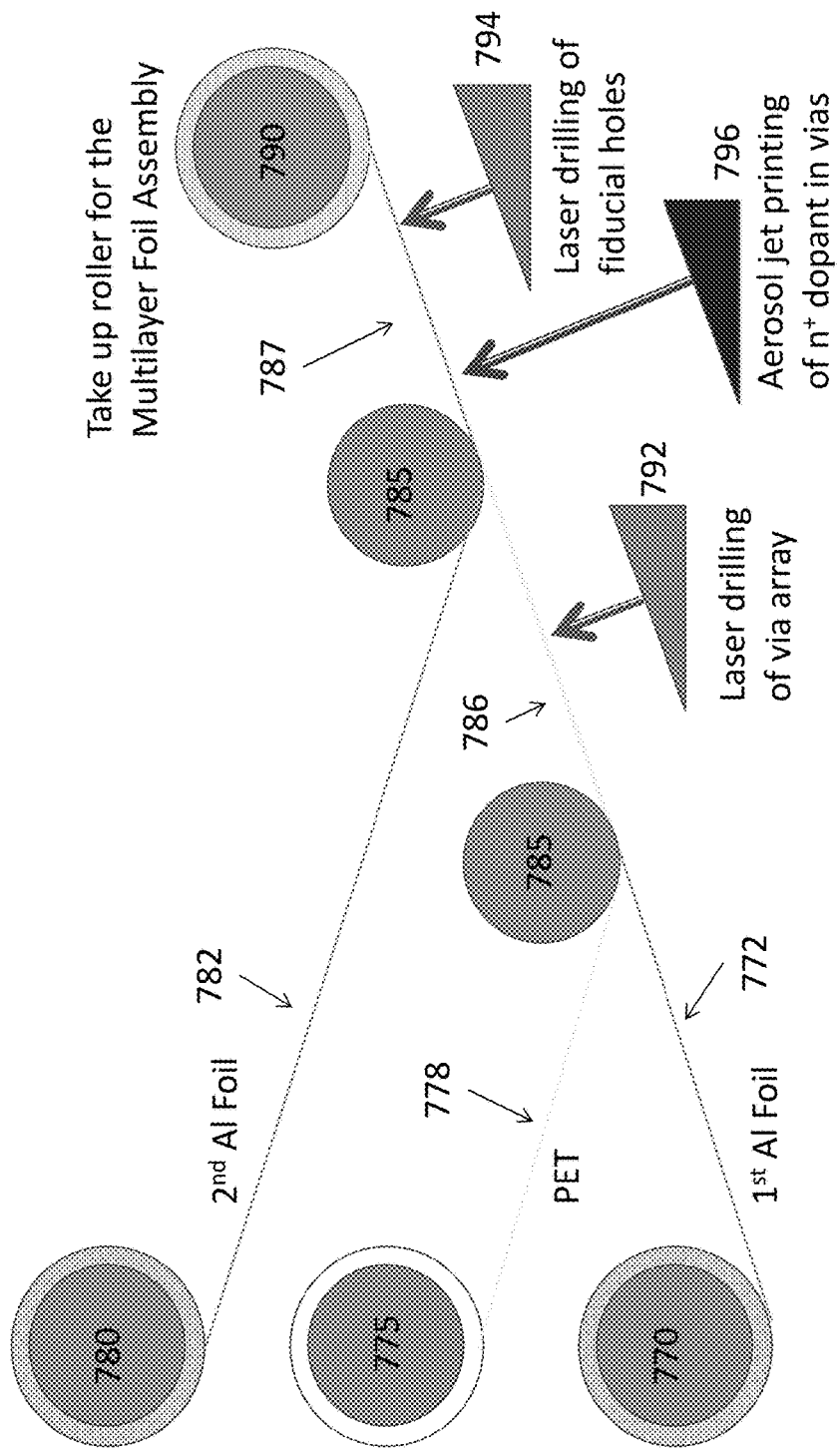
FIG. 20 is another illustrative embodiment of a roll-to-roll process for forming a multilayer foil assembly that include dopant deposition.

One embodiment of a solar cell with multilayer metallization yielding a back-contact, n-type Si HJ solar cell is shown in FIG. 19 including a multilayer foil assembly (760), and a process for producing the multilayer foil assembly (760) shown in FIG. 20. As a nonlimiting example, the following process may be used for a back-contact Si HJ solar cell on an n-type Si wafer.

Referring to FIG. 20, as before a first metal foil (772) is laminated to an insulating layer (778) (e.g., PET) and a laser is used to drill an array of vias. After laminating a $2^{nd}$ metal foil (782) to the perforated PET/metal foil, machine vision may direct a printer (e.g. with multiple print heads or nozzles) (796) to deposit an n+ dopant ink through the vias in the $1^{st}$ metal foil (772) and insulating layer (778) onto the exposed regions of the $2^{nd}$ metal foil. In another embodiments, the exposed regions of the $2^{nd}$ metal foil may be electroplated with an n+ dopant source (such as a nickel phosphorus alloy with 12 wt. % phosphorus). In this case, multilayer foil assembly (787) can be placed in an electrochemical-plating bath with the metal foils biased so that the n+ dopant is deposited only in the exposed regions of the $2^{nd}$ metal foil. A vision system is then used to direct a laser (794) to drill fiducial holes through the foil assembly, such as to aid alignment as discussed previously.

In yet another embodiment, the vias or openings in multilayer foil assembly (787) may be filled with a dopant source using a bath containing the dopant source in a liquid or fluid paste form. Subsequently, a squeegee may be utilized, such as in a roll-to-roll operation, to removes the excess dopant source material from the surface of the multilayer foil assembly (787) or from everywhere on the multilayer foil except the vias. The foil assembly could then pass through a heated stage where the volatile components in the dopant source in the vias are driven off. The dopant source may be selected to yield a doping characteristic opposite to the doping that would arise if the foil itself is the dopant, as discussed below.

Once the multilayer foil assembly (787) is complete, an section of the multilayer foil assembly section may be cut out and placed in contact with a Si HJ layer on a wafer (100, FIG. 19), and the vision system uses the fiducial holes to direct a laser to fire through the $2^{nd}$ Al foil (782) and n+ regions (620) in the vias to form the n+ base contacts (605) in the Si wafer.

In one particular nonlimiting embodiment, a laser drills vias through the PET-laminated $1^{st}$ Al foil, and after laminating to the $2^{nd}$ Al foil, a high-speed printer is used to deposit an n+ dopant source (such as a commercial phosphorus dopant ink) on the exposed Al of the $2^{nd}$ foil in the vias as shown in FIG. 20.

In this embodiment, an n+ dopant source (620) is deposited on the $2^{nd}$ Al foil (782) through the vias in the $1^{st}$ Al foil (772) and the insulating layer (e.g. PET, 778) as shown in FIG. 19. A laser pulse fired through both the $2^{nd}$ Al foil (782) and the n+ dopant source (620) will form an n+ region (605) in the silicon and will also deform and melt the Al foil into the n+ region forming an ohmic base contact.

Figure 21:
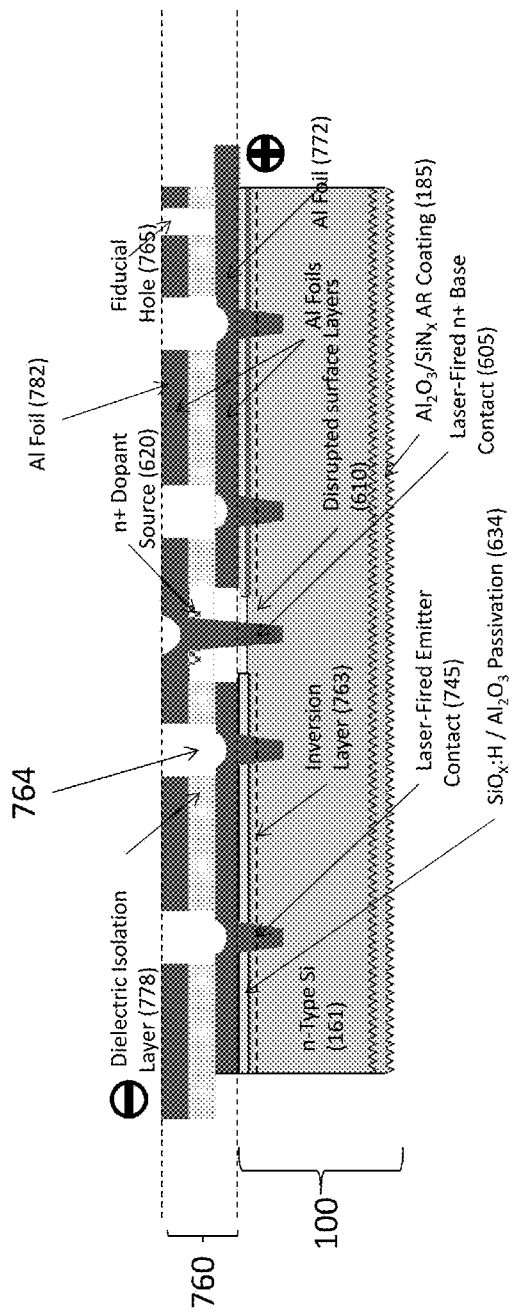
FIG. 21 is a cross-section view of an illustrative embodiment of a solar cell formed utilizing a roll-to-roll prepared multilayer foil assembly that includes laser fired $p^+$ and $n^+$ contacts.
Figure 22:
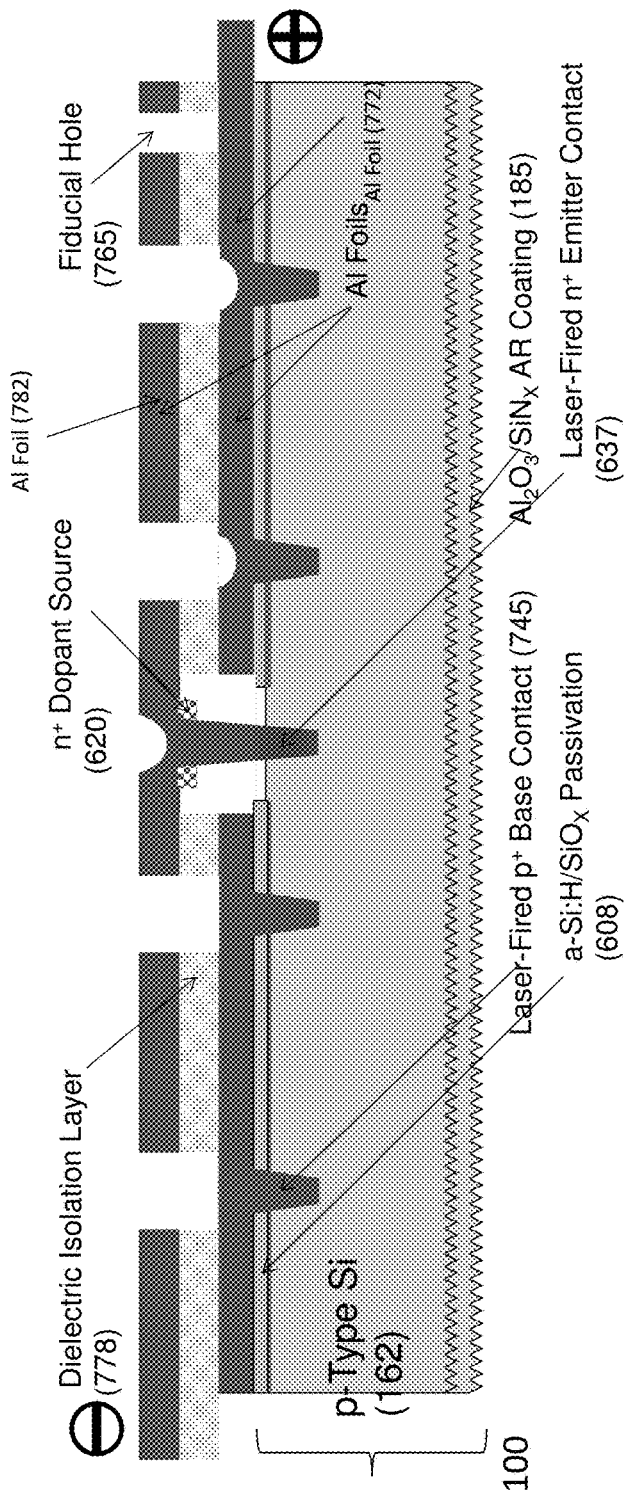
FIG. 22 is a cross-section view of another illustrative embodiment of a solar cell formed utilizing a roll-to-roll prepared multilayer foil assembly that includes laser fired $p^+$ and $n^+$ contacts.

One embodiment of a solar cell with multilayer metallization yielding a back-point-contact Si solar cell is shown in FIGS. 21 and 22, including a multilayer foil assembly (760), formed with the previously discussed process for producing the multilayer foil assembly (760) shown in FIG. 19. The following process may be used for a back-contact Al-foil solar cell where both p+ and n+ contacts are formed by laser firing/doping.

Figure 23:
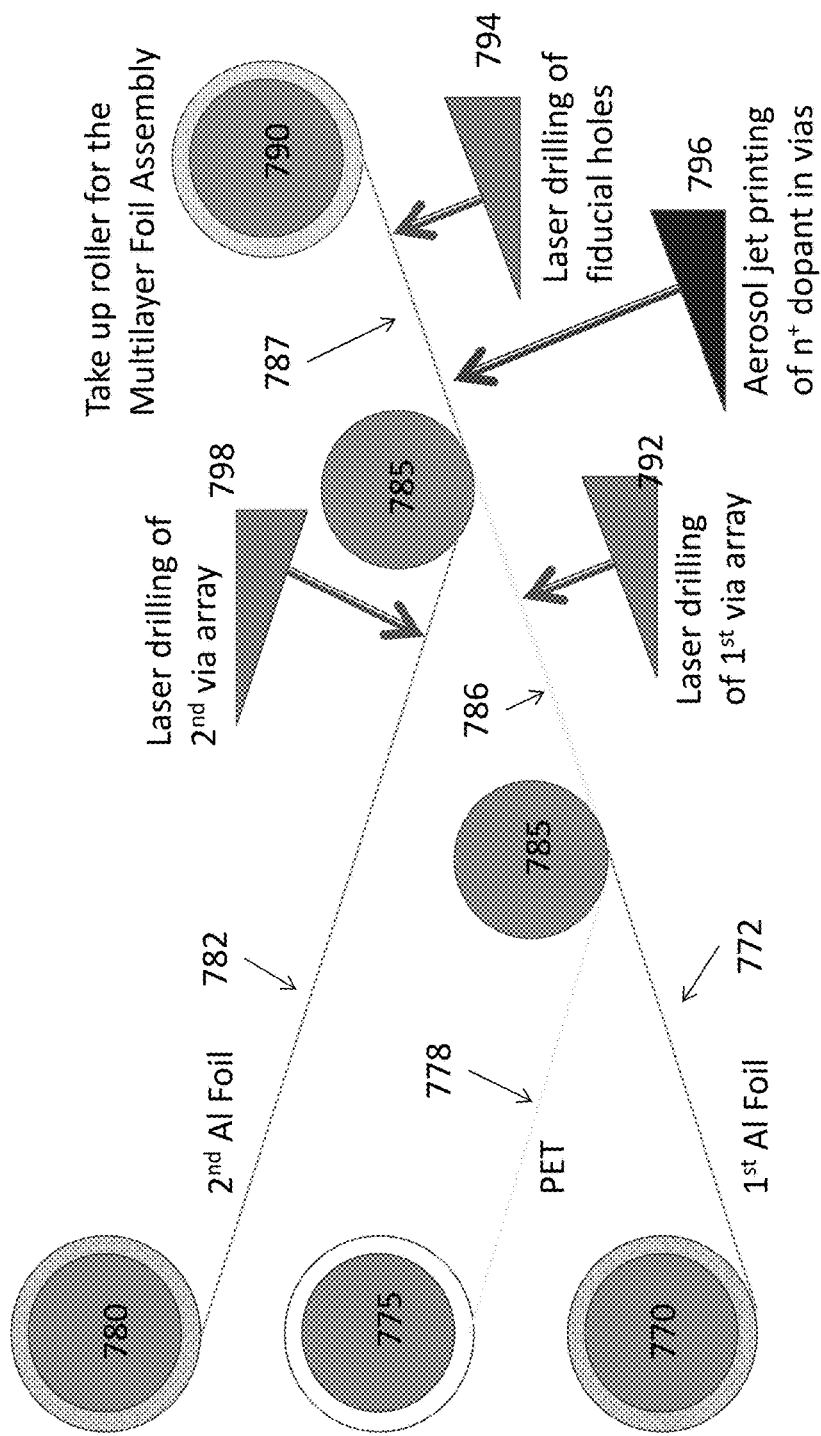
FIG. 23 is an illustrative embodiment of a roll-to-roll process for forming a multilayer foil assembly including a second array of vias and/or dopant deposition.

Referring to FIG. 23, as before, a $1^{st}$ metal foil (772) is laminated to an insulating layer (e.g., PET, 778) and a laser or patterning operation (792) is used to drill a $1^{st}$ array of vias. Another laser or patterning operation (798) drills a $2^{nd}$ array of vias in a second metal foil (782), and the foils are registered so that the $2^{nd}$ arrays of vias are in the proper location after lamination.

A machine vision system may direct a printer (796) to deposit an n+ dopant ink (620) through the vias in the $1^{st}$ metal foil/PET (772/778) onto the exposed regions of the $2^{nd}$ metal foil (782). A vision system is then used to direct a laser (794) to drill fiducial holes (765) through the foil assembly.

Referring to FIG. 21, a multilayer foil assembly (760) section is cut out and placed in contact with a passivated rear surface of a Si wafer, and a vision system directs a laser to fire the $2^{nd}$ Al foil (782) and the n+ dopant source (620) through the $1^{st}$ array of vias to form the n+ base contacts (605) in the Si wafer. Another laser is directed to fire through the $2^{nd}$ array of vias in the $2^{nd}$ Al foil (782) ablating the PET (778) and firing the $1^{st}$ Al foil (772) into the Si wafer to form p+ contacts (745).

As before and as shown in FIG. 23, a laser drills a $1^{st}$ array of vias in the $1^{st}$ Al foil/PET laminate (772/778). Another laser drills a $2^{nd}$ array of vias in the $2^{nd}$ Al foil (782) for subsequent formation of the p+ contacts (745). The foils are registered to each other to assure proper placement of the via arrays. An n+ dopant source (620) is deposited through the $1^{st}$ array of vias onto the $2^{nd}$ Al foil (782).

In this embodiment, an multilayer foil assembly (760) is placed on the rear surface of an n-type Si wafer (161) passivated, for example, by $SiO_x$:H/$Al_2O_3$ layers (634) as shown in FIG. 21.

A laser forms the p+ emitter contacts (745) through the $2^{nd}$ array of vias by optionally ablating the dielectric (e.g., PET) (778) and firing the $1^{st}$ Al foil (772) into the n-type wafer (161). In some embodiments, the dielectric (778) is minimally affected by the laser pulse and partially or completely remains in opening (764) after contacts (745) are made (See e.g. FIG. 16). Another laser forms the n+ base contacts (605) by firing the $2^{nd}$ Al foil (782), and the depositing n+ dopant source (620) through the $1^{st}$ array of vias. This embodiment shows an inversion layer (763) induced by the $Al_2O_3$, but it could be created by a diffused layer, a tunnel oxide or a heterojunction.

In one embodiment, referring to FIG. 22, a back-point-contact Al-foil solar cell (p-type Si) is shown. In this embodiment, an multilayer foil assembly similar to the above (760, FIG. 19) is placed on the rear surface of a p-type Si wafer (162) passivated by a layer structure such as a-Si:H/SiOx (608), which has a low density of fixed charges so there is no significant band bending in the Si (or no inversion or accumulation layers). A laser forms the p+ base contacts (745) through the $2^{nd}$ array of vias by ablating the PET (778) and firing the $1^{st}$ Al foil (772) into the p-type wafer (162). Another laser forms the n+ emitter contacts (637) by firing the $2^{nd}$ Al foil (782) and the deposited n+ dopant source (620) through the $1^{st}$ array of vias.

Figure 24:
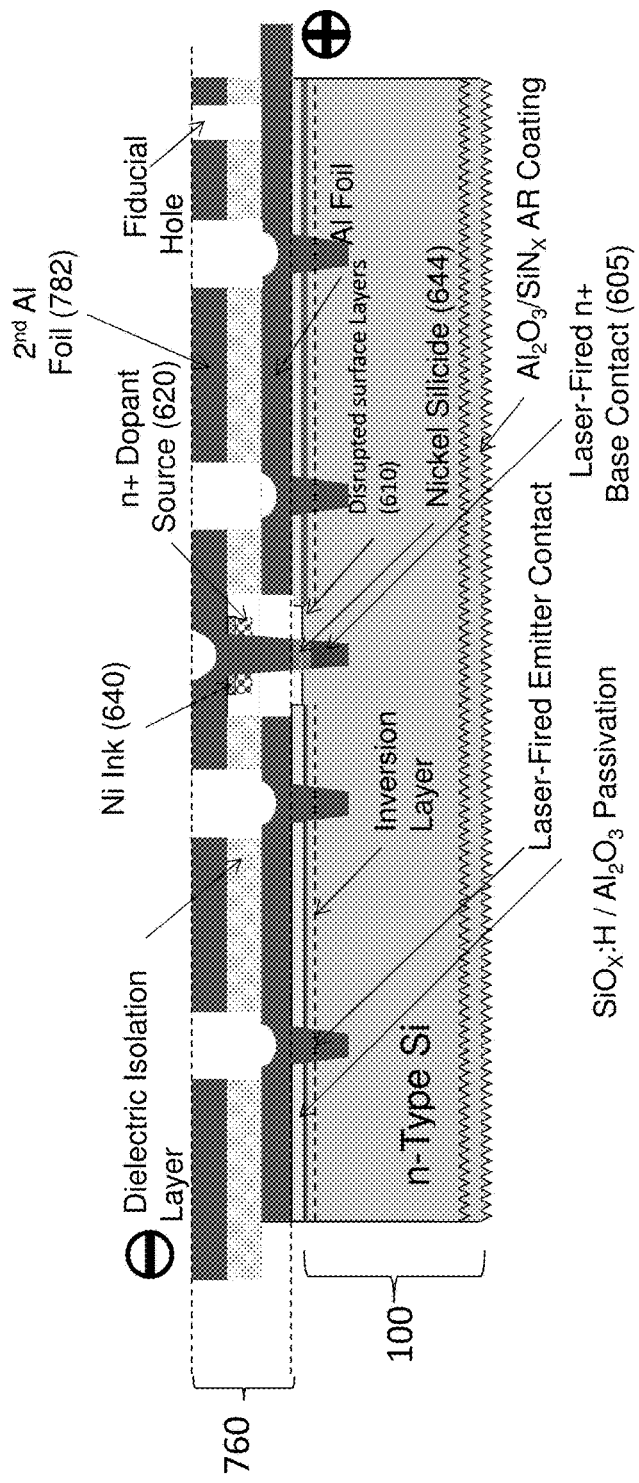
FIG. 24 is a cross-section view of an illustrative embodiment of a solar cell with nickel silicide formed utilizing a roll-to-roll prepared multilayer foil assembly.
Figure 25:
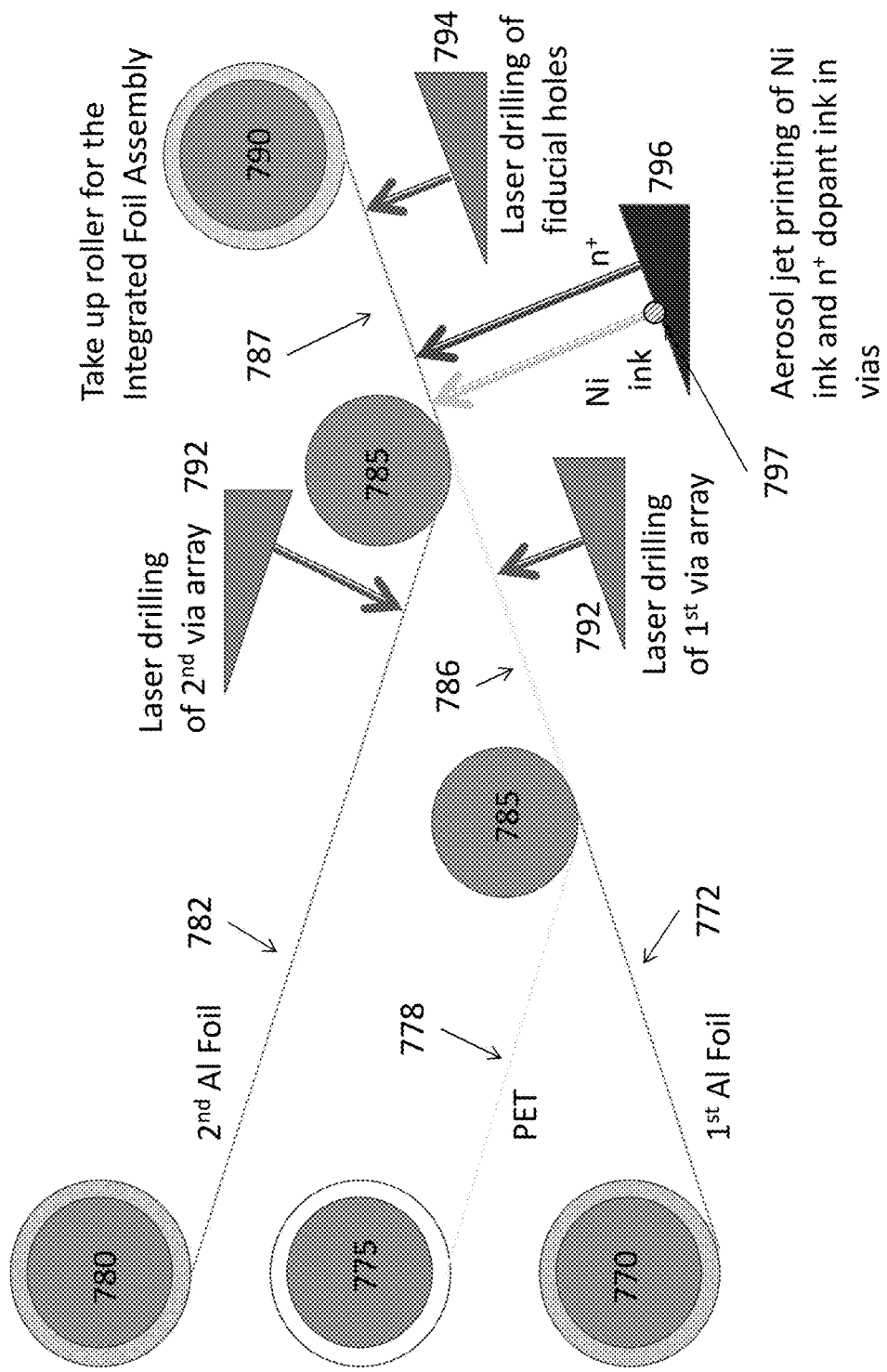
FIG. 25 is an illustrative embodiment of a roll-to-roll process for forming a multilayer foil assembly with a second array of vias and/or deposition of a metal contacting layer and dopant.

One embodiment of a solar cell with multilayer metallization yielding a back-point-contact Si solar cell with the formation of a nickel silicide contacting layer (644) is shown in FIG. 24, including a multilayer foil assembly (760), and a process for producing the multilayer foil assembly (760) is shown in FIG. 25. This embodiment includes using an ink containing a material useful to reduce contact resistance, such as small nickel particles (≤1 µm in size) to form a nickel silicide (e.g. NiSi) at the base point contact. In structures where both p+ and n+ contacts are made by laser firing through the $1^{st}$ and $2^{nd}$ Al foils (e.g. see FIGS. 21, 22 and 24), the laser firing process may adequately bond the multilayer foil assembly (760) to the substrate (100) so that a bonding layer (820) (e.g. such as shown in FIG. 19) is not required.

Any substance capable of producing low specific contact resistance contacts to silicon or other semiconductors may be utilized. Various metals may be incorporated at or near the silicon surface to produce low contact resistance. These metals may include nickel, palladium, titanium, platinum, molybdenum, tungsten, or the like. The metals may be supplied as deposited coatings on the silicon substrate or on a foil assembly that is being applied to the substrate. The substance may be supplied as an ink containing the metal, either in the form of a chemical precursor to the metal, particles of the metal, or particles of a compound containing the metal. Particularly useful particles include silicon compounds of the metal, such as silicides.

The process shown in FIG. 25 is similar to FIG. 23. As such, discussion of the common steps is not repeated for the sake of brevity. In this process for FIG. 25, a Ni ink, for example, is deposited (797) on the exposed regions of the $2^{nd}$ Al foil in the $1^{st}$ array of vias, and then n+ dopant source is deposited (796) in the same vias. The Ni ink may be deposited in the $1^{st}$ array of vias before depositing the n+ dopant source in those vias.

Since dopants such as phosphorus appear to diffuse more rapidly in molten silicon than nickel, other embodiments might use an ink containing a mixture of a phosphorus dopant source and Ni particles (e.g. on the order of a micron or less in size) in combination with laser conditions that promote the formation of a nickel silicide layer on top of an n+ region in the n-type Si wafer, as well as a low resistance contact (605) of the Al from the $2^{nd}$ Al foil to the nickel silicide layer. If one uses an ink containing both the dopant source and the Ni particles, then only one deposition step is required. In other embodiments, an ink containing small particles of a nickel phosphorus alloy may be utilized. The phosphorous content may be equal to or less than 50%, or equal to or less than 20%.

Referring to FIG. 24, a multilayer foil assembly (760) made by the process shown in FIG. 25, where both a Ni ink (640) and a n+ dopant source (620) are deposited on the exposed $2^{nd}$ Al foil (782) in the $1^{st}$ array of vias, is applied to a substrate 100.

In this embodiment, the laser forming the base contacts (605) fires the $2^{nd}$ Al foil (782), the Ni ink (640) and the n+ dopant source (620) through the $1^{st}$ array of vias into the n-type Si wafer. The laser conditions are chosen so that a nickel silicide layer (644) forms on top of the n+ region in the Si and is contacted by Al from the $2^{nd}$ Al foil (782).

Emitter forming layers on the rear of the substrate, such as heterojunction layers (235), passivation layers or other layers, may create induced emitters (induced inversion layers) on the substrate that have moderate to high conductivity. Referring to FIG. 19 as a non-limiting example of the general phenomenon, if heterojunction layers (235) make partial contact with base doped region (605), the cell may develop a short circuit or shunt in which useful current is wasted by this undesirable conduction. Therefore, it may be desirable to employ methods that disrupt these layers in the vicinity of the base contacts (for example, 610 in FIGS. 13, 17, 19, 21, and 22). This may be accomplished by selecting a laser doping pulse with sufficient length, energy, and/or intensity to create a high temperature region around each n+ doped region that locally disrupts the surface layers. The disruption may include partial or complete removal of surface layers, such as the heterojunction layers (235), thereby leaving a gap or disconnect between the heterojunction layers and base doped region (605) that prevents short circuiting or shunting. Alternatively, the disruption may include sufficient heating or light exposure to change the electrical properties of the surface layers.

The dopant source may be applied as a coated dopant material to a metal foil. The coated dopant source may be a uniform or patterned coating applied on the side of the metal foil facing the substrate. In some embodiments, the metal foil may contain atom(s) that itself causes doping. As a nonlimiting example, the metal foil may contain aluminum, which can create p-type doping in silicon. The coated dopant source may contain atom(s) which produces a dopant polarity opposite to the polarity of the dopant atom in the metal foil. As a nonlimiting example, an aluminum metal foil may be coated with a phosphorous doping source. In such cases, it has been unexpectedly found that while the foil contains a large quantity of the p-type dopant (e.g. aluminum), the resulting contact, which achieved when laser firing through the aluminum foil with the doping source, is n-type (e.g. phosphorous). Not wishing to be bound by theory, it is postulated that during laser firing, melted silicon is produced in the region of the laser fire, and that the phosphorous n-type dopant has a higher diffusion coefficient than the aluminum p-type dopant.

The dopant source may be any material containing the desired dopant. Nonlimiting examples of dopant sources may include phosphosilicate glasses, aluminum phosphates, phosphoric acid and phosphoric acid derivatives, organophosphorus compounds, and inert organic or inorganic matrices containing phosphorous compounds.

Figure 34:
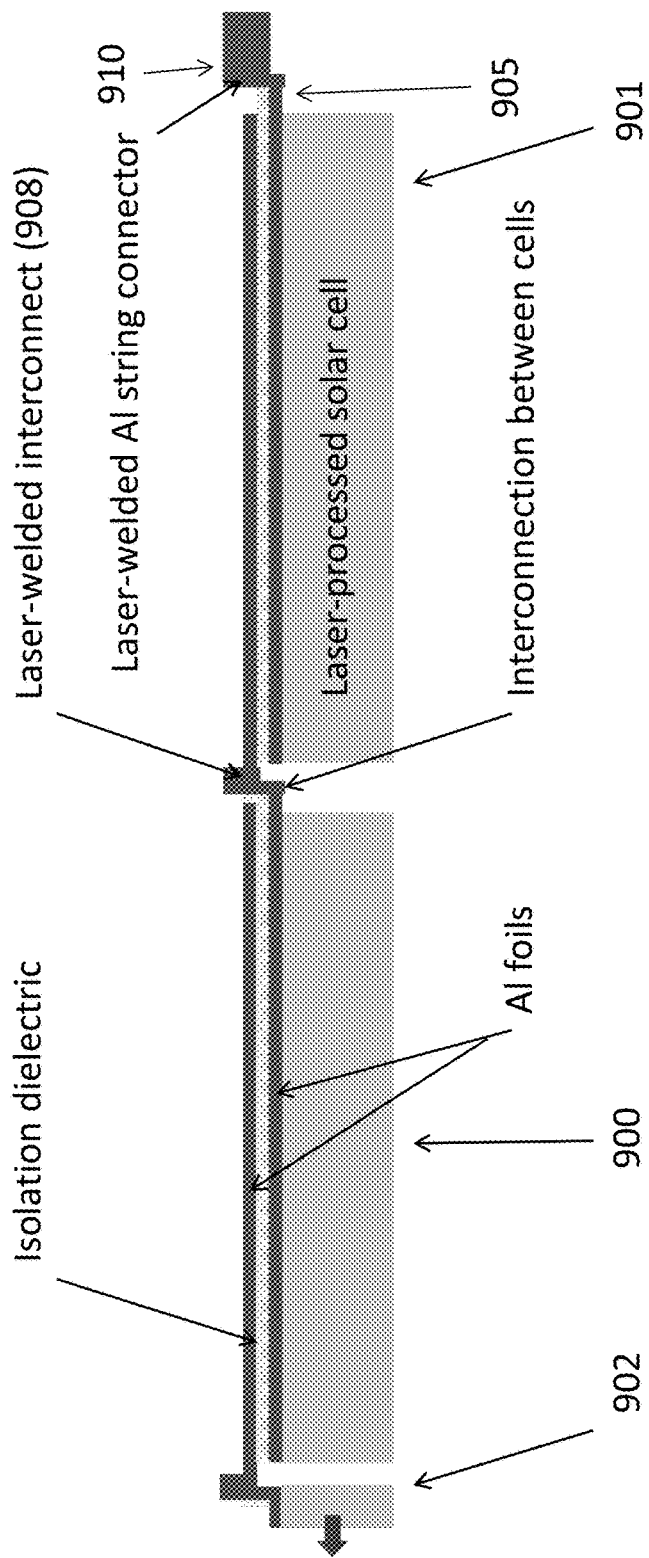
FIG. 34 is a view of an illustrative embodiment of solar cells connected in series.

Incorporation into Modules:

FIG. 34 shows an illustrative embodiment of a solar cell system or solar cells (900, 901, 902) (e.g. Al-foil cell) connected together in series at interconnection (908) (e.g. by laser welding) to form one string in a photovoltaic (PV) module. In one embodiment, the connection from one cell to another is a direct connection, meaning a metal foil layer from one cell is electrically connected to a metal foil layer of another cell without intervening wires or other conductive means. In some embodiments, a first metal foil of a first solar cell (900), which is also electrically coupled to the first doping region of the first solar cell, is directly connected to a second metal foil of a second solar cell (901), which is also electrically coupled to second doping regions of the second solar cell. Further, a second metal foil of the first solar cell (900), which is also electrically coupled to second doping regions of the first solar cell, is further connected to a first metal foil of a third solar cell (902), which is also electrically coupled to first doping regions of the third solar cell. In this manner, the cells are connected in series to produce a string of cells. Further, this mechanism of connecting the cells in series allows the cells to be arranged side to side. The positive and negative ends of each string are laser welded to a wire, bar, or sting connector 910 (e.g. Al wire/bar/connector) that electrically connects the strings together. The string connectors 910 run to a junction box where they connect to the external wiring of the PV system. In some embodiments, the Al foils can be welded in series to form a string in a PV module by using ultrasonic welding, micro TIG (tungsten inert gas) welding or soldering using a solder such as tin-zinc alloy (e.g. 91% Sn, 9% Zn).

General Description of Laser Processing:

Laser doping, such as for forming base contacts or the like, may be performed by processes including laser firing, laser doping, laser transfer doping, and/or gas immersion laser doping (GILD). The various laser processing techniques discussed below can be utilized for any of the embodiments discussed herein.

In some embodiments of a laser doping or laser firing process, a dopant source may be applied to the silicon substrate and/or driven into the silicon during the laser pulse while in the laser firing process. In some embodiments of the laser doping or laser firing process, a metal dopant, metal layer, or metal dopant on a metal layer may be applied to the substrate and/or driven into the substrate during a laser pulse. In some embodiments, the dopant layer may be applied by physical vapor deposition techniques, including evaporation and sputtering. In some embodiments, the dopant layer may be applied by chemical vapor deposition techniques. In some embodiments, the dopant layer may also be applied by liquid deposition techniques, including screen printing, squeegee application of a liquid or fluid paste, spin coating, bead coating, electroplating, or inkjet printing. The liquid dopant can be supplied at a solution or dispersion or slurry.

In some embodiments of the laser transfer doping process, the dopant is supplied from an additional donor substrate. This approach utilizes a rapid interaction between a laser and a non-transparent thin source film deposited on a transparent plate or donor substrate (e.g. glass or quartz), which is placed in close proximity (e.g. about several microns or less) to a substrate. The dopant source may be applied to the donor substrate by any of the approached mentioned above. The donor substrate may also include thin flexible glass and/or polymer films and other materials transparent to the laser radiation.

The donor or transfer substrate of the laser transfer system can be coated with multiple layers depending on the application. As a nonlimiting example, the laser transfer substrate may be first coated with a thin easily evaporated material (e.g. a-Si:H) to act as a release layer for a refractory material (e.g. Mo) or a transparent material (e.g. $SiO_2$) deposited on the a-Si:H. Another example involves first depositing a layer of Ni on the laser transfer substrate followed by a layer of Sb so that the laser will transfer Sb for $n^+$ doping and Ni for a low-resistance nickel silicide contact.

The laser transfer system can utilize multiple pulses in addition to temporally shaped pulses. As a nonlimiting example, the first pulse could comprise a first section of relatively high energy density (e.g. ~1 $j/cm^2$ or greater) over 10 ns, and then a slowly decreasing section where the energy density decreases from equal to or between approximately 0.7 to 0.1 $J/cm^2$ over 400 ns. A second pulse to the same location might then be applied approximately 10 µs later (100 kHz repetition rate) with an energy density ramping up to ~0.3 $J/cm^2$ over 10 ns, and then slowly decreasing to 0.05 $J/cm^2$ over 500 ns to further anneal the treated region. The wavelength of the laser beam can be in the IR (e.g. 1064 nm) for most applications, but a laser beam operating in the green (532 nm) can also be used and will more effectively heat just the top few µm of an exposed Si surface. The IR beam will initially heat the Si wafer to a depth of a few hundred µm, but as the laser rapidly heats up the Si locally, the absorption coefficient in the IR increases rapidly and the heating becomes localized near the surface region.

In some embodiments, a Gas Immersion Laser Doping (GILD) process may be utilized, where the dopant is supplied in vapor form to a chamber above the substrate such that the dopant vapor is in gaseous communication with the substrate. The gaseous dopant or a byproduct is incorporated into the substrate during the laser pulse. Gaseous source(s) can be any material containing a dopant atom with sufficient volatility, including, but not limited to, $POCl_3$, $PCl_3$, $PH_3$, $BH_3$, $B_2H_6$, arsine, and trimethylaluminum.

The laser process may utilize spatially and temporally shaped laser beams. In some embodiments, the systems or methods discussed herein may have the following elements: (1) supply of dopants by a laser process; (2) dopants supplied by the laser process to avoid heating of the wafers to perform dopant diffusion; and/or (3) a back contact (IBC) cell. The use of line beams is a particularly attractive way to make an IBC cell since the electrodes of the IBC are thin lines, and thus can be patterned with single or reduced number of laser pulse exposures. In some embodiments, the combination of (1)-(3) above may be utilized with line and/or temporal shaping. In some embodiments, the laser beam can be spatially shaped into a narrow line-shaped laser beam or into an array of very small diameter Gaussian laser beams (e.g. <20 μm or <10 μm). Line-shaped laser beams with widths <10 μm exhibit little laser-induced damage, while suitable circular Gaussian laser beams (e.g. with diameters of ~30-130 μm) exhibit microcracks and dislocations. Small diameter (<20 μm or <10 μm) Gaussian laser beams are also less likely to exhibit extended defects, such as microcracks and dislocations due to the fact that only a very small region of Si is melted and recrystallized.

The temporal pulse shape can be selected for the purposes of laser transfer of material, laser ablation or disruption of dielectric passivation layers, laser melting of selected localized regions of the Si wafer, laser doping of the melted Si regions with the appropriate dopant atoms, laser-induced formation of metal silicides for low-resistance contacts, laser firing of contacting metals through the dielectric passivation layers and/or laser annealing of the localized treated regions on the Si wafer. Generally, laser transfer of material requires relatively short pulses (e.g. few ns to few tens of ns), while laser annealing requires relatively long pulses (e.g. 0.1 μs to several milliseconds). The pulse duration for laser doping will depend on the dopant depth desired and can vary from tens of ns to hundreds of ns. In some embodiments, the dopant penetration depths are equal to or between 0.02 μm to 1 μm, or equal to or between 0.1 μm to 0.5 μm. As a nonlimiting example, a laser process which combines laser transfer, disruption of the dielectric passivation, melting, doping and annealing of the Si in a localized region might employ a line-shaped beam (e.g. 8 μm wide and 1 cm long) with the following temporally shaping: the pulse starts with an energy density of ~1 $J/cm^2$ over several ns to transfer the dopant material (e.g. Al) to the substrate (e.g. Si surface) and disrupt the dielectric passivation, if present (e.g. 5 nm of ALD $Al_2O_3$/90 nm of PECVD $SiO_x$ on the rear surface); the energy density then falls to ~0.5 $J/cm^2$ over ~50 ns to locally melt the substrate surface and diffuse in the dopant; and then the pulse energy density decreases from 0.5 to 0.1 $J/cm^2$ over ~400 ns to anneal the localized region of substrate surface.

As nonlimiting examples, dopant materials may be any suitable n- or p-type material, Al, Sb, Group III or V element, or the like. In the laser transfer process, the dopant atom is introduced on a donor substrate containing or coated with a dopant material including the donor atom. In a laser firing or doping process, the similar dopant is included as a metal or dopant material, respectively, on the substrate to be fired. The dopant material may be a pure form of the dopant, such as but not limited to coatings of the group III or group V atoms. Alternatively, the dopant material may be a compound containing the dopant, such as but not limited to an oxide, nitride, or chalcogenide of the donor. The dopant material may also be composed of an alloy or a host material containing the dopant, such as hydrogenated amorphous silicon heavily doped with the dopant. Concentration of the dopant in the host material may be equal to or greater than 0.5%, or equal to or greater than 2%.

General Bonding and Conductive Bonding:

The various bonding techniques discussed below can be utilized for any of the embodiments discussed herein. An example of general bonding, bonding layer(s) (e.g. 820,835 in FIG. 9) serves to bond two discrete layers together to achieve a mechanical connection.

The bonding layer may include an adhesive, such as a pressure sensitive adhesive. Nonlimiting examples of pressure sensitive adhesives may include acrylics, rubbers, ethylene-vinyl acetates, nitriles, silicones, or styrene block copolymers. The adhesive layer can be applied at various stages of production, including during the formation of the foil film or during the solar cell fabrication process. Surfaces on which the pressure sensitive adhesive exist or attach to may be treated to promote adhesion. Nonlimiting examples of such treatments may include cleaning, solvent cleaning, chemical treatment, ozone treatment, corona discharge, and/or plasma treatments.

In some embodiments, the bonding layer may be or may include a curing adhesive that acts to bond the surfaces. A curing adhesive is an adhesive that has low tack or is liquid in its native state, but is then in modified to produce adhesive behavior before, during, or after the substrates to be bonded are attached. The curing adhesive can be cured by any suitable technique including exposure to heat, moisture, activating compounds, and/or light. Nonlimiting examples of curing adhesives include acrylics, polyesters, urethanes, polyol-urethanes, epoxies, polyimides, and cyanoacrylates.

In some embodiments, the bonding layer may be or may include adhesive polymers in which bonding is achieved by exposing the joined surfaces to temperatures sufficient to allow the polymer to flow or melt. Nonlimiting examples of such polymers include polyvinyl alcohols, polyvinylbutyrals and ethylene-vinyl acetates. In some embodiments, the bonding layer may be or may include laminating adhesives, including, but not limited to, polyurethanes.

The bonding layer may be applied by any suitable process. Nonlimiting examples of such application processes include bead coating, spray coating, aerosol vapor coating, and extrusion. In some embodiments, the bonding layer may be applied in a patterned fashion so as to be only present in certain locations. Nonlimiting examples of patterning application methods include inkjet printing, gravure printing, and screen printing.

The bonding layer can have any thickness suitable to achieve useful adhesion. As a nonlimiting example, the bonding layer thickness may be in the range of equal to or between 1 to 50 microns, or equal to or between 3 to 30 microns. The bonding action may be aided by mechanical pressure applied to form the bond. Nonlimiting examples of suitable mechanical pressure may include pressure applied by rollers, uniform pressure applied by a plate or mold, and air pressure.

Conductive bonding is a variation of bonding in which, in addition to a mechanical bond, the surfaces being joined together achieve suitable electrical contact. In some embodiments, electrical contact may include a specific resistance between layers of equal to or less than 1 ohm-$cm^2$, or equal to or less than 0.2 ohm-$cm^2$.

In some embodiments, conductive bonding layers may exist on one or both of the surfaces to be placed in contact for bonding. As a nonlimiting example, in FIG. 12, a bonding layer (820) may be present on metal layer (772) and another bonding layer may be present on layer (240). The conductive bonding layer may comprise any of the material described for general bonding with the incorporation of a conductive material. Nonlimiting example of suitable conductive materials may include metal particles, carbon particles, and/or semiconductor particles. In some embodiments, conductive particles may be equal to or less than 30 microns in effective circular diameter, or equal to or less than 10 microns in effective circular diameter. In some embodiments, the bonding layer (820) may comprise metal particles in an adhesive matrix, where the metal particles include silver, copper, nickel, or the like. In yet another embodiment, the bonding layer (820) may comprise graphite particles in an adhesive matrix.

The conductive bonding layer may include a metal or alloy that produces electrical contact through methods including heating and/or pressure. Nonlimiting examples of suitably metals or alloys may include indium, solders, and/or tin. Metals include metals or alloys that melt at equal to or less than 350 C, or equal to or less than 300 C. Tin-zinc alloys may be used to solder aluminum to aluminum or copper at relatively low temperatures (e.g. equal to or between 200° C. to 260° C.). In some embodiments, surface treatment agents such as flux may be used to improve metal adhesion and wetting.

Figure 32:
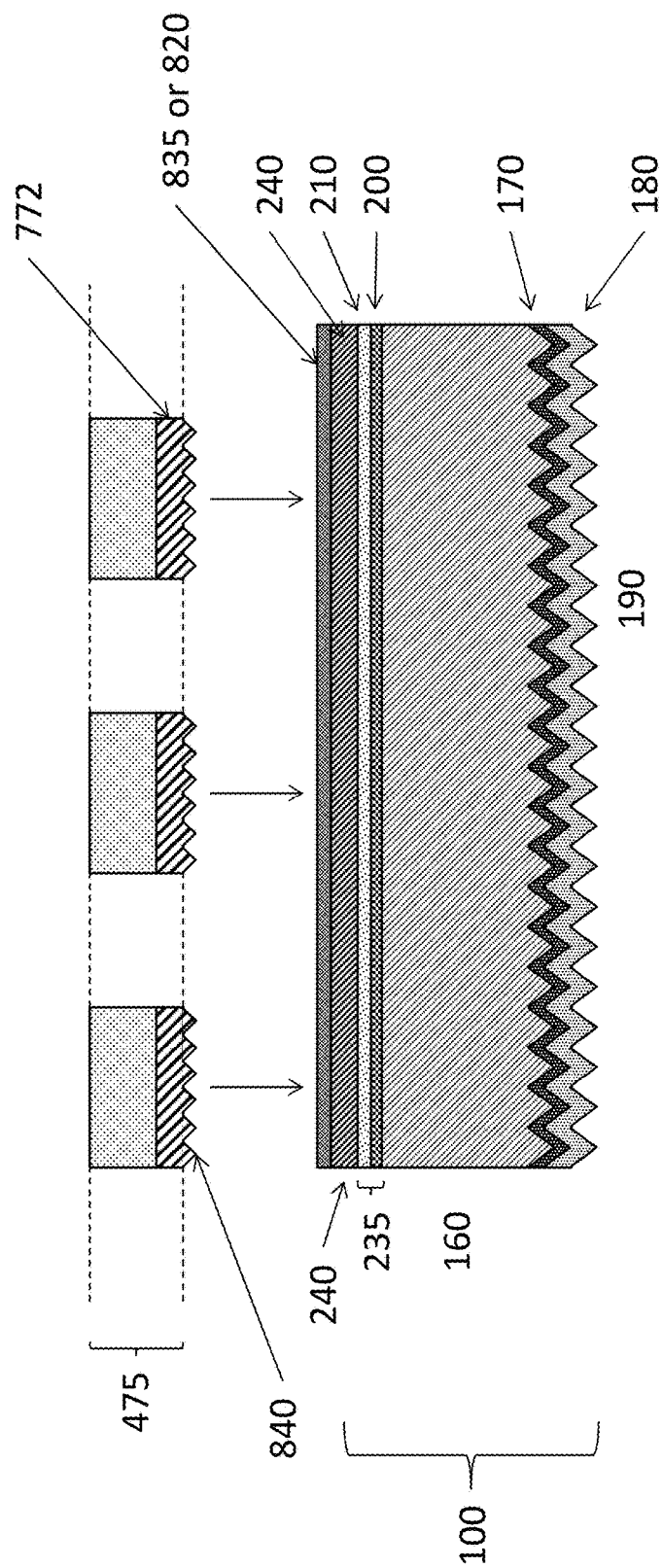
FIG. 32 is a cross-section view of an illustrative embodiment of a pre-assembly solar cell with a multilayer foil assembly providing foil texturing.
Figure 33:
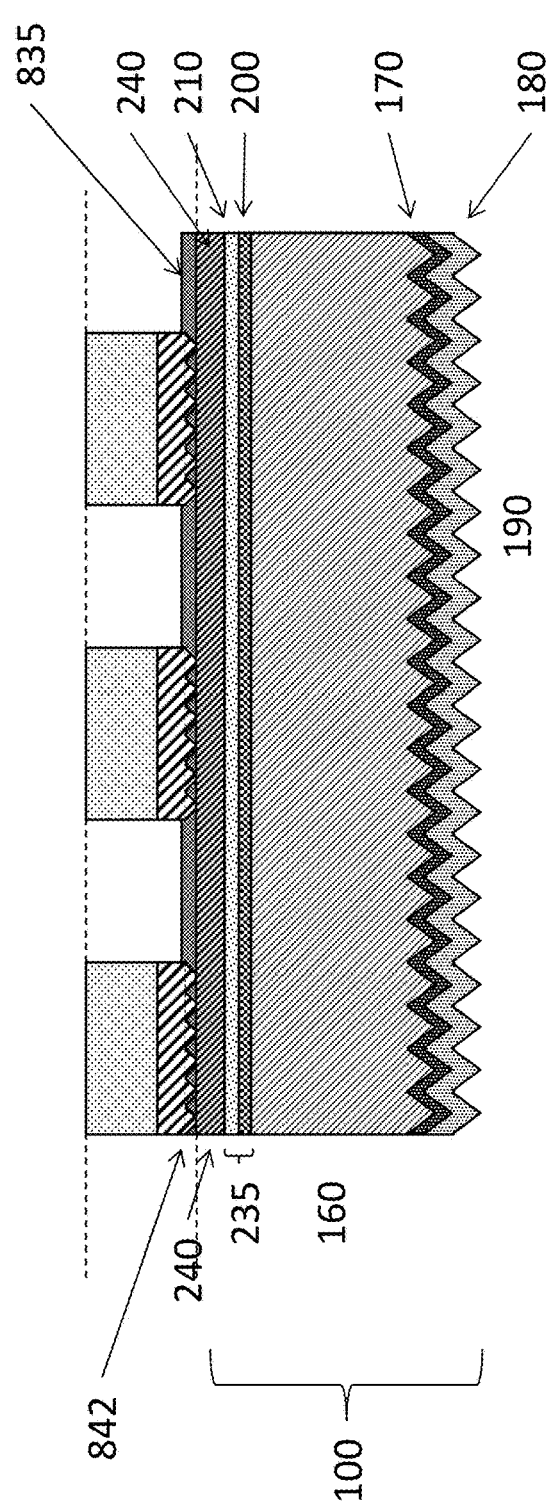
FIG. 33 is a cross-section view of an illustrative embodiment of a solar cell with a multilayer foil assembly with foil texturing after assembly.

Referring to FIG. 32, a surface of a metal foil (772) may provide a texture (840) that allows for improved electrical connection using a bonding layer (835). Referring to FIG. 33, when metal foil assembly (475) is brought in contact with substrate (100), texture (840) (shown in FIG. 32) may allow penetration (842) of the metal through the bonding layer (835) to produce good contact to the rear conductive structure (240). In some embodiments, the metal foil texture (840) may include textures formed by chemical etching and mechanical abrasion. In some embodiments, the texture (840) may be formed by an embossing process. In some embodiments, the substrate surface at layer (240) may be textured and may be joined with a metal foil (772) with or without a texture. In some embodiments, this texturing may be achieved by depositing a conductive material on the substrate or the foil to form protrusions on the surface. The features of the texture may be equal to or less than 0.5 mm in diameter and/or height, or equal to or less than 0.1 mm in diameter and/or height.

Bonding or conductive bonding layers may be coated uniformly on the surfaces of a metal foil or metal foil assembly. Alternatively, bonding layers may be patterned for reasons including minimizing the usage of the bonding material or preventing unnecessary shunting or electrical conduction.

Supplementary Insulation Layer:

In some embodiments, a supplementary insulating layer can be thinner than the dielectric insulator layer (e.g. 350, FIG. 6). In some embodiments, the supplementary or secondary insulating layer can be equal to or between 1 micron to 20 microns thick, or equal to or between 2 microns to 30 microns thick. In some embodiments, the secondary insulating layer may include epoxies, acrylics, polyesters, polyvinyl butyrals, and/or polyvinyl alcohols. In some embodiments, the secondary insulating layer may be coated with a suitable solvent, including water, cyclohexanone, propylene glycol monomethyl ether, acetone, methyl isobutyl ketone, and methyl ethyl ketone. In some embodiments, the secondary insulating layer may contain a colorant, dye, or pigment that absorbs at the wavelength of the laser that will be used for doping, which allows the secondary insulation layer to be more easily heated and ablated for proper doping and contact. Nonlimiting examples of suitable dyes include dyes absorbing at wavelengths equal to or between approximately 1064 nm to 355 nm, which includes wavelengths for infrared, green, and UV lasers. Nonlimiting examples of pigments include carbon black. In some embodiments, carbon black may be present as particles equal to or less than 5 microns in size, or equal to or less than 1 micron in size. The carbon concentration can be maintained at a value lower than the percolation threshold so that the secondary insulation layer has high resistance. In some embodiments, the carbon black concentration may be equal to or less than 10%, or equal to or less than 3% by weight relative to the binder polymer.

Foil Patterning:

Referring to FIG. 9 as a nonlimiting example, a metal foil assembly may be patterned by any suitable method. In some embodiments, the metal foil assembly may be patterned in a roll-to-roll process, or as sheet stock in a batch process. The patterning process may include laser ablation or laser cutting, mechanical patterning such as perforation, dry phase patterning and/or chemical processes such as etching. The laser processing may include using a laser with a short pulse, such as a laser with a pulse length equal to or less than 100 ns, or equal to or less than 1 ns. Dry phase patterning may use a groove pattern on a wheel or plate to press a relief pattern on a material that may include multiple layers. A milling wheel then mechanically removes portions of the protruding pattern. This method can independently pattern a subset of the layers from an existing multilayer foil assembly.

Figure 26:
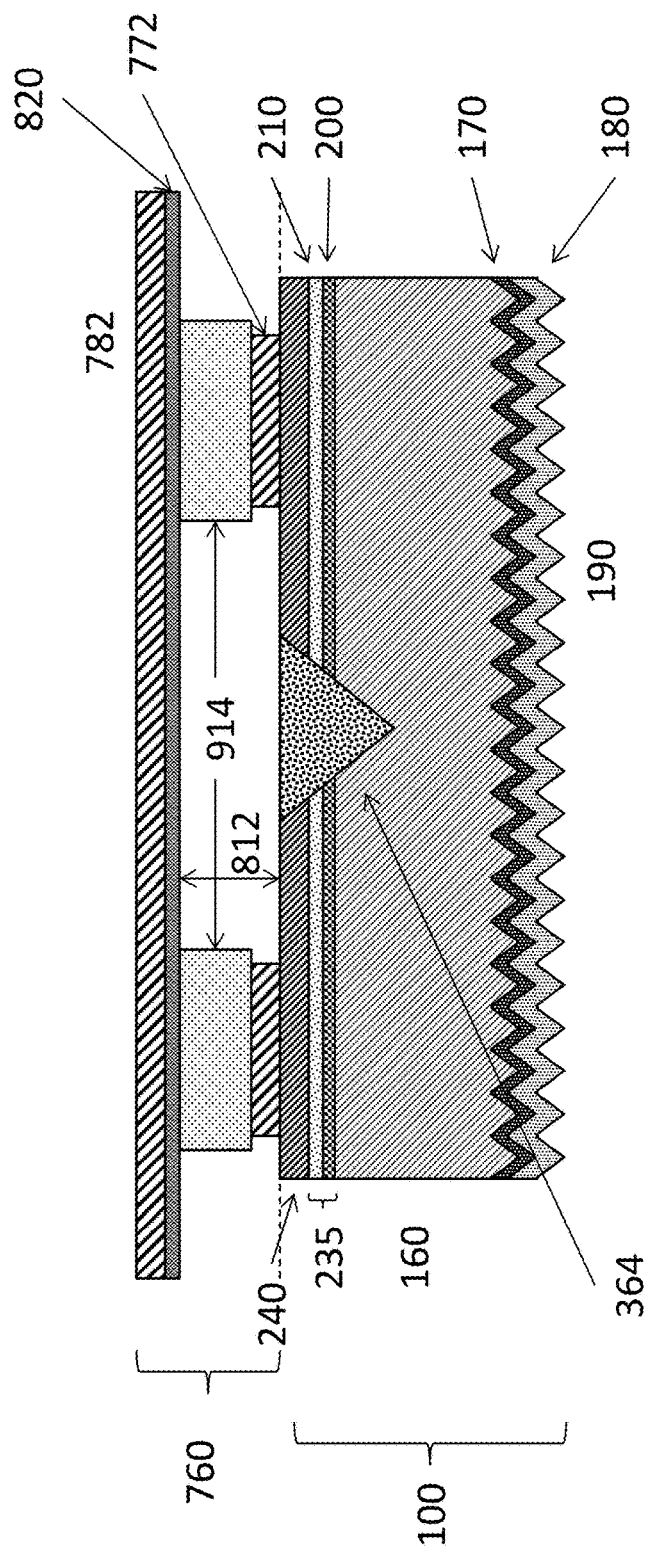
FIG. 26 is a cross-section view of an illustrative embodiment of a solar cell with a multilayer foil assembly prior to contact formation.

Foil Application Processes:

Referring to a nonlimiting example in FIG. 26, a general multilayer foil structure (e.g. 760) may be applied to a surface of substrate (e.g. 100). The multilayer foil structure may be created by any of the methods discussed herein, including application of one or more multilayer foil assemblies and/or application of individual foil elements. In some embodiments, a gap (e.g. 812) may exist between the substrate (e.g. 100) and the second foil (e.g. 782), and improved contact between the substrate or the laser doped region (e.g. 364) and the foil may be obtained if foil (782) approaches the substrate. The gap may exist near a general opening (914) in the multilayer foil assembly, where the general opening is an opening made by any of the methods described above and is for at least the purpose of allowing contact of the upper foil (782) to the substrate.

In one embodiment, a sequence of one or more laser pulses may be used to soften or melt the foil (e.g. 782) so that it makes contact to the substrate (e.g. 100). Such laser pulses may be in the range of equal to or between 1 µs to 10 ms. Such laser pulses may be focused to provide heating over relatively large areas, such as, but not limited to, areas equal to or greater than 2500 µm$^2$.

In another embodiment (FIG. 27), a predetermined force (830) may be used to cause the second foil (782) to approach and contact the substrate by locally deforming (837) the second foil. With sufficient bonding force or pressure (830) a contact region (832) can form between the laser doped region (364), second foil (782), and/or bonding layer (820).

In some embodiments, a conductive bonding layer (820), such as a conductive adhesive or solder, may be present on one or more of the foil elements such than when the bonding force or pressure (830) is applied conductive contact is made between the second foil (782) and the substrate. A doped region (364) may already exist on the substrate and may be partially or completely in contacted with the second foil (782) after application of pressure (830). The doped layer (364) could be formed by localized processing such as laser doping or ion implantation and laser annealing. In some embodiments, an additional activation step for the conductive bonding layer as previously described above may be applied during or near the timeframe of the application of force or pressure (830), such as a curing step to activate and bond the conductive adhesive or to melt solder. In the case of solder, a fluxing agent may be applied locally to form a low resistance adherent bond.

In some embodiments, the specified force (830) may be mechanical pressure, such as a roller, compliant plate, press or the like. In some embodiments, the specified force (830) may be a gas pressure. As a nonlimiting example, gas pressure can be accomplished by applying a membrane or a foil over the sample and producing a vacuum under the membrane or foil. This may allow pressures up to one atmosphere to act on the sample. In some embodiments, pressures greater than 1 atmosphere can be applied from above the sample alone or in conjunction with other methods discussed herein. In some embodiments, an array of gas jets may be used to apply pressure or additional pressure from above the sample. In some embodiments, total pressure on the sample by any method may be in the range equal to or between 0.25 to 20 atmospheres, or in the range equal to or between 0.5 to 10 atmospheres.

Figure 28:
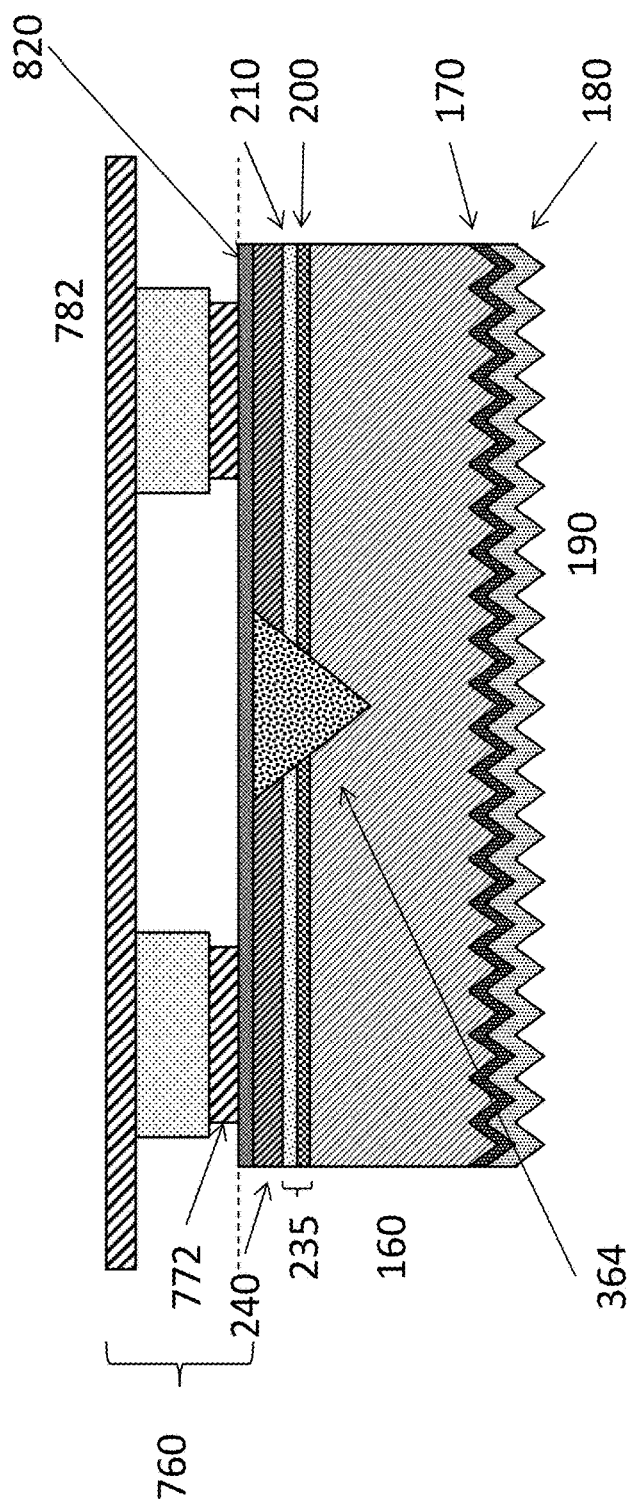
FIG. 28 is a cross-section view of another illustrative embodiment of a solar cell with a multilayer foil assembly prior to contact formation.
Figure 29:
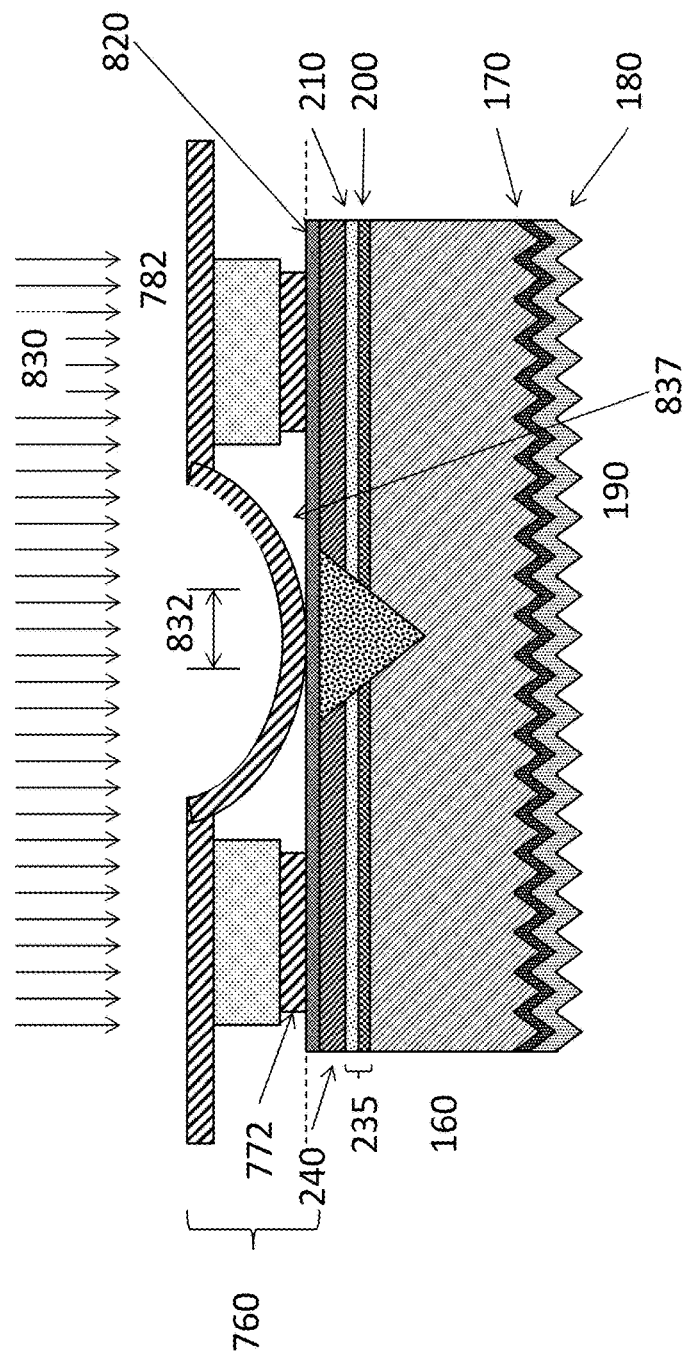
FIG. 29 is a cross-section view of another illustrative embodiment of a solar cell with a multilayer foil assembly during to contact formation.

Referring to FIGS. 28 and 29, in some embodiments, a conductive bonding layer (820) may exist on the substrate (or alternatively on second foil 782 or both) prior to application of the first metal foil. FIG. 28 shows that device structure prior to application of a bonding force, and FIG. 29 shows the device structure after application of a bonding force (830). In some embodiments, the same bonding agent may be used for conductive bonding of both the emitter and the base contact. As a result, in some embodiments, the conductive bonding layer may have a composition such that it exhibits high conductivity in a vertical direction through the film, but a low conductivity in lateral direction through the film. This property may enable good electrical connection from the second foil (782) to the substrate, but low conductivity from the doped region (364) to the regions on the first foil (772) that may produce a short or shunt in the solar cell. Conductive bonding layers (820) for this application may include anisotropic conductive films or anisotropic conductive adhesives.

Figure 30:
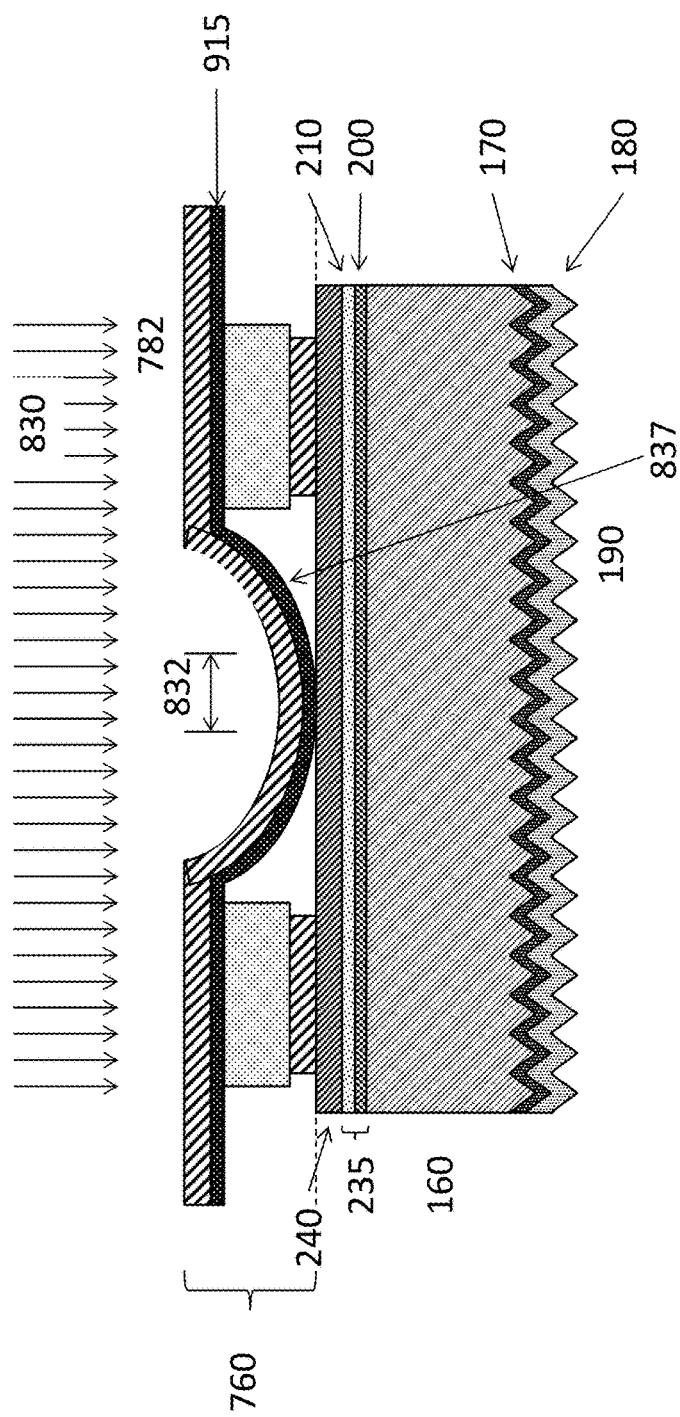
FIG. 30 is a cross-section view of another illustrative embodiment of a solar cell with a multilayer foil assembly prior to laser-fired contact formation.
Figure 31:
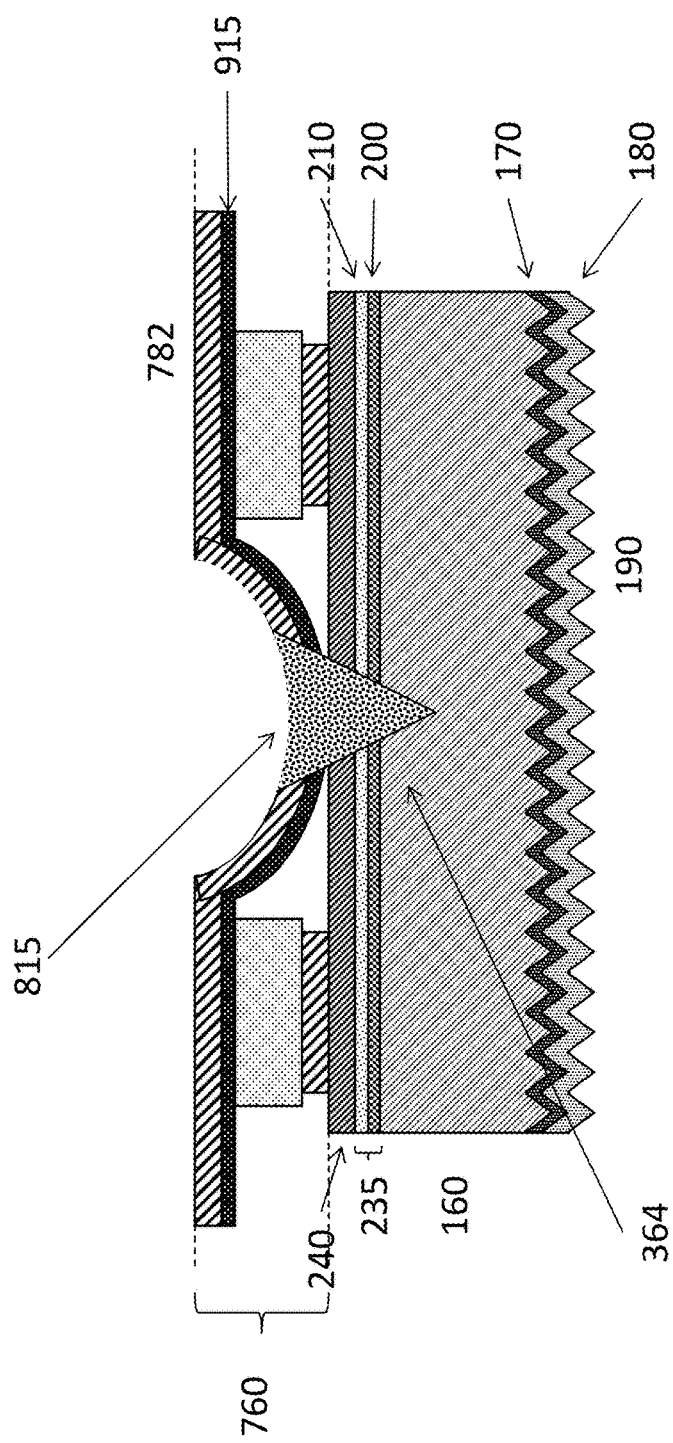
FIG. 31 is a cross-section view of another illustrative embodiment of a solar cell with a multilayer foil assembly after laser-fired contact formation.

In the embodiments of FIGS. 28 through 29, part of the laser doped base contact (364) may exist on the substrate prior to application of a part of the metal foil (772, 782) or metal foil assembly (760). Alternatively, in another embodiment shown in FIG. 30, a bonding force or pressure (830) may be applied prior to completion of laser doping of the base contact to cause an initial approach or contact between the second metal foil (782) to the substrate surface. Referring to FIG. 31, laser doping or firing (815) through the second foil (782) may be used to create contact and doping of the base (364). The dopant atom can come from the metal foil (782) or a general dopant material coated on the metal foil (915). From the above noted embodiments, it is understood that timing of laser doping is independent from the application bonding force or pressure and can occur either before, during, or after. The dopant material (915) may be uniformly coated on the metal foil or metal foil assembly. Alternatively, it may be coated in selective areas such as near the opening (914) (e.g. see FIG. 26) to improve performance or minimize dopant usage. In some embodiments, the foil (782) itself may be formed from a chemical composition that supplies a dopant. That dopant may be the main component of the foil. Alternatively, the dopant may be a minor component of the foil, but with enhanced doping action due to properties such as volatility or liquid phase diffusion in silicon.

Figure 27:
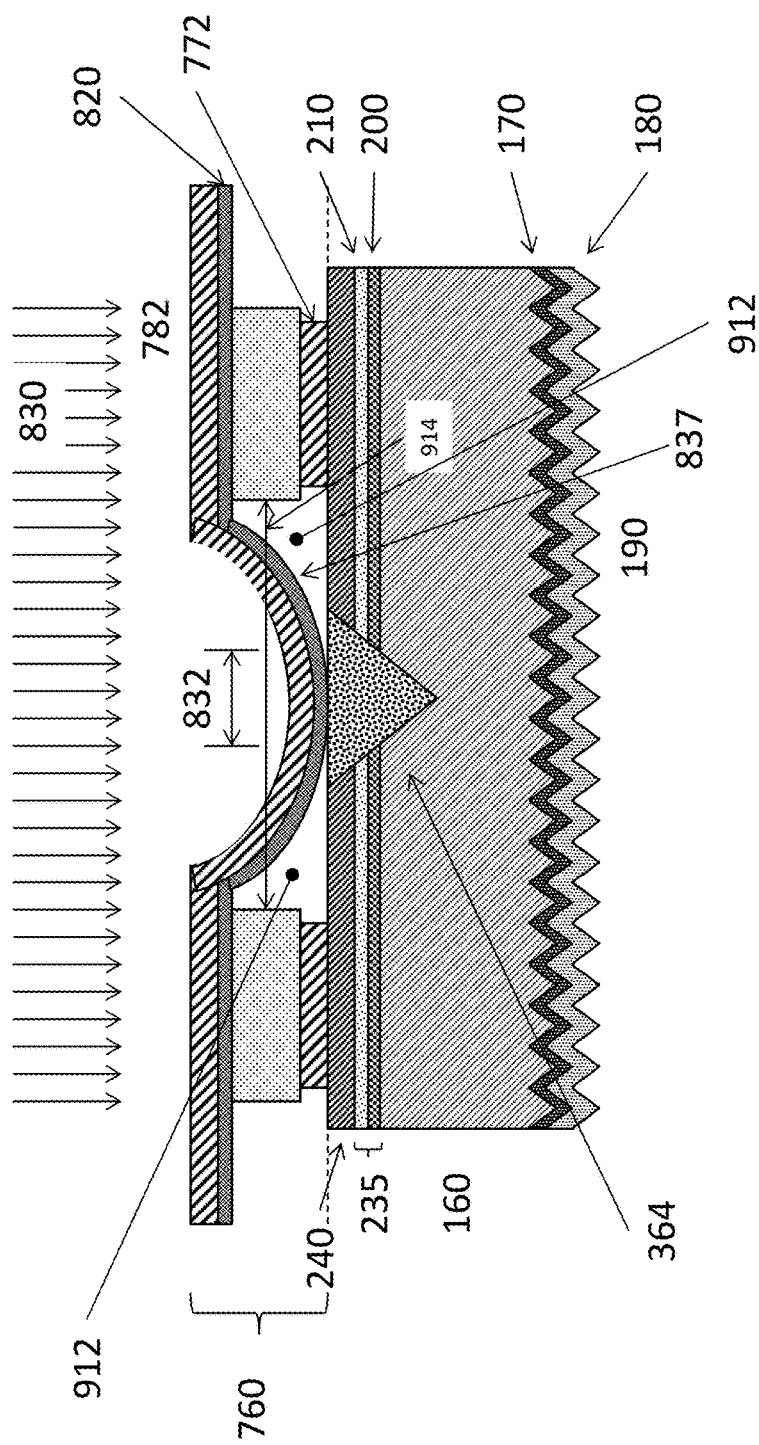
FIG. 27 is a cross-section view of an illustrative embodiment of a solar cell with a multilayer foil assembly during contact formation.

In some embodiments, the second foil (782) may be embossed or patterned in a way to provide elasticity to allow facile deformation (837), such as depicted in FIG. 27 as a nonlimiting example. Embossing may include, but is not limited to, ridges, protrusions, and other patterns that allow deformation as they flatten out. The foil may also include perforations, such as linear perforations or slits, that allow deformation as they open up. The foil may be patterned with so called Eggbox or Miura motifs to allow expandability. The period of the motif may be equal to or less than 1000 microns, or equal to or less than 200 microns. The formation of deformation (837) may occur once part or all of the metal foil assembly is in place on the substrate. In some embodiments, part or all of the deformation (837) may occur during fabrication of the multilayer foil assembly prior to bonding to the substrate, when the multilayer foil assembly is in roll or sheet form. It may also occur as a separate process step once the multilayer foil assembly is singulated, but prior to bonding to the substrate.

Metal foils or metal foil assemblies may be fabricated, shipped, and supplied in forms including, but not limited to, wide roll form, slit roll form, sheet form, or singulated. Equipment for the bonding process may include slitting and chopping equipment to take roll or sheet form and produce metal foil assemblies appropriate for a single solar cell. These operations may take place prior to or after bonding of the foil to the solar cell.

Non-limiting examples of methods for a metal foil to make connection with a doped region (364) on the substrate are discussed herein. For the discussion herein, FIGS. 26-31 can be referred to as nonlimiting examples. In some embodiments, the doped region may contain a different concentration and/or type of doping atoms than the surrounding substrate, or it may be modified in a way to promote a different concentration and/or type of charge carriers than the surrounding substrate. The doped region may allow effective electrical contact to be made between the second foil (782) and the substrate at that location.

The doped region (364) may be formed by the addition of a dopant atom to the silicon substrate. One method includes making a localized doped region by thermal diffusion of a dopant atom. In some embodiments, this may be accomplished by high temperature processing using a doping paste, optionally patterned at or near the doped region (364). In some embodiments, the doped region (364) may be formed by laser doping or ion implantation.

In yet another embodiment, the doped region may be formed by applying charge modifying layers to the silicon substrate. Nonlimiting examples of such charge modifying layers may be semiconductors or doped semiconductors including silicon, amorphous silicon, zinc oxide, and zinc chalcogenides. The charge modifying layers may also be materials with a fixed charge leading to accumulation layers, including aluminum oxide or silicon nitride. The charge modifying layers may also be metal-insulator-semiconductor structures (MIS structures), which may also exist as tunnel contacts or tunnel oxide contacts.

The doped region (364) may be formed at any suitable point in the process, including prior to the bonding of any metal foil or metal foil assemblies to the substrate, or after part or all of a metal foil assembly has been bonded to the substrate. In any of these cases, fiducial marks and alignment methods may be used in order for the resulting doped region (364) to be in sufficient alignment with an opening (914) in the metal foil assembly.

As non-limiting examples, FIGS. 26 and 28 show examples in which the doped region (364) may exist prior to application of the metal foil assembly. FIGS. 27 and 29 respectively show the process of the second metal foil (782) connecting to the pre-existing doped region (364). Alternatively, FIG. 30 shows an example in which a doped region does not exist prior to application of the metal foil assembly. FIG. 31 shows an example of a process, such as laser doping, to cause the formation of the doped region (364) along with connection of the second foil (782) to the doped region. It is also contemplated that when a doped region (364) exists prior to application of the metal foil, laser firing or laser doping as shown in FIG. 31 may still be used for purposes including enhancing the doped region (364) and providing improved conductive contact of foil (782) to the doped region.

Foil Dielectrics:

Referring to FIGS. 9, 12, and 16 as non-limiting examples, dielectric layers (778) may comprise any material with low or negligible conductivity. Such materials may be inorganic materials including $SiO_2$, $Al_2O_3$, $SiN_x$. The inorganic materials may be applied by liquid coating, sintering, vacuum coating, anodization, or the like.

In some embodiments, the materials may be polymer films. Polymer films may be applied by solvent coating or casting, or by adhesion of preformed polymer films or webs to other functional layers, such as metal foils.

Nonlimiting examples of polymers suitable for solvent casting include acrylics including polymethylmethacrylate (PMMA) and polyethylmethacrylate, polyvinylbutyrals, polyethylenevinylacetate (EVA), poly(vinylchloride) (PVC), poly(cyanoacrylate), and cellulosics including nitrocellulose and cellulose triacetate.

In some embodiments, the dielectric may be equal to or between 2 to 150 microns thick, or equal to or between 6 to 40 microns thick.

Nonlimiting examples of polymers suitable for being employed as preformed films that may serve as dielectric layers include polyesters including polyethylene terephthalate (PET) and polyethylene napthalate (PEN), polypropylene, polycarbonate, polyimide, polyvinylidene chloride, polyvinylidene fluoride, and polyvinyl chloride. The films may be treated to improve adhesion, including corona, flame, priming, solution or vapor chemical, and plasma surface pre-treatments.

The polymer films may be treated or manufactured to provide improved properties including strength and dimensional stability. Nonlimiting examples of treatments include uniaxial orientation, biaxial orientation, and anneals to improve dimensional stability and core set.

Uniaxial and biaxial orientation of the polymer films may be achieved during manufacture of the film prior to incorporation into a multilayer foil assembly. Other conventional methods of creating a multilayer structure, such as sequential deposition on a substrate of metal and dielectric layers, cannot provide the desired film orientation in the polymer film because significant film orientation cannot be achieved with alternate deposition methods such as vapor deposition, spray deposition, or solution casting. These other methods thus cannot provide the desirable properties such as strength associated with an oriented film.

In some embodiments, the degree of orientation of the polymer film can be represented by a planar orientation coefficient, $\Delta p$, in accordance with the equation:

$$\Delta p = \frac{n_1 + n_2}{2} - n_3$$

in which:
$n_1$ is the refractive index in the main direction of orientation in the plane of the film;
$n_2$ is the refractive index in a direction perpendicular to the main direction of orientation, in the plane of the film;
and $n_3$ is the refractive index in a direction perpendicular to the plane of the film.

The refractive indices may be measured by any suitable method, and may be measured at any wavelength, preferably at the yellow line of sodium ($\lambda$=590 nm). A value of $\Delta p$=0 would indicate no orientation of the polymer film. In some embodiments, the degree of orientation of the polymer film serving as the dielectric layer may be greater than 0.08, preferably greater than 0.1.

In some embodiments, foil dielectrics may be transparent. Alternatively, the foil dielectric may include a colorant to allow it to absorb laser radiation and thus increase the efficacy of laser based machining, modification, and ablation processes. Colorants may include dyes and pigments. In some embodiments, the dyes and pigments may have absorption at 1064 nm, 532 nm or 355 nm. In some embodiments, the colorant may be carbon black in micro- or nano-particle form.

Figure 35:
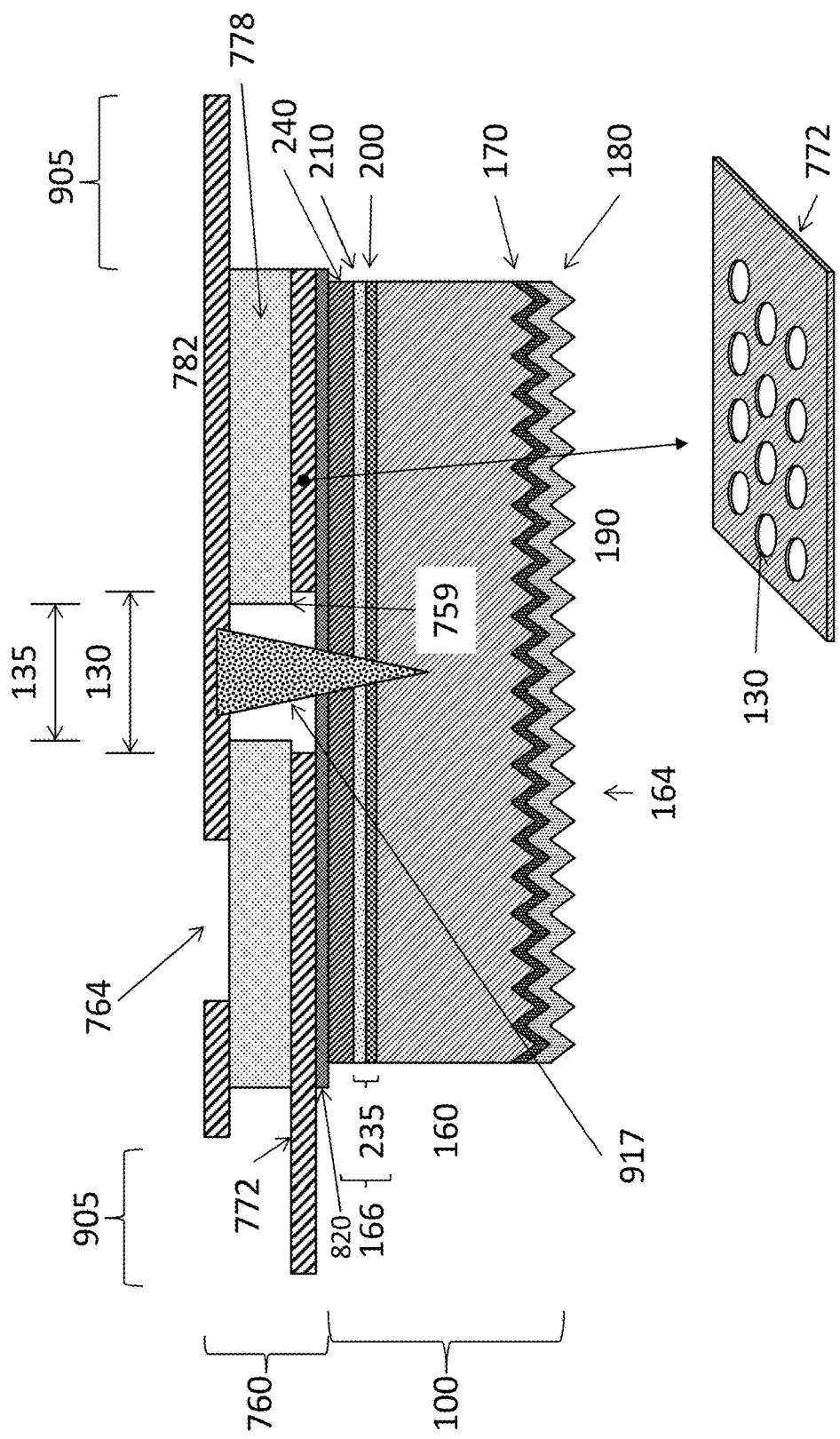
FIG. 35 is an illustrative embodiment of a solar cell structure with a multilayer foil assembly.

Foil Assembly Rear Contact Solar Cells:

As discussed herein, there numerous nonlimiting variations of foil assembly based rear contact solar cells. FIG. 35 shows a nonlimiting example of a solar cell structure for a foil assembly based rear contact solar cell. The solar cell structure includes a front surface (164) for receiving light and a rear surface (166). In some embodiments, the front surface (164) may provide a passivation layer (170) and anti-reflective layer (180). In some embodiments, the front surface (164) may be textured to increase anti-reflectivity.

The solar cell structure for a foil assembly based rear contact solar cell provides both contacts on the rear surface (166). While other rear contact solar cells may utilize non-foil based assemblies, embodiments discussed herein are directed to foil based assemblies. A first metal foil (772) is in electrical communication with regions of the rear surface (166). In some embodiments, this rear surface (166) may comprise one or more layers (235) that modify charge carrier concentration, such as a passivation layer (200) and doped layer (210). In some embodiments, the rear surface (166) may include a rear surface conductive structure (240). The second metal foil (782) is in electrically communication with base (160) via contacts (917) through layers on the rear surface (166), such as via laser fired contacts. Contact (917) of the second metal foil (782) to the substrate represents a general contact made by any method or order discussed above.

A second metal foil (782) is placed above and spaced apart from the first metal foil (772) by a dielectric layer (778), and the second metal foil is electrically insulated from the first metal foil to prevent shorting or shunting. In some embodiments, many regions may be present where the first metal foil (772) is between the second metal foil (782) and substrate in a direction normal to the surface of the substrate. In other regions, the first metal foil (772) may include openings (130) through the entirety of the first metal foil layer. In some embodiments, the second metal foil (782) is present at the opening (130) regions through first metal foil (772). In some embodiments, it may be desirable for the second foil (782) to contain openings (764) through the second foil layer below which the first metal foil is present. In some embodiments, the dielectric layer (778) may optionally have openings (135) that partially align with the openings (130) in the first metal foil. In some embodiments, the openings (135) may have approximately equal dimensions to openings (130), but in other embodiments, openings (135) may be smaller than openings (135) to create an overhang (759). The dielectric (778) may or may not be patterned in areas below the second foil openings (764). Contact (917)

from base (160) to the second metal foil (782) is made through an opening (130) to the substrate, such as by laser firing the contact. Depending on the manufacturing process selected, one or more conductive bonding layers or general boding layers (820, 835 in prior figures) may be present between various layers of the solar cell structure, and the bonding layers may optionally be conductive.

In some embodiments, the first metal foil (772) is contiguous over a portion of the solar cell with openings (130). In some embodiments, the fraction of area represented by the openings in the first metal foil (772) in a region may be equal or less than 40% of the total area covered by the foil, equal to or less than 25%, or equal to or less than 20%. The plane aspect ratio of an opening (130) can be defined as the ratio of the largest width of the opening to the length of the opening in a direction perpendicular to that of the largest width. For example, in reference to FIG. 1, the plane aspect ratio for opening (135) can be viewed as a ratio of the length and width of the shape of said opening, which may be a circle, oval, square, rectangle, or any other suitable shape. The plane aspect ratio of the openings (130) may be equal to or less than 10:1, or equal to or less than 5:1. The vertical aspect ratio of opening (130) may be defined as the ratio of the largest width of the opening in the plane of the foil to the vertical height of the foil or foil assembly. The vertical aspect ratio of the openings (130) may be equal to or greater than 2:1, or equal to or greater than 5:1.

In some embodiments, the first metal (772) and second metal (782) layers may have a thickness in the range equal to or between 2 to 100 microns, which may be difficult to achieve with vapor deposition techniques. In some embodiments, the thickness of the two metal layers may be equal to or between 6 to 70 microns. In some embodiments, the metal layers may be composed of aluminum, equal to or greater than 60% aluminum, or equal to or greater than 80% aluminum. In some embodiments, the foils may have different textures on each face of a foil. In the manufacturing process of foils, a bright finish may be produced when the foil comes in contact with a work roller surface. A matte finish may be produced when two sheets are rolled simultaneously, with the sides that are touching yielding a matte finish. Other mechanical finishing methods can be used to produce patterns.

Aluminum foils may contain defects typical of their fabrication including dislocations such as dislocation slip defects and dislocation glide defects. Vapor deposition of aluminum may have substantially fewer defects. Solution deposition of aluminum may show a local porosity consistent with sintering of metal particles.

A foil assembly rear contact solar cell may have tabs (905) in which one or more of the foils (e.g., 772,782) extend past the edge of the substrate (100) and can serve as a point of electrical connection for the solar cell. The tabs may be integral portions of foils (772, 782) without joints between them and the portion of the foils connected to the solar cell substrate. The tabs (905) may extend equal to or greater than 0.5 mm or equal to or greater than 1.0 mm from the edge of the substrate (100). In non-foil contacting approaches, including liquid, vapor, or vacuum deposition techniques, it is difficult to produce tabs (905). Typical contacting with these methods may include a joint of two or more separate entities.

A non-limiting example focusing on the base contact region in which the second foil (782) makes contact to the substrate is discussed herein, which may refer to FIG. 27 as an example. The second foil (782) may have a local deformation (837) of the foil to allow it to approach the substrate, which may be achieved utilizing any of the methods discussed above or a combination thereof. With sufficient bonding force or pressure (830) a contact region (832) can form between the doped region (364), second foil (782), and/or bonding layer (820). Because of surface roughness and other considerations, the second foil may not make continuous contact in the contact region (832). Contact may be considered as regions in which the second foil (782) is within 5 microns or less from the surface of the substrate. Considering the area of the contact region (832) in relation to the total area of opening (914), the contact area may be equal to or between 5% and 80% of the opening area, or between 10% and 50% of the opening area.

In some embodiments, there may be a void area (912) that is defined as an intermediate space created near contact (364) during processing that is unfilled by any solid or liquid material. In some embodiments, an area or volume near a metal foil contact (e.g. as shown in FIG. 27) may contain void areas (912) due to the fact that the original foil has stiffness and other mechanical properties that prevent it from conformally and substantially filling opening (914). In some embodiments, the void area may exist between the second metal foil and the substrate. Further, in some case, the void area may prevent second foil (782) from contact with other layers of the MFA (760), such as the dielectric layer, and more importantly, first foil (772). This prevents shunting contact between the second foil (782) and first foil (772). In non-foil contacting approaches, including liquid, vapor, or vacuum deposition techniques, it is difficult to such large voids desirable to prevent such shunting issues. The size of a void (912) may be characterized by its volume or by its projected area in cross section, such as from the view shown in FIG. 27. The cross section may be taken so that it intersects the center of opening (914). In some embodiments, the void projected area for a single base contact of the current foil based device may be equal to or between 50 $\mu m^2$ to 20,000 $\mu m^2$, or equal to or between 100 $\mu m^2$ to 15,000 $\mu m^2$. In a similar structure with metal applied by other deposition techniques not using foils, the void projected area may be equal to or less than 20 $\mu m^2$, or equal to or less than 10 $\mu m^2$. Any suitable technique may be used to measure the total volume of void between foils (772) and (782) for a single base contact. In some embodiments, the void volume for a solar cell utilizing the design(s) discussed herein may be equal to or between $3 \times 10^4$ $\mu m^3$ to $2 \times 10^7$ $\mu m^3$. In a similar structure with metal applied by other deposition techniques not using foils, the void volume associated with a single contact may be equal to or less than 5000 $\mu m^3$, or equal to or less than 2000 $\mu m^3$. The amount of void may also be expressed as a fraction equal to the total volume of void (912) divided by the total volume of the opening (914). In some embodiments, void volume fractions might be in the range of 3% to 40%. In contrast, a similar structure with metal applied by other deposition techniques not using foils may have a void fraction of <0.5%.

Foil assembly rear contact solar cells may have conductive bonding layers as described above between the first metal foil (772) and rear of the substrate (166). The conductive bonding layer may be equal to or greater than 1 micron in thickness. In non-foil contacting approaches, including liquid, vapor, or vacuum deposition techniques, a discrete conductive bonding layer may not be present and/or a conductive bonding layer may be thinner than 1 micron.

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

EXAMPLE

A solar cell employing a multilayer foil assembly was prepared according to the following procedure. A 150 µm thick silicon substrate with light n-type doping was chemically etched with 20% KOH at 80° C. for 12 minutes in order to remove saw damage. On the front side, a layer of 10 nm of intrinsic a-Si:H (i-a-Si:H) and a layer of 80 nm of $SiN_x$ were applied by plasma enhanced chemical vapor deposition (PECVD). On the rear side, a layer of 10 nm of i-a-Si:H and a layer of 30 nm of boron doped a-Si:H (B-a-Si:H) were applied by PECVD. The combination of the i-a-Si:H and B-a-Si:H forms a silicon heterojunction (SHJ) emitter. On the rear, an additional metal deposition comprising 50 nm of aluminum followed by 200 nm of silver was deposited by thermal evaporation.

A metal foil assembly comprising a first metal foil of 12 µm aluminum bonded to a 12 µm PET dielectric was laser patterned to produce an array of 0.5 mm holes through both the aluminum foil and dielectric on a 1 mm pitch. A bonding agent comprising poly(vinyl butyral) in methyl isobutyl ketone (MIBK) solvent was applied to the rear of the sample and allowed to dry. The metal foil assembly was placed in contact with the rear of the sample and bonding agent, and subjected to a vacuum lamination process involving heating the assembly to 180° C. for approximately 10 seconds. This process resulted in conductive bonding of the metal foil assembly to the substrate, and more particularly the first metal foil to the substrate. The sample was then sonicated in MIBK for 60 seconds to remove excess bonding agent, and subjected to a 3 minute PAN etch to remove silver/aluminum exposed in holes of the metal foil assembly, where the metal foil assembly was as an etch mask.

A supplemental insulator comprising the photoresist SU-8/2002 with approximately 1.8% carbon black (dry film basis) was applied and cured on the sample. The insulator was patterned by ablation using 1064 nm laser pulses with 100 ns duration. The ablated areas comprised approximately 200 µm square regions near the center of the holes in the metal foil assembly. A liquid phosphorus source (Filmtronics P509, diluted 1:14 in ethanol) was applied to the sample and allowed to dry. A second metal foil was then applied to the back of the sample, and pressed to contact with the substrate through the holes of the metal foil assembly using a mechanical press. The sample was then laser fired by applying 1064 nm laser pulses with 600 ns duration to the second metal foil in the region of the patterned supplemental insulator, simultaneously producing doped regions and electrical contact between the second metal layer and the substrate.

The resulting sample contains a first metal foil connected to the emitter formed by the i-a-Si:H/B-a-Si:H heterojunction structure, and a second metal foil, isolated from the first, connected to the n-type base. The sample is constructed such that the first metal foil extends past the edge of the sample on one side (Tab-1), while the second metal foil extends past the edge of the sample on the opposite side (Tab-2) to aid ease of connecting solar cells in series (e.g. FIG. 34). The sample was tested for IV characteristics between Tab-1 and Tab-2 during illumination of 1 sun, and yielded an open circuit voltage of 0.609V, a short circuit current of 37.4 $mA/cm^2$, and a fill factor of 0.54.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for forming all back contacts for a solar cell, the method comprising:
   selecting a substrate, wherein a back surface of the substrate contains a passivation layer;
   forming a multilayer foil assembly (MFA), wherein the MFA comprises
   a metal layer, and
   a dielectric layer in contact with the metal layer, wherein the dielectric layer is patterned with dielectric layer openings, and a formed MFA is freestanding;
   creating first doping regions on the substrate;
   coupling the formed MFA to the back surface of the substrate; and
   laser firing after coupling of the MFA and substrate to create second doping regions aligned with the dielectric layer openings.

2. The method of claim 1, wherein the metal layer is a first metal layer that is positioned below the dielectric layer, patterned with first metal layer openings, and placed in contact with the first doping regions, and the first metal layer openings are aligned with the dielectric layer openings of the dielectric layer, and the solar cell further comprises a second metal layer, wherein the dielectric layer is sandwiched in between the first metal layer and the second metal layer.

3. The method of claim 2, wherein the MFA further comprises the second metal layer.

4. The method of claim 2, wherein the dielectric layer openings have a smaller diameter than the first metal layer openings.

5. The method of claim 2, wherein the second metal layer is patterned with openings aligned with the first doping regions.

6. The method of claim 5, wherein the dielectric layer is patterned with openings aligned with the first doping regions.

7. The method of claim 6, wherein the step of creating the first doping regions comprises laser firing the first metal layer of the MFA at the first doping regions before the second metal layer is added to the MFA, wherein first laser fired contacts are formed between the first metal layer and the first doping regions.

8. The method of claim 2, wherein the laser firing occurs through the second metal layer, the dielectric layer openings, and the first metal layer openings, thereby causing the second metal layer to be in electrical contact with the second doping regions.

9. The method of claim 2 further comprising the step of: applying a supplemental insulating layer before the second metal layer is added to the MFA.

10. The method of claim 2 further comprising the step of: etching the substrate to remove a portion or all of a rear conductive structure between the first metal layer and the substrate, wherein when the first metal layer is bonded to the substrate prior to the dielectric layer, the first metal layer acts as mask for the etching step, or
    when the first metal layer and the dielectric layer are bonded to the substrate simultaneous, the dielectric layer and the first metal layer act as a mask for the etching step.

11. The method of claim 2, wherein the second metal layer is coated with a dopant to aid formation of the second doping regions.

12. The method of claim 11, wherein the dopant is an n-type dopant for silicon.

13. The method of claim 11, wherein the dopant is present on the second metal layer in the region of the first metal layer openings and the dielectric layer openings.

14. The method of claim 2 further comprising the step of: locally deforming the second metal layer in areas corresponding to the dielectric area openings to cause the second metal layer to contact the second doped regions, wherein the deforming is performed with laser pulses or by applying pressure or force.

15. The method of claim 2, wherein the MFA is formed by coupling the first metal layer to the dielectric layer during roll-to-roll processing.

16. The method of claim 1 further comprising the step of: perforating the metal layer to form first metal layer openings, wherein the metal layer is a first metal layer and the first metal layer openings are aligned with the dielectric layer openings of the dielectric layer.

17. The method of claim 1, wherein the rear surface of the substrate comprises doping layers or junction inducing layers for a heterojunction or a tunnel junction.

18. The method of claim 1, wherein the MFA further comprises one or more bonding layers to aid adhesion of the MFA to the substrate or to aid adhesion of individual layers of the MFA to each other.

19. The method of claim 1, wherein the metal layer of the MFA is a second metal layer; and
    the method further comprises the step of: coupling a first metal layer to the back surface of the substrate prior to the step of coupling of the MFA to the back surface, wherein the first metal layer is patterned with first metal layer openings, and the first metal layer openings are aligned with the dielectric layer openings of the dielectric layer when the formed MFA is coupled to the substrate.

* * * * *